(12) United States Patent
Hosek et al.

(10) Patent No.: US 9,548,231 B2
(45) Date of Patent: Jan. 17, 2017

(54) ROBOT AND ADAPTIVE PLACEMENT SYSTEM AND METHOD

(71) Applicant: Persimmon Technologies, Corp., Wakefield, MA (US)

(72) Inventors: Martin Hosek, Lowell, MA (US); Christopher Hofmeister, Hampstead, NH (US); Dennis Poole, East Derry, NH (US)

(73) Assignee: Persimmon Technologies, Corp., Wakefield, MA (US)

( * ) Notice: Subject to any disclaimer, the term of this patent is extended or adjusted under 35 U.S.C. 154(b) by 0 days.

(21) Appl. No.: 14/295,419

(22) Filed: Jun. 4, 2014

(65) Prior Publication Data

US 2014/0365004 A1 Dec. 11, 2014

Related U.S. Application Data

(60) Provisional application No. 61/831,320, filed on Jun. 5, 2013, provisional application No. 61/868,131, filed on Aug. 21, 2013, provisional application No. 61/945,306, filed on Feb. 27, 2014.

(51) Int. Cl.
| | | |
|---|---|---|
| *G05B 19/418* | (2006.01) | |
| *H01L 21/68* | (2006.01) | |
| *B25J 9/16* | (2006.01) | |
| *H01L 21/677* | (2006.01) | |

(52) U.S. Cl.
CPC ............ *H01L 21/681* (2013.01); *B25J 9/1682* (2013.01); *H01L 21/67742* (2013.01); *G05B 2219/39109* (2013.01); *G05B 2219/45031* (2013.01)

(58) Field of Classification Search
CPC .................... B25J 9/1682; G05B 2219/39109; G05B 2219/45031
USPC .......................................................... 700/248
See application file for complete search history.

(56) References Cited

U.S. PATENT DOCUMENTS

| | | | |
|---|---|---|---|
| 4,819,167 A | 4/1989 | Cheng et al. | 364/167.01 |
| 5,151,008 A | 9/1992 | Ishida et al. | 414/744.5 |
| 5,483,138 A | 1/1996 | Shmookler et al. | 318/568.16 |
| 5,497,007 A | 3/1996 | Uritsky et al. | 250/491.1 |

(Continued)

OTHER PUBLICATIONS

"Concept for Fiducial Mark for Substrate Centering and Angular Orientation plus ID Mark", Brooks, Mar. 21, 2013, 4 pgs.

(Continued)

*Primary Examiner* — Ian Jen
(74) *Attorney, Agent, or Firm* — Harrington & Smith

(57) ABSTRACT

An apparatus including a drive; a movable arm assembly; a plurality of sets of end effectors; and a controller. The end effectors are connected to the drive by the movable arm assembly. A first one of the sets of end effectors includes at least two of the end effectors, where the drive and the movable arm assembly are configured to move the at least two end effectors substantially in unison from a retracted position towards an extended position towards two different respective target locations. The at least two end effectors are at least partially independently movable relative to each other on the moveable arm assembly. The controller is configured to detect an offset of respective substrates on the at least two end effectors and adjust movement of the at least two end effectors relative to each other prior to placement of the substrates at the respective target locations.

19 Claims, 30 Drawing Sheets

(56) References Cited

U.S. PATENT DOCUMENTS

| | | | |
|---|---|---|---|
| 5,535,306 A | 7/1996 | Stevens | 395/89 |
| 5,563,798 A | 10/1996 | Berken et al. | 364/478.06 |
| 5,696,835 A | 12/1997 | Hennessey et al. | 382/141 |
| 5,740,062 A | 4/1998 | Berken et al. | 364/478.06 |
| 5,855,681 A | 1/1999 | Maydan et al. | 118/719 |
| 5,894,760 A * | 4/1999 | Caveney | B25J 18/04 |
| | | | 310/114 |
| 5,905,850 A | 5/1999 | Kaveh | 198/394 |
| 5,980,194 A | 11/1999 | Freerks et al. | 414/754 |
| 6,158,941 A * | 12/2000 | Muka | B25J 9/107 |
| | | | 294/87.1 |
| 6,198,976 B1 | 3/2001 | Sundar et al. | 700/59 |
| 6,267,549 B1 * | 7/2001 | Brown | H01L 21/67742 |
| | | | 414/744.5 |
| 6,297,611 B1 | 10/2001 | Todorov et al. | 318/568.21 |
| 6,315,512 B1 | 11/2001 | Tabrizi et al. | 414/217 |
| 6,323,616 B1 | 11/2001 | Sagues | 318/568.11 |
| 6,366,830 B2 | 4/2002 | Bacchi | 414/217 |
| 6,379,095 B1 | 4/2002 | Elliott et al. | 414/279 |
| 6,405,101 B1 | 6/2002 | Johanson et al. | 700/218 |
| 6,430,468 B1 | 8/2002 | Tepman et al. | 700/218 |
| 6,502,054 B1 | 12/2002 | Mooring et al. | 702/150 |
| 6,556,887 B2 | 4/2003 | Freeman et al. | 700/218 |
| 6,571,657 B1 | 6/2003 | Olgado | 257/E21.175 |
| 6,582,175 B2 | 6/2003 | Cox et al. | 414/229 |
| 6,629,053 B1 * | 9/2003 | Mooring | G05B 19/401 |
| | | | 702/149 |
| 6,666,337 B1 | 12/2003 | Conboy et al. | 209/546 |
| 6,760,976 B1 | 7/2004 | Martinson et al. | 33/520 |
| 6,793,766 B2 | 9/2004 | Schieve | 118/719 |
| 6,934,606 B1 | 8/2005 | Genetti et al. | 700/254 |
| 7,192,791 B2 | 3/2007 | Hofmeister | 438/14 |
| 7,563,068 B2 | 7/2009 | Niewmierzycki et al. | 414/806 |
| 7,568,586 B2 | 8/2009 | Walters, Jr. | 215/305 |
| 7,813,832 B2 | 10/2010 | Sundar | 700/218 |
| 7,845,897 B2 * | 12/2010 | Agou | H01L 21/67742 |
| | | | 414/217 |
| 7,891,935 B2 * | 2/2011 | Kremerman | B25J 9/042 |
| | | | 414/744.5 |
| 7,894,657 B2 | 2/2011 | van der Meulen et al. | 382/141 |
| 7,925,378 B2 | 4/2011 | Gilchrist et al. | 700/218 |
| 7,933,009 B2 | 4/2011 | Serebryanov et al. | 356/213 |
| 7,946,800 B2 * | 5/2011 | Hosek | B25J 9/042 |
| | | | 414/744.5 |
| 8,060,252 B2 * | 11/2011 | Gage | H01L 21/67196 |
| | | | 118/715 |
| 8,322,963 B2 | 12/2012 | Hudgens et al. | 414/226.01 |
| 2003/0108415 A1 * | 6/2003 | Hosek | B25J 9/1664 |
| | | | 414/783 |
| 2004/0167743 A1 | 8/2004 | Hosek | 702/155 |
| 2004/0240971 A1 | 12/2004 | Tezuka | 414/217 |
| 2005/0137751 A1 * | 6/2005 | Cox | B25J 9/1692 |
| | | | 700/245 |
| 2005/0185183 A1 | 8/2005 | Ban | 356/401 |
| 2006/0099063 A1 * | 5/2006 | Pietrantonio | B25J 9/042 |
| | | | 414/744.5 |
| 2009/0087288 A1 | 4/2009 | Hofmeister | 414/222.02 |
| 2009/0142163 A1 | 6/2009 | Genetti et al. | 414/217 |
| 2010/0048035 A1 | 2/2010 | Azumano | 438/795 |
| 2010/0178147 A1 * | 7/2010 | Kremerman | B25J 9/042 |
| | | | 414/744.5 |
| 2011/0173496 A1 | 7/2011 | Hosek et al. | 714/26 |
| 2011/0318143 A1 * | 12/2011 | Isomura | H01L 21/67184 |
| | | | 414/217.1 |
| 2012/0014773 A1 | 1/2012 | Gage et al. | 414/751.1 |
| 2012/0045308 A1 | 2/2012 | Kremerman | 414/744.3 |
| 2012/0094759 A1 * | 4/2012 | Barney | G06F 3/0487 |
| | | | 463/31 |
| 2012/0141235 A1 * | 6/2012 | Krupyshev | B25J 9/042 |
| | | | 414/217.1 |
| 2012/0232690 A1 * | 9/2012 | Gilchrist | B25J 9/042 |
| | | | 700/228 |
| 2012/0325148 A1 | 12/2012 | Yamagishi | 118/723 R |
| 2013/0039726 A1 * | 2/2013 | Brodine | H01L 21/67742 |
| | | | 414/226.05 |
| 2013/0041505 A1 * | 2/2013 | Cox | H01L 21/67742 |
| | | | 700/254 |
| 2013/0041509 A1 * | 2/2013 | Saito | B25J 9/06 |
| | | | 700/261 |
| 2013/0069450 A1 | 3/2013 | Hosek et al. | 310/12.04 |
| 2013/0071218 A1 | 3/2013 | Hosek et al. | 414/44.5 |
| 2013/0149076 A1 * | 6/2013 | Cox | B65G 49/00 |
| | | | 414/217 |
| 2013/0183131 A1 | 7/2013 | Blank et al. | 414/744.5 |
| 2013/0209212 A1 | 8/2013 | Furuya | 414/788.1 |
| 2013/0272823 A1 * | 10/2013 | Hudgens | H01L 21/67742 |
| | | | 414/217 |
| 2013/0287529 A1 * | 10/2013 | Yang | H01L 21/67739 |
| | | | 414/222.09 |
| 2013/0288400 A1 | 10/2013 | Graff et al. | 438/14 |
| 2014/0010625 A1 * | 1/2014 | Hudgens | B25J 18/00 |
| | | | 414/749.1 |
| 2014/0174354 A1 | 6/2014 | Arai | 118/719 |
| 2014/0365004 A1 * | 12/2014 | Hosek | H01L 21/681 |
| | | | 700/248 |

OTHER PUBLICATIONS

"450mm Notch-free Silicon Wafers", Pinyen Lin, International 450mm Wafer Task Force Meeting, Apr. 1, 2013, 12 pgs.

"Robot Having Arm With Unequal Link Lengths", Hosek, Martin, et al., U.S. Appl. No. 13/833,732, filed Mar. 15, 2013, 97 pgs.

* cited by examiner

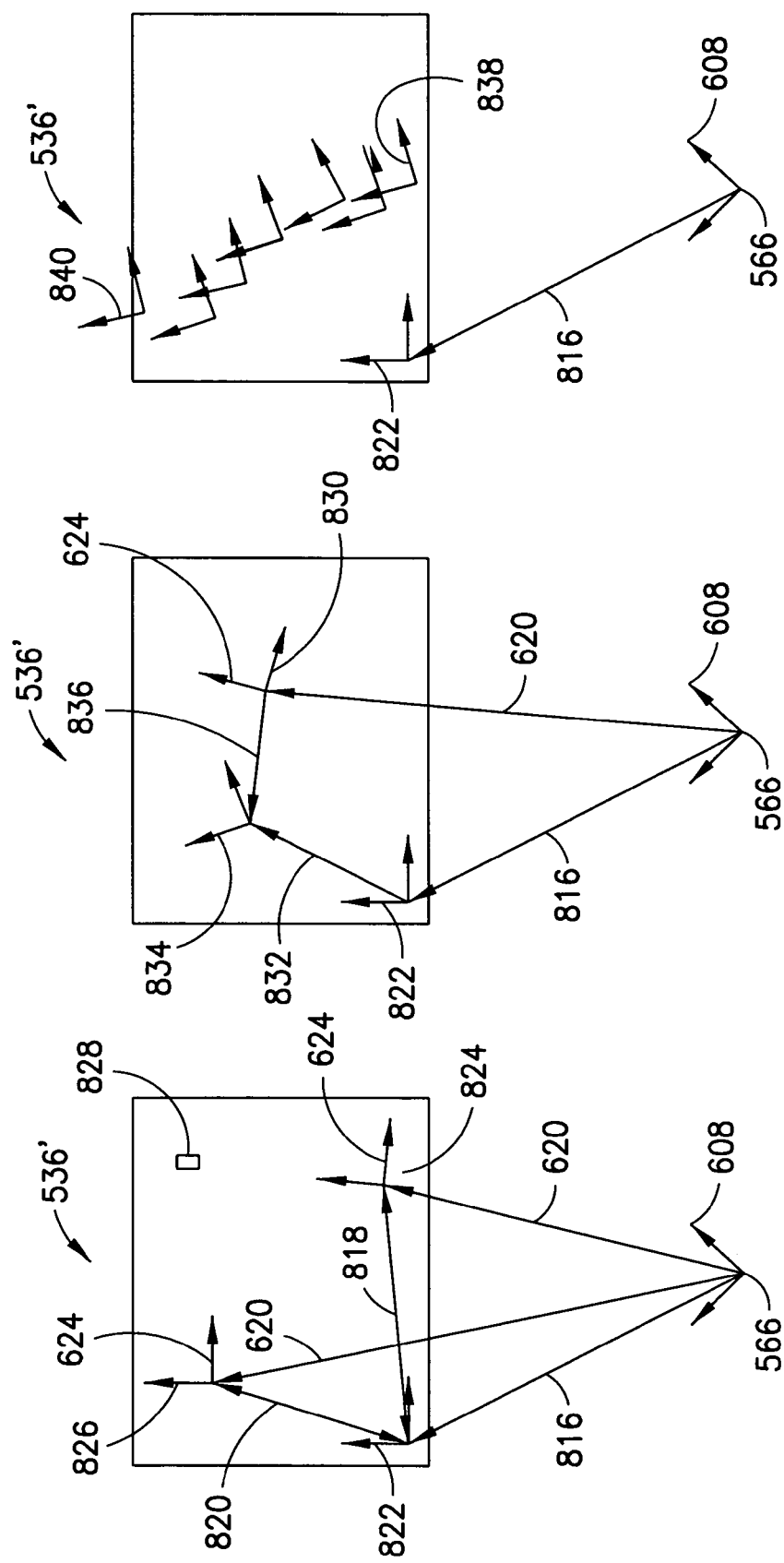

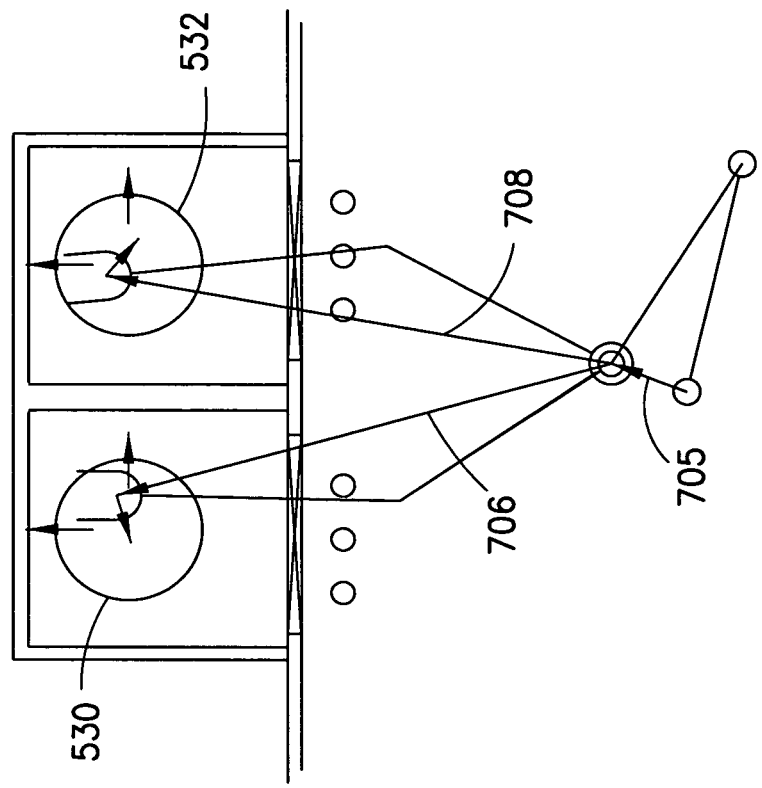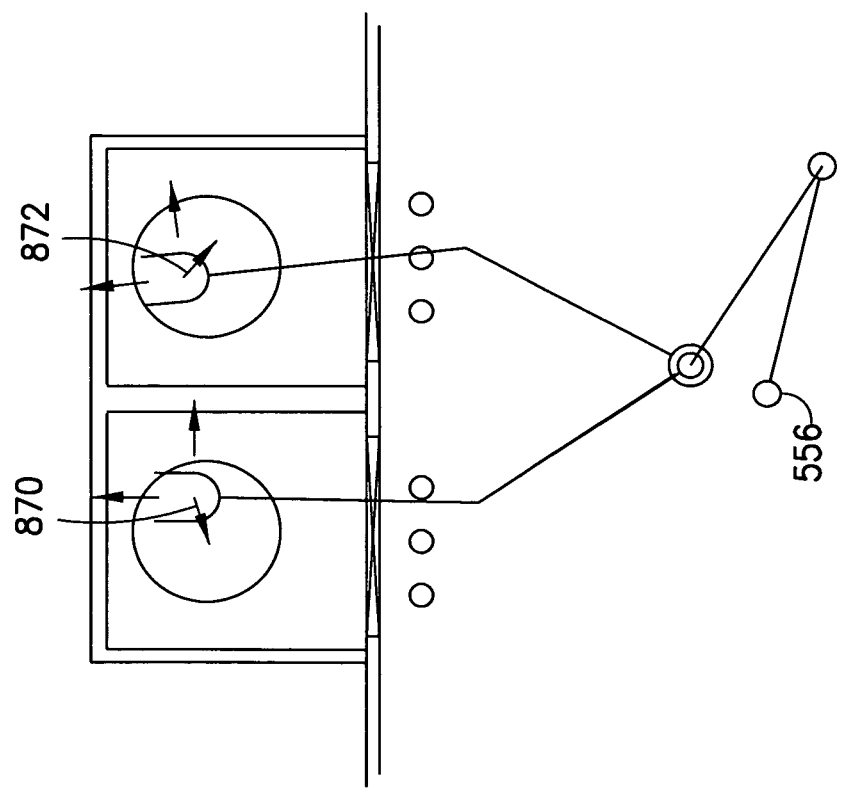

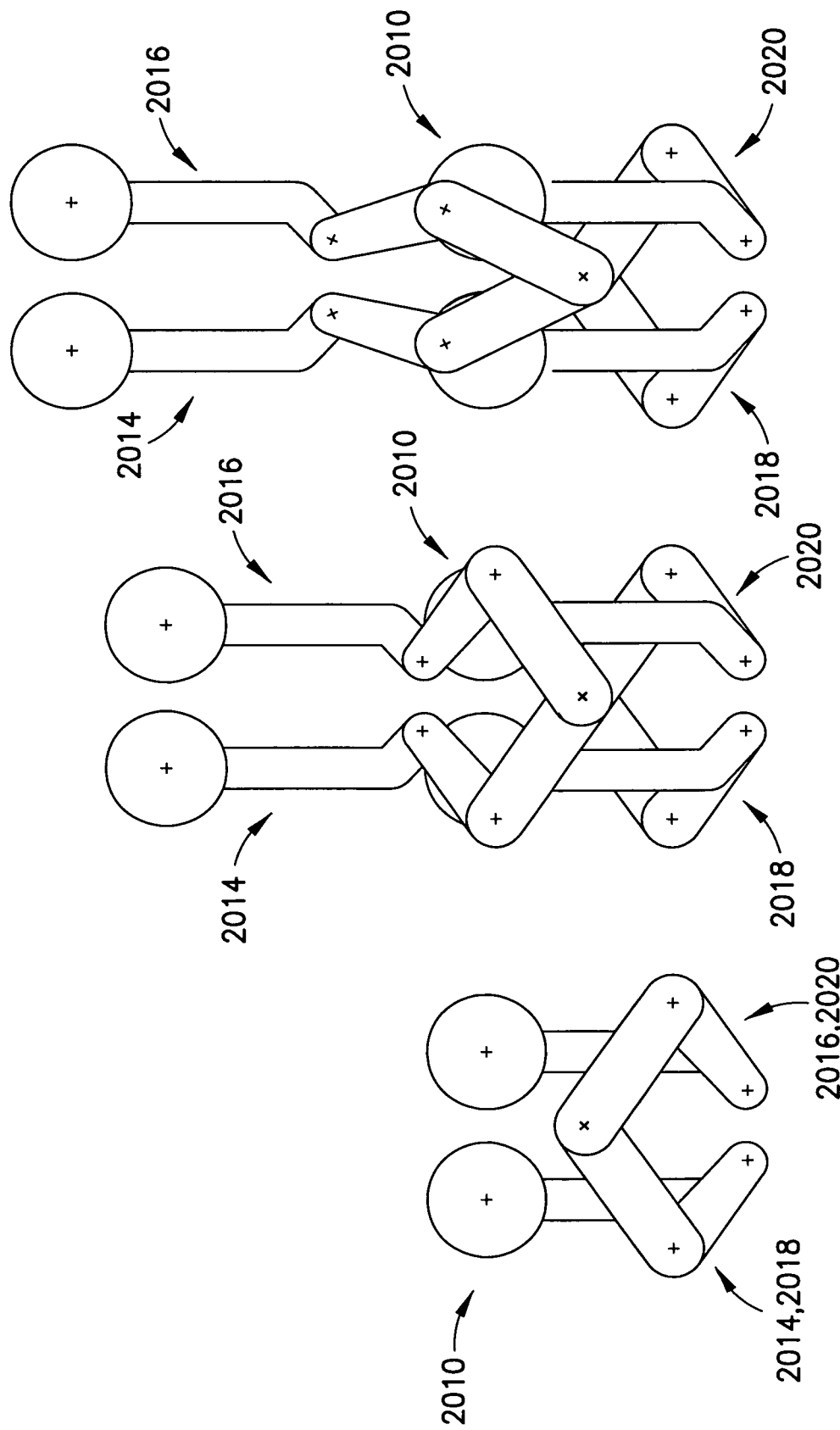

US 9,548,231 B2

ROBOT AND ADAPTIVE PLACEMENT SYSTEM AND METHOD

CROSS REFERENCE TO RELATED APPLICATIONS

This application claims priority under 35 USC 119(e) on Provisional Patent Application No. 61/830,320 filed Jun. 5, 2013 and Provisional Patent Application No. 61/868,131 filed Aug. 21, 2013 and Provisional Patent Application No. 61/945,306 filed Feb. 27, 2014, which are hereby incorporated by reference in their entireties.

BACKGROUND

Technical Field

The exemplary and non-limiting embodiments relate generally to a robot and an adaptive placement system and method and more particularly to a substrate transport robot and an adaptive substrate placement system and method.

Brief Description of Prior Developments

Substrate processing systems for semiconductor, LED or other suitable applications often require very accurate transfer and placement of substrates within the system to facilitate low process variability. Variables which affect the placement precision may include vibration, movement of the substrates on the transport system or within process modules of the processing system, thermal effects or otherwise. To overcome such variability, systems have added sensors and algorithms that attempt to detect and correct for such variables which affect the placement precision. In practice, the amount of error and variability is very sensitive to factors such as calibration accuracy, sensor variability or otherwise. Accordingly, there is a desire for a substrate transport robot and substrate placement system that is repeatable, precise and insensitive.

SUMMARY

The following summary is merely intended to be exemplary. The summary is not intended to limit the scope of the claims.

In accordance with an example embodiment, an apparatus is provided comprising a drive; a movable arm assembly connected to the drive; a plurality of sets of end effectors, where the end effectors are connected to the drive by the movable arm assembly, where a first one of the sets of end effectors comprises at least two of the end effectors, where the drive and the movable arm assembly are configured to move the at least two end effectors substantially in unison from a retracted position towards an extended position towards two different respective target locations, and where the at least two end effectors are at least partially independently movable relative to each other on the moveable arm assembly; and a controller connected to the drive, where the controller is configured to detect an offset of respective substrates on the at least two end effectors and adjust movement of the at least two end effectors relative to each other prior to placement of the substrates at the respective target locations.

An example method may comprise providing a robot comprising a drive, a movable arm assembly connected to the drive, and a plurality of sets of end effectors, where the end effectors are connected to the drive by the movable arm assembly, where a first one of the sets of end effectors comprises at least two of the end effectors, where the drive and the movable arm assembly are configured to move the at least two end effectors substantially in unison from a retracted position towards an extended position towards two different respective target locations, and where the at least two end effectors are independently movable relative to each other on the moveable arm assembly; and at least partially independently moving the end effectors in the first set relative to each other by the robot, where a controller connected to the drive detects an offset of respective substrates on the at least two end effectors and adjusts movement of the at least two end effectors relative to each other prior to placement of the substrates at the respective target locations.

Another example embodiment may be provided in a non-transitory program storage device readable by a machine, tangibly embodying a program of instructions executable by the machine for performing operations, the operations comprising: determining positions of a first set of at least two end effectors of a robot, where the robot comprises a drive, a movable arm assembly connected to the drive, and a plurality of sets of the end effectors, where the end effectors are connected to the drive by the movable arm assembly, where a first one of the sets of end effectors comprises at least two of the end effectors, where the drive and the movable arm assembly are configured to move the at least two end effectors substantially in unison from a retracted position towards an extended position towards two different respective target locations, and where the at least two end effectors are independently movable relative to each other on the moveable arm assembly; and at least partially independently moving the end effectors in the first set relative to each other by the robot, where an offset of respective substrates on the at least two end effectors is detected and movement of the at least two end effectors relative to each other is adjusted prior to placement of the substrates at the respective target locations.

BRIEF DESCRIPTION OF THE DRAWINGS

The foregoing aspects and other features are explained in the following description, taken in connection with the accompanying drawings, wherein:

FIG. 10A is a diagram illustrating an image sensor in an example apparatus;

FIG. 10B is a diagram illustrating an image sensor in an example apparatus;

FIG. 10C is a diagram illustrating an image sensor in an example apparatus;

FIG. 11A is a diagram illustrating an example apparatus;

FIG. 11B is a diagram illustrating an example apparatus;

FIG. 36A shows a top view of a robot in a retracted position;

FIG. 36B shows a top view of a robot with first and second arms extending;

FIG. 36C shows a top view of a robot with first and second arms extended;

DETAILED DESCRIPTION OF THE EMBODIMENTS

Figure 1:
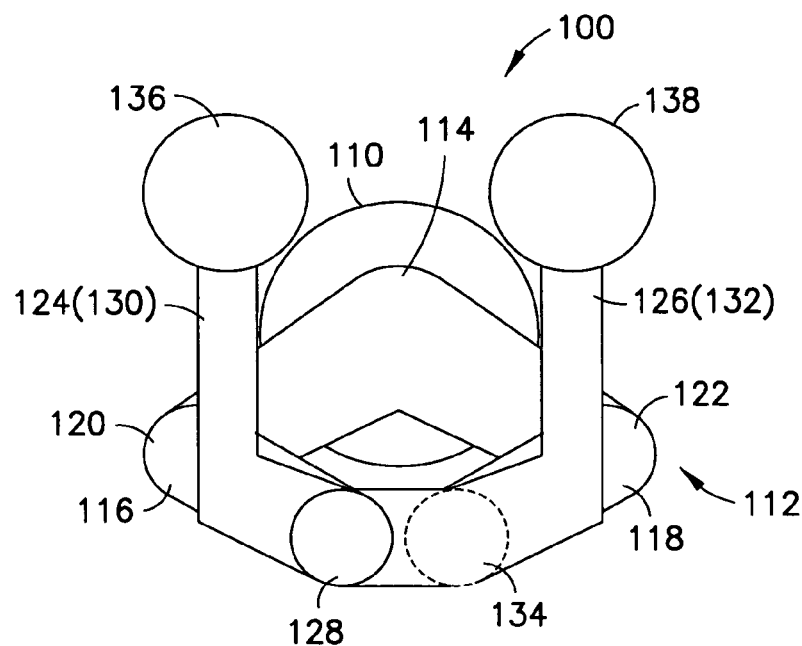
FIG. 1 is a top view of an example substrate transport robot.

Referring to FIG. 1, there is shown a schematic top plan view of an example substrate transport robot 100. Although the present embodiment will be described with reference to the embodiments shown in the drawings, it should be understood that the present invention may be embodied in many forms of alternative embodiments. In addition, any suitable size, shape or type of materials or elements could be used.

Figure 2:
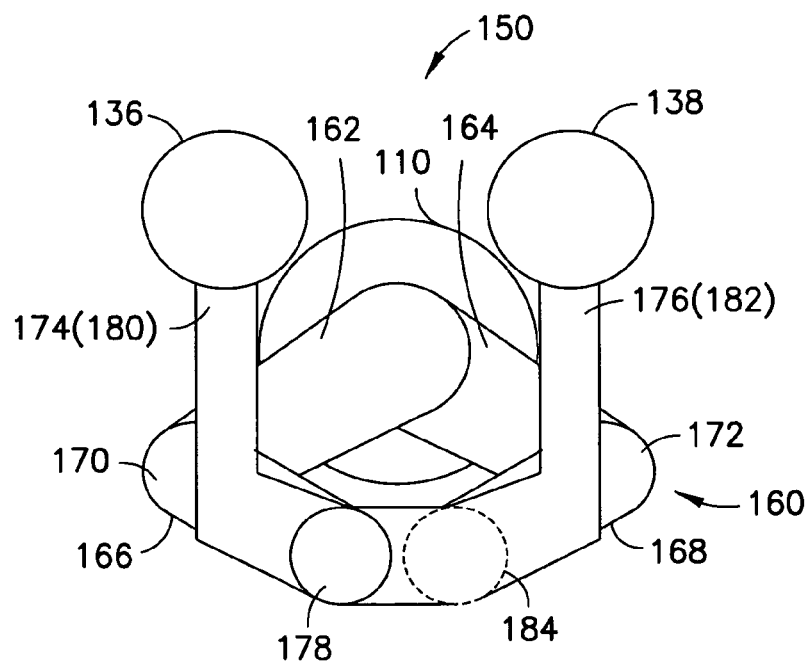
FIG. 2 is a top view of an example substrate transport robot.

Robot 100 may be a vacuum compatible or any suitable robot having drive portion 110 and arm portion 112 coupled to drive portion 110 as will be described in greater detail below. Arm 112 is shown having a common upper arm 114 and two independently operable forearms 116, 118 coupled by elbow joints 120, 122 respectively to upper arm 114. Forearm 116 has independently operable end effector set 124, 126 coupled to forearm 116 at wrist 128. Similarly, forearm 118 has independently operable end effector set 130, 132 coupled to forearm 118 at wrist 134. In the embodiment shown, substrates 136, 138 may simultaneously be transported to and from stations within a piece of equipment where picking or placement of substrates 136, 138 may be done independently and simultaneously where each may be positioned at a location independent of the other. The plurality (one or more) of sets of end effectors have the end effectors connected to the drive by the movable arm assembly. Here, a first one of the sets of end effectors has at least two of the end effectors, where the drive and the movable arm assembly are configured to move the at least two end effectors substantially in unison from a retracted position towards an extended position towards two different respective target locations. The at least two end effectors are at least partially independently movable relative to each other on the moveable arm assembly. Referring also to FIG. 2, there is shown a schematic top plan view of an example substrate transport robot 150. Robot 150 may be a vacuum compatible or any suitable robot having drive portion 110 and arm portion 160 coupled to drive portion 110 as will be described in greater detail below. Arm 160 is shown having two independently driven upper arms 162, 164 and two independently operable forearms 166, 168 coupled by elbow joints 170, 172 respectively to upper arms 162, 164. Forearm 166 has independently operable end effectors 174, 176 coupled to forearm 166 at wrist 178. Similarly, forearm 168 has independently operable end effectors 180, 182 coupled to forearm 168 at wrist 184. In the embodiment shown, substrates 136, 138 may simultaneously be transported to and from stations within a piece of equipment where picking or placement of substrates 136, 138 may be done independently and simultaneously where each may be positioned at a location independent of the other. In the embodiment shown, the upper arm link lengths and forearm link lengths may be different and driven by circular or non circular pulleys. An example of arms having unequal link lengths and driven by non circular pulleys is given in U.S. patent application Ser. No. 13/833,732 entitled "Robot having Arm with Unequal Link Lengths" filed Mar. 15, 2013 which is incorporated by reference herein in its entirety. In alternate aspects, arms with the same link lengths or arms with unequal link lengths and having circular pulleys may be provided. FIGS. 1 and 2 each show two arms having two end effectors. In alternate aspects, a single arm having a single or multiple end effectors may be provided.

Figure 3:
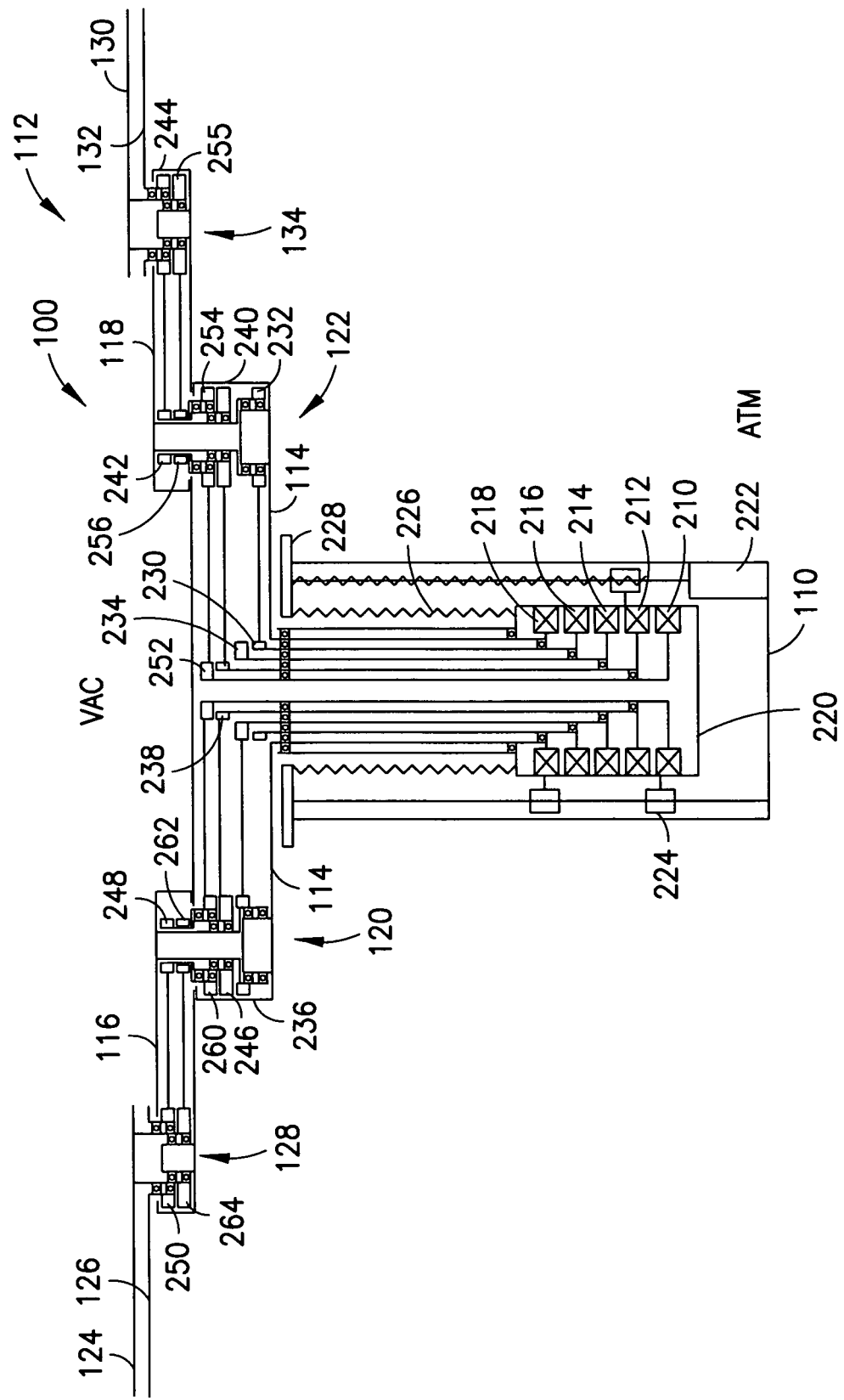
FIG. 3 is a section schematic view of an example substrate transport robot.

Referring to FIG. 3, there is shown a schematic cross section of robot 100. Drive 110 is shown having 5 coaxial shafts coupled to coaxial motor encoder arrangements 210, 212, 214, 216, 218 designated as inner shafts to the outer. Each motor arrangement may be located within vacuum tight housing 110. Alternately, only the rotors of motors of drives 210, 212, 214, 216, 218 may be in vacuum in the drive housing 220 where a sleeve may be provided between the rotors and stators. A vertical drive 222, such as a lead screw or other suitable drive may lift and lower housing 220 where slides 224 may constrain housing 220 in a vertical direction and bellows 226 may be coupled to housing 220 and flange 228 to maintain a vacuum environment where arm 112 and the inner portion of housing 220 may be exposed to vacuum. The shaft of drive 218 is directly coupled to the common upper arm 114. The shaft of drive 216 is directly coupled to pulley 230 which is in turn coupled by bands to pulley 232 in elbow 122 where pulley 232 is directly coupled to forearm 118. Here rotation of motor 216 rotates forearm 118 about the elbow 122. The shaft of drive 214 is directly coupled to pulley 234 which is in turn coupled by bands to pulley 236 in elbow 120 where pulley 236 is directly coupled to forearm 116. Here rotation of motor 214 rotates forearm 116 about the elbow 120. The shaft of drive 212 is directly coupled to pulley 238 which is in turn coupled by bands to pulley 240 in elbow 122 where pulley 240 is directly coupled to pulley 242 in elbow 122. Pulley 242 is then coupled by bands to pulley 244 in wrist 134 where pulley 244 is directly coupled to lower end effector 132. Here, rotation of motor 212 rotates lower end effector 132 about the wrist 134. Similarly, pulley 238 is also coupled by bands to pulley 246 in elbow 120 where pulley 246 is directly coupled to pulley 248 in elbow 120. Pulley 248 is then coupled by bands to pulley 250 in wrist 128 where pulley 250 is directly coupled to lower end effector 126. Here, rotation of motor 212 rotates lower end effector 126 about the wrist 128. Further, rotation of motor 212 simultaneously rotates both lower end effectors 126, 132 about their respective wrists 128, 134. The shaft of drive 210 is directly coupled to pulley 252 which is in turn coupled by bands to pulley 254 in elbow 122 where pulley 254 is directly coupled to pulley 256 in elbow 122. Pulley 256 is then coupled by bands to pulley 258 in wrist 134 where pulley 258 is directly coupled to upper end effector 130. Here, rotation of motor 210 rotates upper end effector 130 about the wrist 134. Similarly, pulley 252 is also coupled by bands to pulley 260 in elbow 120 where pulley 260 is directly coupled to pulley 262 in elbow 120. Pulley 262 is then coupled by bands to pulley 264 in wrist 128 where pulley 250 is directly coupled to upper end effector 124. Here, rotation of motor 210 rotates upper end effector 124 about the wrist 128. Further, rotation of motor 210 simultaneously rotates both upper end effectors 124, 130 about their respective wrists 128, 134. The shafts associated with drives 210, 212, 214, 216, 218 are each independently and coaxially rotatable and may be supported by any suitable bearing or other arrangement with respect to housing 220 as shown or otherwise. The three pulleys in each of elbows 120, 122 and the two pulleys in each of wrists 128, 134 are each independently and coaxially rotatable with respect to a common axis in each joint and may be supported by any suitable bearing or other arrangement as shown or otherwise. The following description of respective pulley ratios is based on the premise that the link lengths of each link are the same. In alternate aspects, different ratios or driving arrangement may be provided, for example, where the link lengths are different. An example of arms having unequal link lengths and driven by non circular pulleys is given in U.S. patent application Ser. No. 13/833,732 entitled "Robot having Arm with Unequal Link Lengths" filed Mar. 15, 2013 which is incorporated by reference herein in its entirety. In the embodiment shown, pulleys and bands are provided. In alternate embodiments, any suitable power transmission arrangement may be provided, for example, belts, links, gears, cable or any suitable arrangement. In the embodiment shown, 5 coaxial direct driving shafts are provided. In alternate embodiments, any suitable driving arrangement may be provided, for example, motors in joints, links, speed reducers, belts, magnetic couplings, linear and/or rotational drives or any suitable drive may be provided. In the embodiment shown, the ratio between pulleys 230, 232 and 234, 236 may be any suitable ratio, for example, 1:1 or higher or lower than 1:1. In the embodiment shown, the ratio between pulleys 238, 240 and 238, 246 may be any suitable ratio, for example, 1:3 or higher or lower than 1:3. In the embodiment shown, the ratio between pulleys 252, 254 and 252, 250 may be any suitable ratio, for example, 1:3 or higher or lower than 1:3. In the embodiment shown, the ratio between pulleys 242, 244 and 248, 250 may be any suitable ratio, for example, 1:2. In the embodiment shown, the ratio between pulleys 256, 258 and 262, 264 may be any suitable ratio, for example, 1:2. In operation, simultaneous rotation of all of drives 210, 212, 214, 216, 218 rotates the entire arm assembly. Simultaneous rotation of common link 114, pulleys 234, 238 and 252 with counter rotation of pulley 230 cause end effectors 130, 132 to extend or retract while end effectors 124, 126 rotate with common upper arm 114. Similarly, simultaneous rotation of common link 114, pulleys 230, 238 and 252 with counter rotation of pulley 234 cause end effectors 124, 126 to extend or retract while end effectors 130, 132 rotate with common upper arm 114. Further, relative rotation of pulley 238 will cause a corresponding relative rotation of end effectors 132, 126. Similarly, relative rotation of pulley 252 will cause a corresponding relative rotation of end effectors 130, 124. With the 5 rotary axis drive and arm arrangement described, 2 substrates may be independently placed at different locations as will be described in greater detail below. For example, 2 substrates supported on end effectors 130, 132 may be independently placed at two locations. Similarly, 2 substrates supported on end effectors 124, 126 may be independently placed at two locations. In alternate aspects, more or less arms and axis' may be provided.

Figure 4:
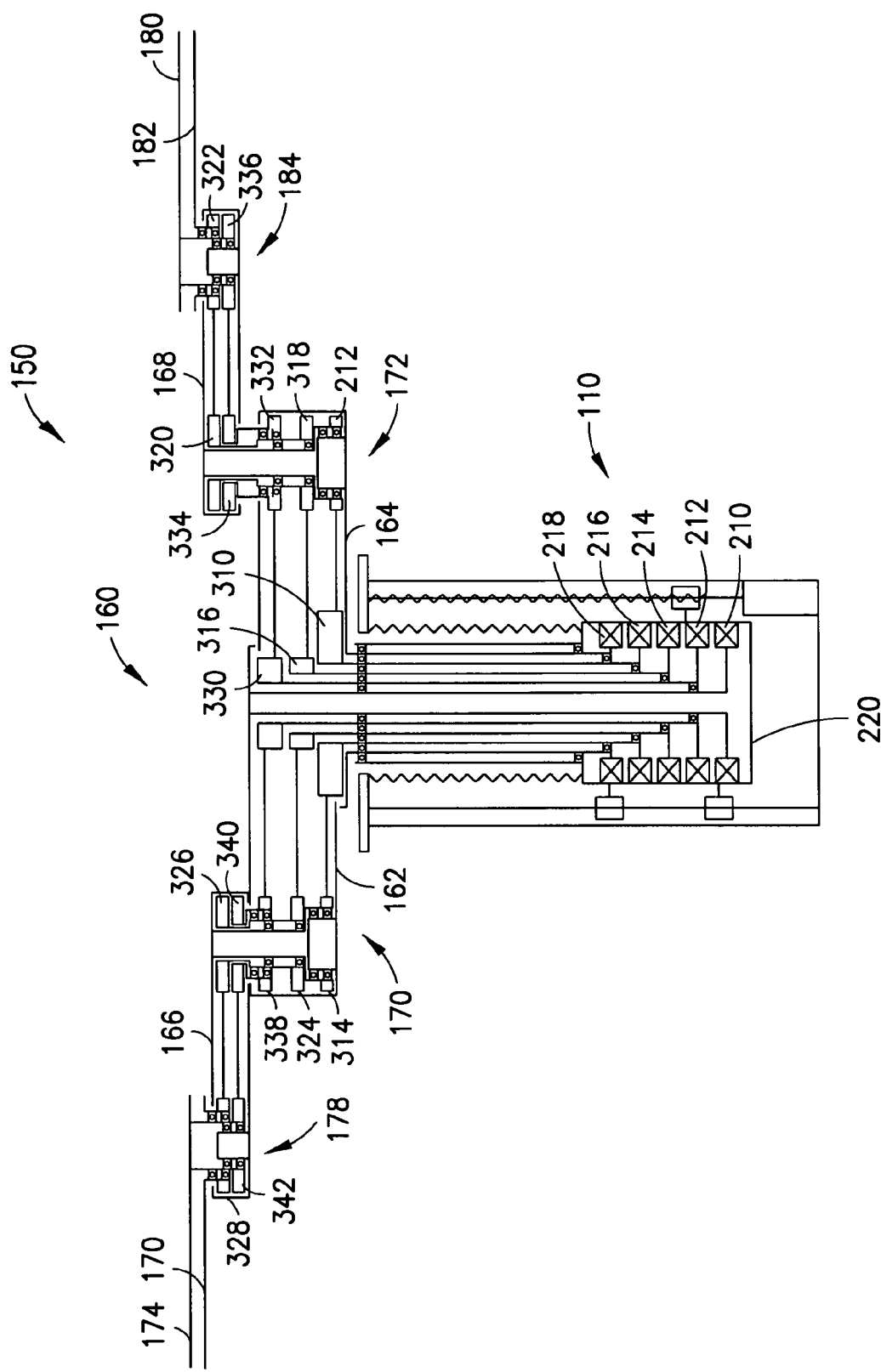
FIG. 4 is a section schematic view of an example substrate transport robot.

Referring to FIG. 4, there is shown a schematic cross section of robot 150. Drive 110 is shown having 5 coaxial shafts coupled to coaxial motor encoder arrangements 210, 212, 214, 216, 218 designated as inner shafts to the outer and as described above. The shaft of drive 218 is directly coupled to upper arm 164. The shaft of drive 210 is directly coupled to upper arm 162. Here, arms 162, 164 are independently rotatable. The shaft of drive 216 is directly coupled to pulley 310 which is in turn coupled by bands to pulley 312 in elbow 172 where pulley 312 is directly coupled to forearm 168. Here rotation of motor 216 rotates forearm 168 about the elbow 172. Pulley 310 which is then coupled by bands to pulley 314 in elbow 170 where pulley 314 is directly coupled to forearm 166. Here rotation of motor 216 rotates forearm 166 about the elbow 170. Further, rotation of motor 216 simultaneously rotates both forearms 168, 166 about their respective elbows 172, 170. The shaft of drive 214 is directly coupled to pulley 316 which is in turn coupled by bands to pulley 318 in elbow 172 where pulley 318 is directly coupled to pulley 320 in elbow 172. Pulley 320 is then coupled by bands to pulley 322 in wrist 184 where pulley 322 is directly coupled to lower end effector 182. Here, rotation of motor 214 rotates lower end effector 182 about the wrist 184. Similarly, pulley 310 is also coupled by bands to pulley 324 in elbow 170 where pulley 324 is directly coupled to pulley 326 in elbow 170. Pulley 326 is then coupled by bands to pulley 328 in wrist 178 where pulley 328 is directly coupled to lower end effector 176. Here, rotation of motor 214 rotates lower end effector 176 about the wrist 178. Further, rotation of motor 214 simultaneously rotates both lower end effectors 176, 182 about their respective wrists 178, 184. The shaft of drive 212 is directly coupled to pulley 330 which is in turn coupled by bands to pulley 332 in elbow 172 where pulley 332 is directly coupled to pulley 334 in elbow 172. Pulley 334 is then coupled by bands to pulley 336 in wrist 184 where pulley 336 is directly coupled to upper end effector 180. Here, rotation of motor 212 rotates upper end effector 180 about the wrist 184. Similarly, pulley 330 is also coupled by bands to pulley 338 in elbow 170 where pulley 338 is directly coupled to pulley 340 in elbow 170. Pulley 340 is then coupled by bands to pulley 342 in wrist 178 where pulley 242 is directly coupled to upper end effector 174. Here, rotation of motor 212 rotates upper end effector 174 about the wrist 178. Further, rotation of motor 212 simultaneously rotates both upper end effectors 174, 180 about their respective wrists 178, 184. The shafts associated with drives 210, 212, 214, 216, 218 are each independently and coaxially rotatable and may be supported by any suitable bearing or other arrangement with respect to housing 220 as shown or otherwise. The three pulleys in each of elbows 170, 172 and the two pulleys in each of wrists 178, 184 are each independently and coaxially rotatable with respect to a common axis in each joint and may be supported by any suitable bearing or other arrangement as shown or otherwise. The following description of respective pulley ratios is based on the premise that the link lengths of each link are the same. In alternate aspects, different ratios or driving arrangement may be provided, for example, where the link lengths are different. An example of arms having unequal link lengths and driven by non circular pulleys is given in U.S. patent application Ser. No. 13/833,732 entitled "Robot having Arm with Unequal Link Lengths" filed Mar. 15, 2013 which is incorporated by reference herein in its entirety. In the embodiment shown, pulleys and bands are provided. In alternate embodiments, any suitable power transmission arrangement may be provided, for example, belts, links, gears, cable or any suitable arrangement. In the embodiment shown, 5 coaxial direct driving shafts are provided. In alternate embodiments, any suitable driving arrangement may be provided, for example, motors in joints, links, speed reducers, belts, magnetic couplings, linear and/or rotational drives or any suitable drive may be provided. In the embodiment shown, the ratio between pulleys 310, 312 and 310, 314 may be any suitable ratio, for example, 2:1. In the embodiment shown, the ratio between pulleys 238, 240 and 238, 246 may be any suitable ratio, for example, 1:3 or higher or lower than 1:3. In the embodiment shown, the ratio between pulleys 316, 318 and 316, 324 may be any suitable ratio, for example, 1:1. In the embodiment shown, the ratio between pulleys 320, 322 and 326, 328 may be any suitable ratio, for example, 1:1. In the embodiment shown, the ratio between pulleys 334, 336 and 340, 342 may be any suitable ratio, for example, 1:1. In operation, simultaneous rotation of all of drives 210, 212, 214, 216, 218 rotates the entire arm assembly. Rotation of upper arm 164 while holding pulleys 310, 316, 330 and upper arm 162 stationary cause end effectors 180, 182 to extend or retract while end effectors 174, 176 remain stationary. Similarly, rotation of upper arm 162 while holding pulleys 310, 316, 330 and upper arm 164 stationary cause end effectors 174, 176 to extend or retract while end effectors 180, 182 remain stationary. Further, relative rotation of pulley 316 will cause a corresponding relative rotation of end effectors 182, 176. Similarly, relative rotation of pulley 330 will cause a corresponding relative rotation of end effectors 180, 174. With the 5 rotary axis drive and arm arrangement described, 2 substrates may be independently placed at different locations as will be described in greater detail below. For example, 2 substrates supported on end effectors 180, 182 may be independently placed at two locations. Similarly, 2 substrates supported on end effectors 174, 176 may be independently placed at two locations. In alternate aspects, more or less arms and axis' may be provided.

Figure 5:
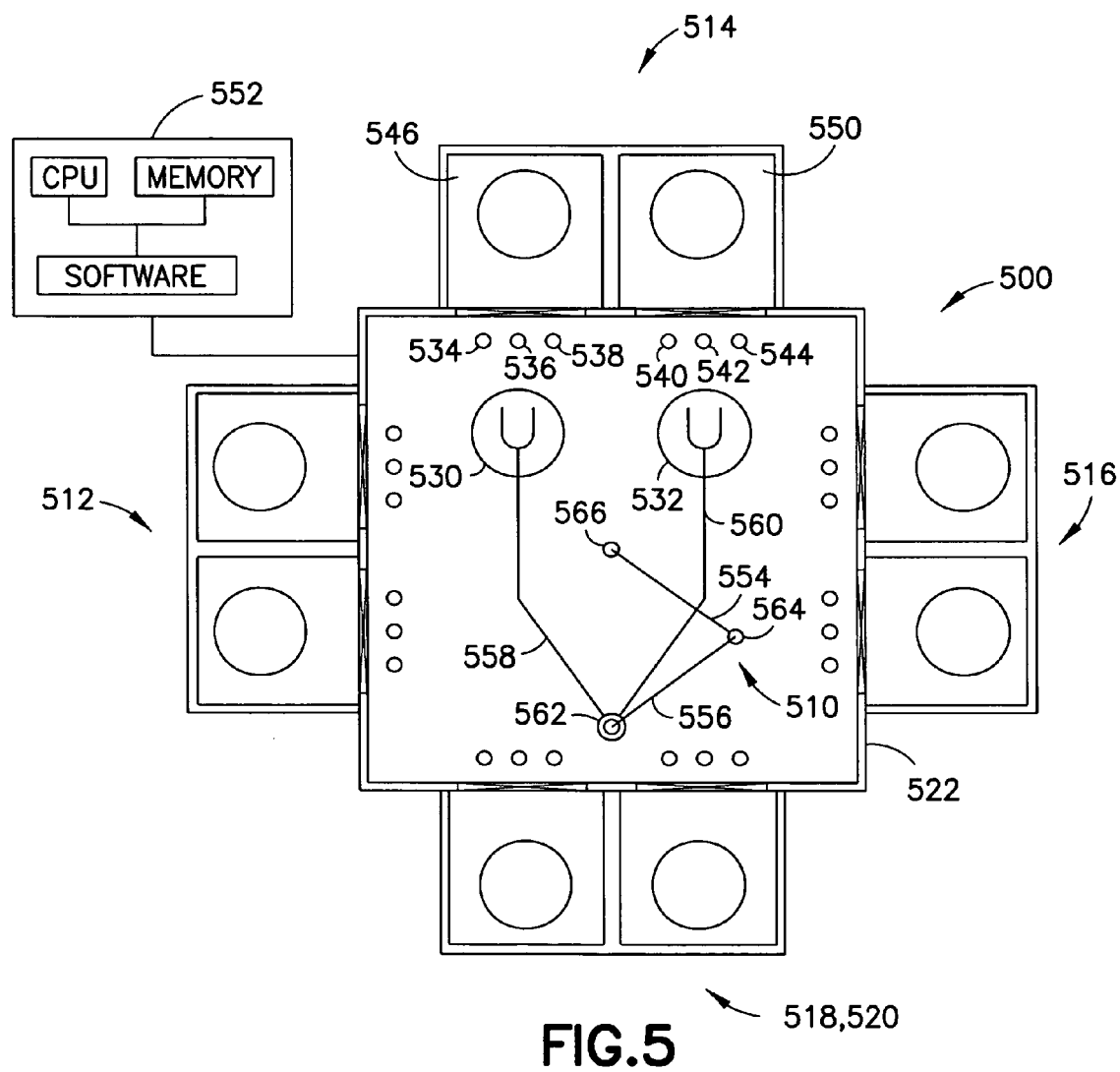
FIG. 5 is a diagram illustrating an example apparatus.

Referring to FIG. 5, there is shown a schematic top plan view of an example substrate processing apparatus 500 having a substrate transport apparatus or robot system 510. Although the present embodiment will be described with reference to the embodiments shown in the drawings, it should be understood that the present invention may be embodied in many forms of alternative embodiments. In addition, any suitable size, shape or type of materials or elements could be used. System 500 is shown in a "quad" configuration where pairs of substrates are transported and processed. In alternate aspects, system 500 may be a conventional single substrate transport and processing system. Substrate transport apparatus 510 may have features as disclosed with respect to robots 100 and 150 disclosed above. In alternate aspects, system 500 may utilize any suitable robot. For example, were system 500 to be a single substrate transport and processing system, robot 500 may have features as disclosed with respect to robots 100 and 150 but with an arm that transports a single wafer as opposed to two as disclosed with respect to robots 100 and 150. Here, by way of example, a robot drive having three coaxial drives may be used with respect to a single arm arrangement and a robot drive having four coaxial drives may be used with respect to a dual arm arrangement. In alternate aspects, any suitable robot capable of carrying out the disclosed methods may be used. In addition to the substrate transport apparatus 510 in this example embodiment, the substrate processing apparatus 500 may include multiple dual substrate processing chambers 512, 514, 516 and stacked dual substrate load locks 518, 520 connected to a vacuum chamber 122. The transport apparatus 510 is located, at least partially, in the chamber 522 and is adapted to transport one or more planar substrate 530, 532 such as semiconductor wafers or flat panel displays or other suitable substrates, between and/or among the chambers 512, 514, 516 and elevators or locks 518, 520. In alternate embodiments, the transport apparatus 510 could be used in any suitable type of substrate processing apparatus. Sensors 534, 536, 538, 540, 542, 544 are shown connected to chamber 522 and are provided to detect an edge crossing of substrates 130, 132 while being transported by robot 510 into corresponding process areas 546, 550 of module 514 where sensors 534, 536, 538 may correspond to process area 546 and sensors 540, 542, 544 may correspond to process area 550. Similarly, modules 512, 516 518, 520 may have such sensor arrangements. In an alternate aspect, more or less sensors may be provided. In an alternate aspect, cameras may be provided at a suitable location for example, locations 536, 542 to detect a fiducial, such as a laser inscribed mark or otherwise of wafers 530, 532 instead of an edge as will be described in greater detail below. Here, the sensors may be optical through beam, reflective, inductive, capacitive or any suitable sensor or detector. Although three sensors are shown, more or less sensors may be provided. Although the sensors are shown in line and equidistant, any suitable sensor locations may be provided. Robot 510 may further be controlled by controller 552. Here, controller 552 may be connected to a robot drive of robot 510 to controllably position upper arm 554, forearm 556, left or first end effector 558 and right or second end effector 560. Here (and as with an arm of robots 100, 150), first and second end effectors 558, 560 may be independently positionable and independently rotatable about wrist joint 562. Further, forearm 556 is connected to upper arm 554 at elbow 564 and independently positionable and rotatable. Controller 552 is shown connected to the drive, where the controller is configured to detect an offset of respective substrates on the at least two end effectors and adjust movement of the at least two end effectors relative to each other prior to placement of the substrates at the respective target locations. Arm 510 is rotatable about its origin or main drive axis 566. Thus, in the embodiment shown, a four axis device (five if a vertical or Z axis is included) is shown. In alternate embodiments, any suitable arm, combination of arms or mechanism capable of carrying out the disclosed methods may be provided. Controller 552 may be connected to the transport apparatus 510 and the sensors and may control robot 510 and/or various devices. The controller 552 may comprise at least one processor, at least one memory, and software for performing operations, including at least partially controlling movement of the robot, as described herein. Any combination of one or more computer readable medium(s) may be utilized as the memory. The computer readable medium may be a computer readable signal medium or a non-transitory computer readable storage medium. A non-transitory computer readable storage medium does not include propagating signals and may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Figure 6:
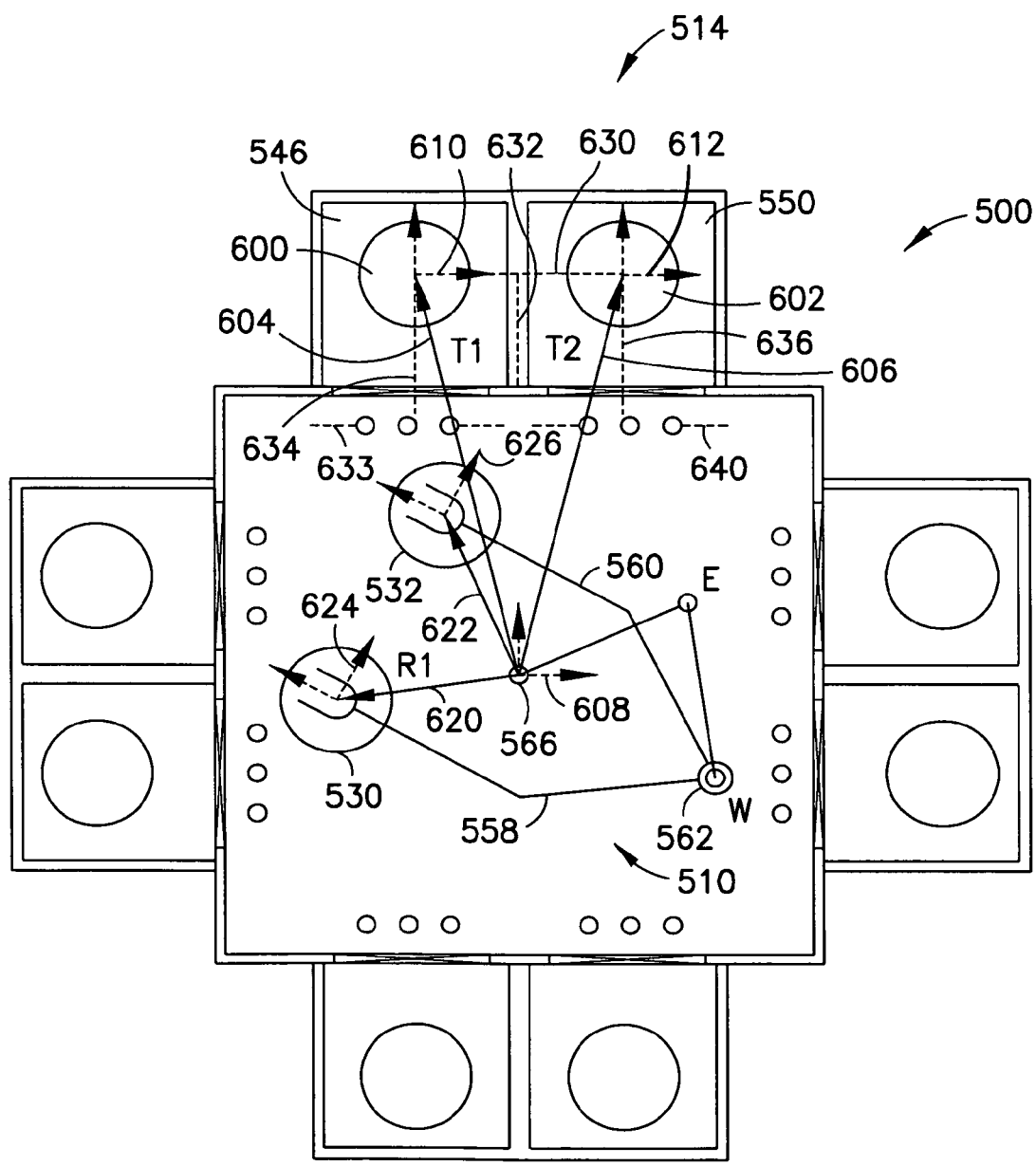
FIG. 6 is a diagram illustrating an example apparatus.

Referring also to FIG. 6, there is also shown a top view of system 500. A given station or process module 514 may have target locations or station locations 600, 602 denoted by first and second vectors 604, 606 that are designated "T1" (left) and "T2" (right) in the view shown. In the embodiment shown, the target location may be located vertically above the place location for the substrate, for example, where the robot places the substrates to fixed teach locations with a z axis vertical movement. In alternate aspects, the target locations may be at the place location, for example, where no Z axis is provided or where the station picks the wafers from the end effectors with pins or otherwise. Vectors 604, 606 may be referenced from the robot origin 566 (for example, origin (0,0) of coordinate system 608 grounded to tool 500) and may be expressed in polar coordinates, Cartesian coordinates or otherwise. Target locations 600, 602 may also have respective coordinate systems 610, 612 that may be oriented in any suitable orientation. For example, coordinate systems 610, 612 may have axis' that are parallel to the robot coordinate system 608. Alternately, coordinate systems 610, 612 may have x axis' that are parallel to each other. Alternately, coordinate systems 610, 612 may have any suitable axis' that is aligned with or otherwise referenced relative to a wafer characteristic, for example, notch or feature location, crystallographic orientation, fiducial orientation or any suitable reference. Alternately, coordinate systems 610, 612 may have any suitable orientation, similar or different or otherwise. Target locations 600, 602 may be for example, a destination location in station 514 for substrates 530, 532 respectively. Similarly, robot 510 may have first and second (or left and right) robot end effector location vectors 620, 622, for example, located at a reference portion of first or left end effector 558 that is designated "R1" 620 and located at a reference portion of second or right end effector 560 that is designated "R2" 622 in the view shown. First and second end effectors 558, 560 also have reference frames 624, 626 fixed thereto, for example, located at the end of vectors 620, 622 respectively and on center of a properly located substrate on each end effector. Reference frames 624, 626 fixed to first and second end effectors 558, 560 may have any suitable orientation, for example, where the y axis of the respective reference frames points in a direction nominally parallel to a radial line extending from robot axis 608 when end effectors 558, 560 are separated by a distance being the nominal distance between stations 600, 602 or otherwise. Alternately, reference frames 624, 626 fixed to first and second end effectors 558, 560 may have any suitable orientation, similar, different or otherwise. Vectors 620, 622 may be referenced from the robot origin 566 and move with their respective end effectors 558, 560 designating the location of the end effectors 558, 560 at any point in time as end effectors 558, 560 move and may be expressed in polar coordinates, Cartesian coordinates or otherwise. In one example, when substrates 530 and 532 are properly located on end effectors 558, 560 respectively and the robot 510 directs end effector 558 to target or station 600 and end effector 560 to target or station 602, the location of wafers 530, 532 may be properly placed within station 514 where the robot location or position vector 620 may be the same as and align with the station or target vector 604 and where the robot location or position vector 622 may be the same as and align with the station or target vector 606. In one aspect, a line 630 between station origins 610, 612 may be provided and another line 632 perpendicular thereto and intersecting robot origin 566 may be provided to define a nominal path wrist 562 may travel through during operation or prior to or at setup. Where the station locations are offset from the nominal wrist path, the end effectors may nominally travel with their origins at such offset along first and second offset paths 634, 636 and nominally parallel to line 632 where the respective offsets may be the same different or otherwise. After station locations have been established, a combination of or different path(s) may be provided, for example, paths defined with respect to coordinate systems 610, 612, alone or in combination with 608 or otherwise. In alternate aspects, the disclosed embodiment may be used with any suitable coordinate system or vectors with any suitable reference locations, for example, with respect to a different portion of end effectors 558, 560, station 514, system 500 or otherwise. Sensors 534, 536, 538 are shown nominally positioned along a sensor axis 638 substantially perpendicular to path 632 and the transport path 634 with sensor 536 located in line with the transport path and sensors 534, 536 equidistant and offset from the nominal transport path 634. In alternate aspects, the sensors need not be equidistant or located on the transport path and need not be located along sensor axis 638. Similarly, sensors 540, 542, 546 are shown nominally positioned along a sensor axis 640 substantially perpendicular to path 632 and the transport path 636 with sensor 542 located in line with the transport path and sensors 540, 544 equidistant and offset from the nominal transport path 636. In alternate aspects, the sensors need not be equidistant or located on the transport path and need not be located along sensor axis 640.

Figure 7:
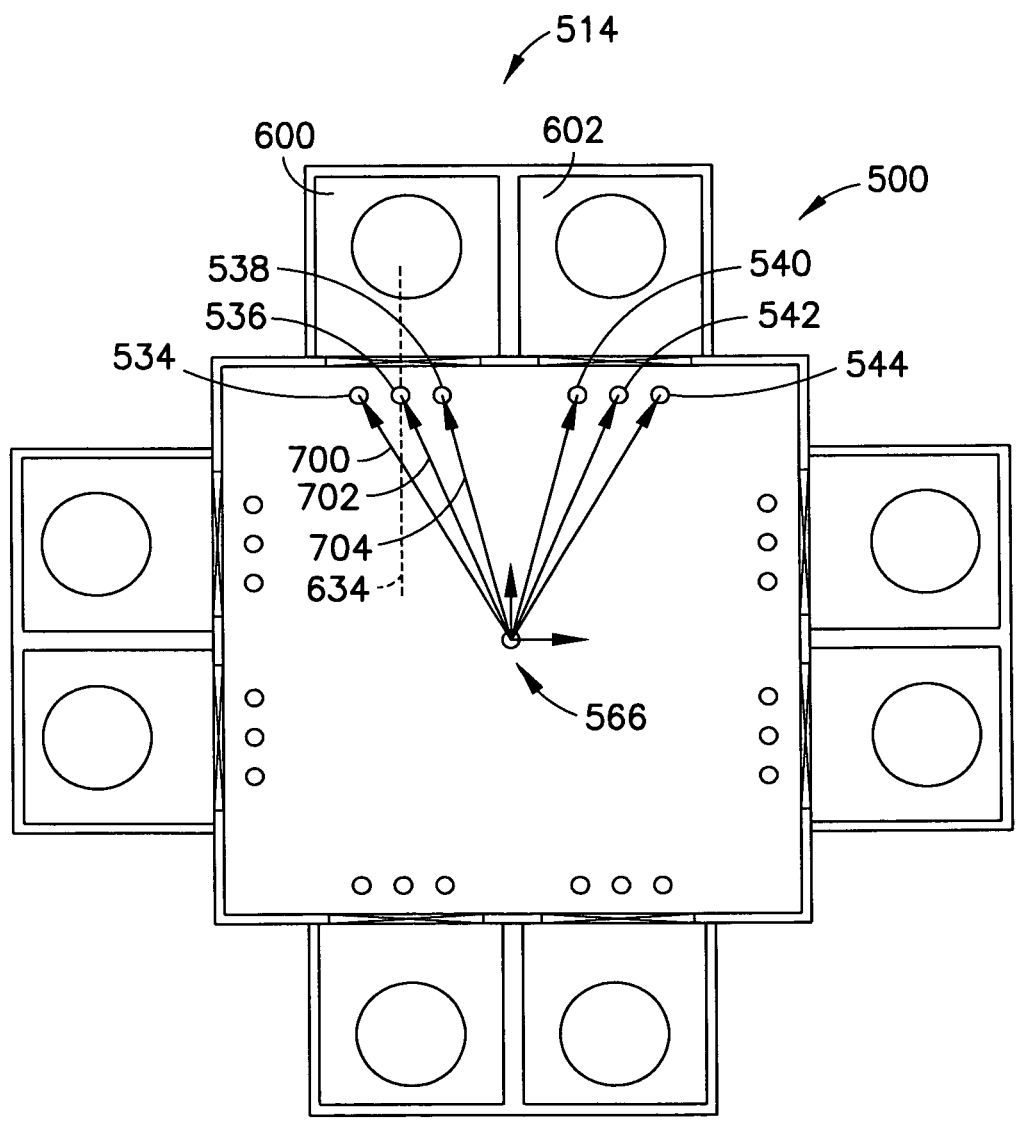
FIG. 7 is a diagram illustrating an example apparatus.

Referring also to FIG. 7, the disclosed embodiment outlines the function and algorithms for the calibration and operation of an exemplary adaptive placement system (APS)

system. The disclosed embodiment may be used the hardware of the APS system may consist of two triplets 534, 536, 538 and 540, 542, 544 of substantially equi-spaced through beam sensors placed between the robot 510 and substrate station 514 or target location 600, 602. Sets of triplets may operate with respect to end effectors 558, 560 and as such, the left or first station 600 operation will be described in greater detail. The center sensor 536 may be nominally on a straight line 634 as described with respect to robot origin 566 and the concerned station 600. During a substrate pick or place operation the moving substrate 530 interrupts the continuity of the sensor 534, 536, 1538 light beams. The location 620 and orientation 624 of the end effector 558 at the instant of interruption is the input processed by the APS algorithm. At the highest level, the APS performs in two modes. The first mode is calibration, wherein the APS executes test moves with the robot and uses feedback from the robot and sensors to determine the operational and tuning parameters for the APS setup. In the second mode, referred to as the operational mode, the APS adapts the end effectors place locations for optimal substrate placement at the target or station locations 600, 602. These two modes are described in more detail.

Figure 9:
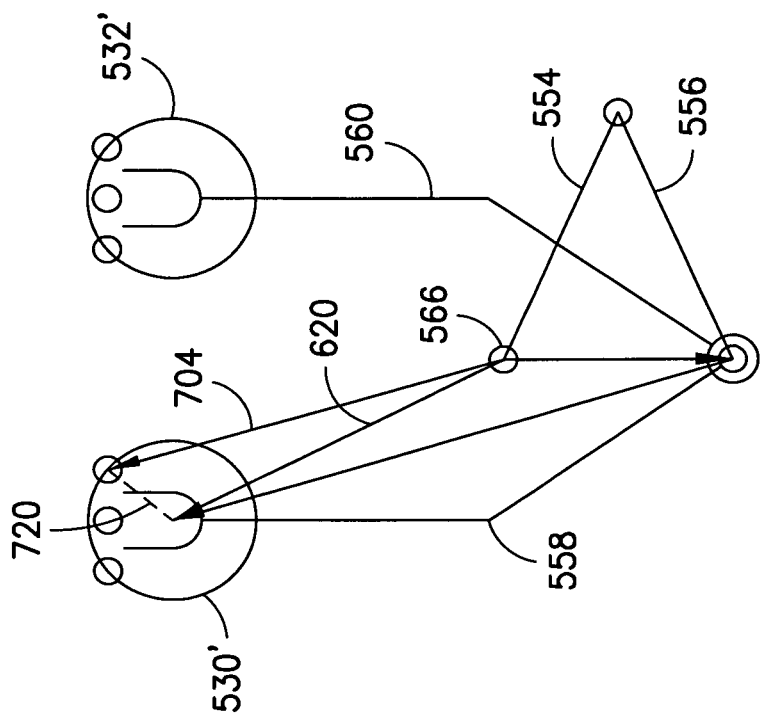
FIG. 9 is a diagram illustrating an example apparatus.
Figure 8:
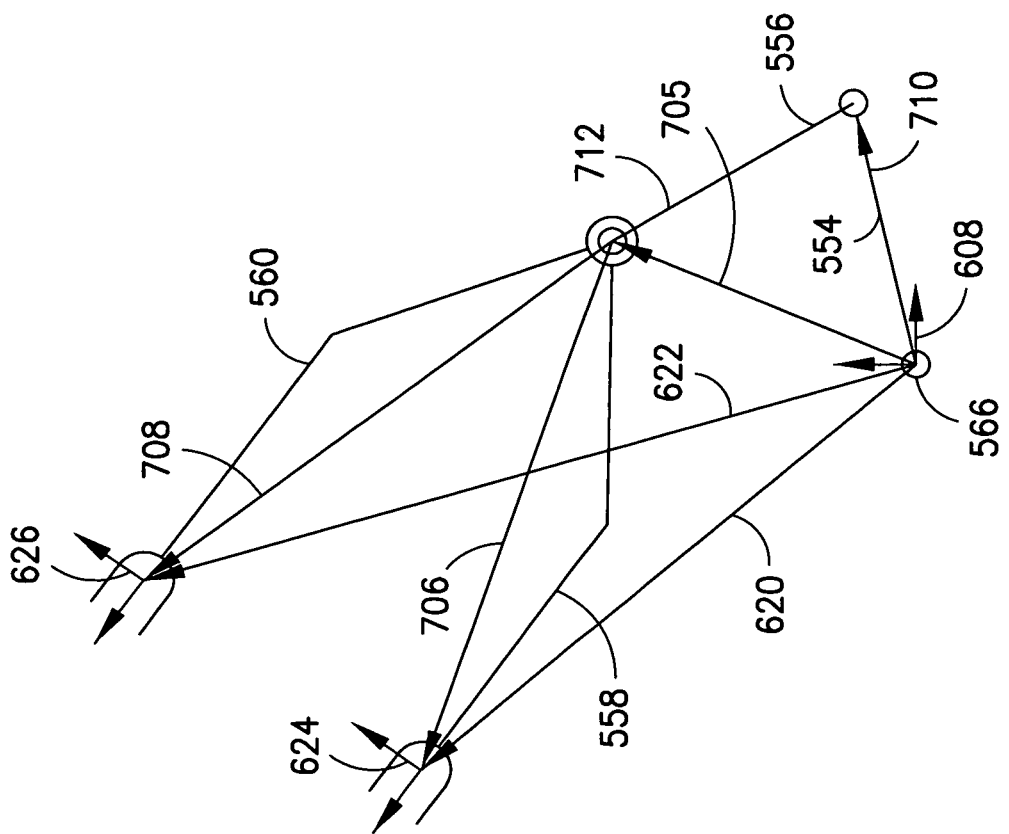
FIG. 8 is a diagram illustrating an example apparatus.

Referring also to FIGS. 8 and 9, in the calibration mode, the spatial positioning of the sensors and their performance are measured. With respect to sensor positions, each substrate station may have three APS sensors associated with it. Alternately, more or less APS sensors may be provided at any suitable location. In order to maximize the accuracy of the APS algorithm the coordinates of these APS sensors may be known very precisely with respect to the robot coordinate system. To achieve this, the position information may be measured after the APS sensors have been mechanically fixtured, for example, to chamber 522 or otherwise. The sensor positions are measured by moving a test substrate or fixture as part of or placed on the robot end effector through the sensor beams and capturing the substrate position at the instant a beam is interrupted. The corresponding sensor location is calculated from the captured substrate location as will be described in greater detail below.

During calibration, sensor locations, for example vectors 700, 702, 704 as seen in FIG. 7 corresponding to sensor #1, 534, sensor #2, 536 and sensor #3, 538 associated with station 600 are precisely determined. For calibration, a calibration fixture, for example, a circular test substrates 530' and 532' are placed on the robot end effectors 558, 560, for example, such that the center or reference location of the test substrates coincide with the end effector origins 624, 626, for example at the ends of vectors 620, 622 typically referred as the center or origins (0,0) of the end effector and where end effector reference frames 624, 626 may be fixed to and move with end effectors 558, 560 respectively and location vectors 620, 622. Here, location vector 620 may be the sum of robot origin to wrist location vector 704 and wrist to first end effector location vector 706. Similarly, location vector 622 may be the sum of robot origin to wrist location vector 704 and wrist to second end effector location vector 708. Here, wrist location vector 705 may be the sum of robot origin to elbow vector 710 and elbow to wrist vector 712. Here, the location vectors 620, 622 and orientation of end effector reference frames 624, 626 may be determined at any point in the robot's work space based on the robots kinematics and the relationship between the arm linkages and bands and the drive encoders positions. Based on the known radius' 720 of substrates 530' and 532' and the captured joint positions, the locations of the sensors, for example, location vector 704 may be determined as well as that associated with the other sensors. The calibration procedure may be repeated, in entirety, for all the stations equipped with APS sensors. All of the calibration procedures may be repeated as several times as required and the measurements may be averaged by averaging, least squares averaging or otherwise. By way of example, the number of times the measurement process is repeated for a station may be a configurable parameter.

As seen, the first step in calibration is determining the approximate position of the APS sensors by executing a move. This is achieved as follows:

1. Extend the robot 510 with the test substrates 530', 532' on it from a retracted position to a extended position, for example, a nominal station position. Here, there will be six sensor events for each station location as the leading and trailing edge of substrates 530', 532' cross the sets of three APS sensors 534, 536, 538 and 540, 542, 544.
2. At each sensor event the end effector locations 620, 622 and orientations of end effector reference frames 624, 626 are captured as well as the type of transition i.e. leading edge vs. trailing edge. It is noted that a leading edge is defined as a light to dark (12d) transition for the sensor while a trailing edge is a dark to light (d21) transition.
3. Retract the robot, for example, to R home position or other suitable retract position.

The data captured above is the location and orientation of the end effector centers when the test wafers interrupt each set of the three APS sensors on the 12d and d21 transitions. The index j refer to quantities related to the six edge detection events and the index i refers to the sensors as summarized in the table below:

TABLE 1

| Events associated with index j associated with a given end effector | | |
|---|---|---|
| Index (j) | Sensor (i) | Event |
| 1 | Left 1 | Light to dark/Leading edge |
| 3 | Center 2 | Light to dark/Leading edge |
| 5 | Right 3 | Light to dark/Leading edge |
| 2 | Left 1 | Dark to light/Trailing edge |
| 4 | Center 2 | Dark to light/Trailing edge |
| 6 | Right 3 | Dark to light/Trailing edge |

Here, for each end effector, the six events correspond to locations where the edge of the test substrate cross the sensors for example, extending or retracting. The steps in the determination of the sensor locations may be as follows. The procedure below may be performed multiple times. Alternately, the procedure below may be performed once, for example, during an extend or retract. Alternately, any suitable combination or number of moves may be utilized and the results averaged or utilized as will be described. For example, the sensor location results from the one, two or more moves may be averaged. Here, the sensor locations may be determined as follows.

1. Move the robot to the T position corresponding to the station location in context and robot R to retracted position, for example, as seen in FIG. 5.
2. Extend the arm.
3. Record the Polar position of the end effectors at the single light to dark sensor events at sensors 536, 542.
4. Record the Polar positions end effectors at the two light to dark sensor events at sensors 534, 538 and 540, 542.

5. Record the Polar positions of the end effectors at the two dark to light sensor events at sensors 534, 538 and 540, 542.
6. Record the Polar positions of the end effectors at the single dark to light sensor events at sensors 536, 542.
7. Retract the robot.

In alternate aspects, the above procedure may be done with a retract move or other suitable move.

The positions of the sensors respectively in polar coordinates may then be calculated as follows. The example below calculates the position of the left side sensor 534 (Rsen1, Tsen1). Similarly, the other sensor positions may be calculated. In the following equations Rwaf is the radius of the test fixture or substrate.

First the captured end effector positions 620 for i=1 and j=1 & 2 for end effector 558 are converted to Cartesian coordinates Eq. 1:

$$x_1^{ee} = R_{rbt1} \times \cos(T_{rbt1})$$
$$y_1^{ee} = R_{rbt1} \times \sin(T_{rbt1})$$
$$x_2^{ee} = R_{rbt2} \times \cos(T_{rbt2})$$
$$y_2^{ee} = R_{rbt2} \times \sin(T_{rbt2}) \quad \text{(Eq. 1)}$$

Following intermediate variables are calculated Eq. 2:

$$dx = (x_2^{ee} - x_1^{ee})/2$$
$$dy = (y_2^{ee} - y_1^{ee})/2$$
$$z = \sqrt{dx^2 + dy^2}$$
$$v = \sqrt{Rwaf^2 - z^2} \quad \text{(Eq. 2)}$$

The position of the sensor is calculated in Cartesian coordinates as Eq. 3:

$$x_1^{sen} = x_1^{ee} + dx - dy \frac{v}{z}$$
$$y_1^{sen} = y_1^{ee} + dy + dx \frac{v}{z} \quad \text{(Eq. 3)}$$

Finally the position 700 of the sensor 534 is converted to Polar coordinates as Eq. 4:

$$R_{sen1} = \sqrt{x_1^{sen2} + y_1^{sen2}}$$
$$T_{sen1} = a \tan 2(y_1^{sen}, x_1^{sen}) \quad \text{(Eq. 4)}$$

Similarly, the center 2 and right 3 positions 702, 704 may be calculated. Similarly, the positions associated with sensors 540, 542, 544 may be calculated using the captured positions 622 of end effector 560 at the transitions. The procedure above may be repeated for the same move and the results for each sensor averaged. Alternately, the procedure above may be repeated for different moves and the results of each sensor averaged.

Figure 13:
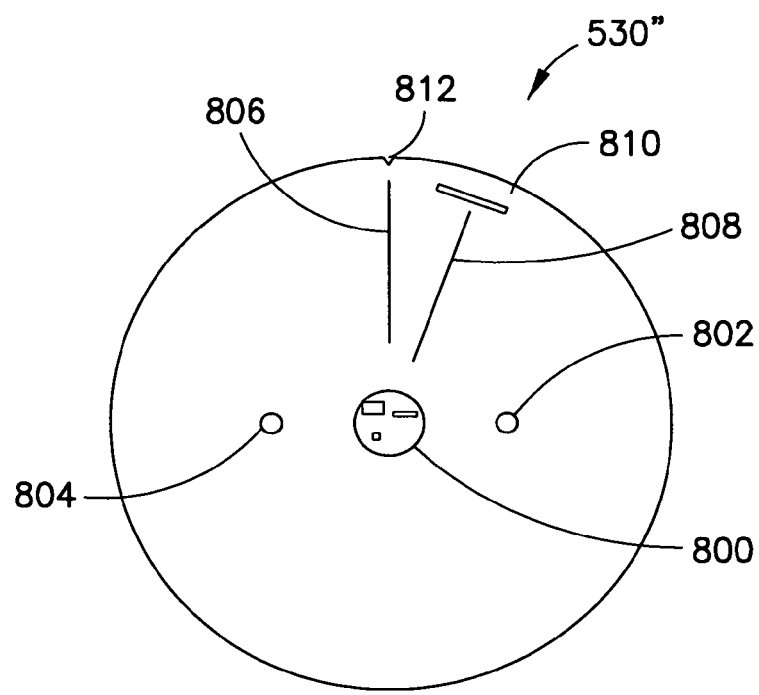
FIG. 13 is a substrate.

Referring now to FIGS. 10A-10C, there are shown various views of a camera field of view 536'. In an alternate aspect of the disclosed embodiment, instead of multiple through beam sensors, one or more cameras may be placed per station, for example, located at positions 536, 542 for stations 600, 602 of module 514. Referring also to FIG. 13, there is shown an exemplary substrate 530". Substrate 530" may have markings etched or otherwise placed on a side of the substrate, for example, the back side of the substrate such that camera 536' may take one or more images of the markings where the markings may comprise one or more fiducials, identification mark or marks, or any suitable marking. Camera 536' may have a processor configured to identify the associated mark and provide the robot controller with one or more time stamp associated with the point in time the mark was captured, a location of the mark with respect to a reference and an orientation of the mark. The mark may comprise cross hair and bulls eye arrangement 800 with identification indicia, such as a wafer id number, bar code or 2 dimensional bar code or other suitable identification indicia therein. The fiducial 800 may have cross hairs oriented with respect to a reference, for example, the center of the substrate and a crystalline orientation. Alternately, the fiducial may be offset and a reference vector to the center of the substrate and orientation may be provided. Further additional fiducials 802, 804 may be provided, for example to more accurately determine the location of the substrate and orientation. Further, a line 806 may be etched that is in line with or referenced with respect to the crystalline orientation of substrate 530". Further, a line 808 with an identification indicia that may be etched that is in line with or referenced with respect to the crystalline orientation and the center of substrate 530". Further, notch 812 may be provided. In alternate aspects, any suitable mark, indicia, feature or otherwise may be provided. In FIG. 10A, there is shown a field of view of camera or array 536'. Here array 536' may be a CCD or other suitable array having m×n pixels with orientation 822 and location vector 816 with respect to robot origin 566 and orientation reference frame 608. Initially, an accurate location vector 816 and reference frame 822 are unknown and need to be calibrated. One approach is to provide a test substrate with the center fiducial located at the end effector center or at the end effector reference frame. Here, camera 536' may take an image 824 and identify location vector 818 based upon the pixel location of the fiducial center. Further, with the position 620 and orientation of the end effector 624, the location 816 and orientation 822 of array 536' may be determined. Another approach may be to take two or more images, for example, 824, 826 and based on the robot locations associated with positions 824 and 826 in combination with pixel locations or vectors 818, 820 the distance between locations 824, 826 may be determined (i.e. calibrate effective pixel size) and the location 816 and orientation 822 determined. Further approaches to calibration of array location 816, orientation 822 and effective pixel size 828 may be provided involving averaging, least squares averaging or otherwise converging on a calibrated location and orientation of the array 536' based on the robot locations and orientations in any suitable calibration method. Referring also to FIG. 10B, with the location 816 and orientation 822 of array being known, an image of the substrate may be taken as it passes over the field of view of array 536' and the image processed resulting on a location 832 and orientation 834 of the fiducial on the substrate. The time associated with the image may be time stamped and correlated with a location 830 being vector 620 and orientation 624 of robot 510 at the same time of the image event. Robot array location vector 816 and fiducial location vector 832 may be subtracted from location vector 620 resulting in an apparent eccentricity vector 836 of the substrate which may be provided in any suitable reference frame, for example, the end effector reference frame 830. Similarly, the orientation of reference frame 834 may be determined relative to end effector reference frame 624 or otherwise such that the orientation of the substrate may be corrected if so desired. Similarly, as seen in FIG. 10C, multiple samples 838 . . . 840 of the location and orientation of the fiducial may be taken, associated eccentricity vectors and orientations determined and averaged to converge on a substrate eccentricity 836' and orientation 834', for example, least squares averaged to converge on a substrate eccentricity vector 836' and orientation 834' relative to some reference frame, for example, end effector reference frame 624. The disclosed methods associated with an image array may be utilized by a substrate handler that may transport one or more substrates where the controller of the handler may correct substrate placement or picking for eccentricity, angular orientation, individually or in combination with each other in any suitable method. Described are suitable methods of providing an adaptive placement system for wafers or substrates with an inscribed fiducial mark.

Figure 12:
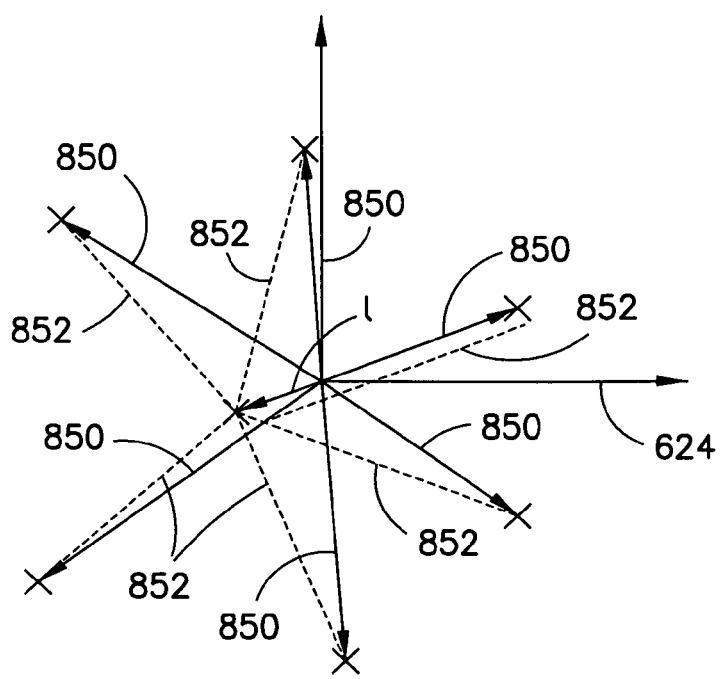
FIG. 12 is a pattern of vectors.

Referring also to FIGS. 11A, 11B and 12, there is shown a view of system 500 where placement location determination may be described. During a pick or place or other suitable operation, vectors 620 representing the polar position (Rrbtj, Trbtj); j=1-6 of the end effector may be collected at each sensor event. The measurements may be used to directly calculate an eccentricity to achieve optimum station or target placement as will be described Eq. 5:

$$\vec{r}_{rbtj} = [R_{rbtj}, T_{rbtj}] \quad \text{(Eq. 5)}$$

As described, a vector 604 to the station or target location in a main coordinate system is defined Eq. 6:

$$\vec{r}_{tgt} = [R_{tgt}, T_{tgt}] \quad \text{(Eq. 6)}$$

As described, vector 700, 702, 704 to location of sensor i, i=1, 2, 3, in main coordinate system is defined Eq. 7:

$$\vec{r}_{seni} = [R_{seni}, T_{seni}], i=1,2,3 \quad \text{(Eq. 7)}$$

Next, vectors 850 rsns (FIG. 12) representing the location vector to each point j on the wafer edge which was detected by sensor i in the coordinate system 624 attached to the robot end effector are calculated from the end effector positions (Rrbtj, Trbtj) corresponding to the six sensor events for j=1, 2, . . . , 6; i=1 for j=1, 2; i=2 for j=3, 4; i=3 for j=5, 6 Eq. 8:

$$[R_j^{sns}, T_j^{sns}] \vec{r}_j^{sns} = \vec{r}_{seni} - \vec{r}_{rbtj} \quad \text{(Eq. 8)}$$

Next, define a hypothetical vector 852 rjtgt to each of above defined points j from the wafer center using the coordinate system associated with the end effector Eq. 9:

$$[R_j^{tgt}, T_j^{tgt}] = \vec{r}_j^{tgt} = \vec{r}_j^{sns} - \vec{e}, j=1,2,\ldots,6 \quad \text{(Eq. 9)}$$

Here, e is an unknown eccentricity vector in the end effector coordinate system 624. Next, minimize the distance of the above defined points j from the circumference of a fictitious circle located at the end of the eccentricity vector, using the following minimization function Eq. 10:

$$FN = \sum_{j=1}^{6} \left( \left| \vec{r}_j^{tgt} \right| - R_{waf} \right)^2 = \sum_{j=1}^{6} \left( \left| \vec{r}_j^{sns} - \vec{e} \right| - R_{waf} \right)^2 \quad \text{(Eq. 10)}$$

Next, solve or use a numerical iterative technique to minimize above cost function by iterating through e, for example starting with the previously calculated e for the target or station location or target location or starting from an arbitrary value, for example 0. Here, a final eccentricity vector of the substrate in the end effector reference frame 624 may be determined as a solution by minimization of the above FN.

Upon solving for separate eccentricity vectors 870, 872 in the end effector reference frames 624, 626 respectively, utilizing station locations 604, 606 in combination with eccentricity vectors 870, 872 the common wrist location vector 705 place, first end effector location vector 706 place and second end effector location vector 708 place may be determined using inverse kinematics solving for a common 705 place such that the center of the substrates 530, 532 are placed on center of their respective station frames 610, 612. Here the coordinates of placement location; i.e. the end point of robot extension move may be adjusted to achieve target wafer location are obtained. The robot may track the nominal transport path to the target location. The robot may then be directed to the place location as seen in FIGS. 11A and 11B. Alternately, the robot may track the nominal transport path to an intermediate location and the robot may then alternately be directed to the place locations. As above or in the event one or more images are used to compute the eccentricity vectors, any suitable algorithm may be used to further correct for velocity, latency or otherwise, as applied to edge data, image data or otherwise, for example, as disclosed in US Publication No. 2004/0167743 Dated Aug. 26, 2004 and U.S. Pat. No. 4,819,167 Dated Apr. 4, 1989, both of which are incorporated by reference herein in their entirety.

During setup, teaching and operation of robot 510, various modes of operation may be provided. A first mode preloads default station locations in the robot. Another mode allows the user to move or jog the robot in a radial direction with the end effectors at a fixed programmable offset from the nominal radial path of the wrist and where the programmable offsets may be the same or different or otherwise. A third mode blends radial moves such that the wrist tracks with respect to path 623 which is perpendicular to a line between actual teach locations 610, 612 and where the wrist is constrained to pass over the center 566 of robot 510 where the link lengths of the upper arm and forearm are the same or passes over offset as constrained by unequal length forearms and upper arms. In another mode, the user may jog either the left or right end effector with respect to the left or right end effectors reference frame or with respect to default or taught station reference frames. In another mode, for example, when either the left or right station is taught, the user may switch to the adjacent station or end effector reference frame for jogging where the taught end effector is locked in position while teaching and jogging the other. By way of example, the taught fixed location end effector may rotate during the teaching or jogging of the adjacent end effector where the position of the end effector location (ex: vector 620 or 622) may be fixed.

In accordance with one example, a non-transitory program storage device readable by a machine, tangibly embodying a program of instructions executable by the machine for performing operations may be provided, such as the memory for example, where the operations comprise any of the operations performed by the controller as described herein. The methods described above may be at least partially performed or controlled with the processor, memory and software.

Figure 14A:
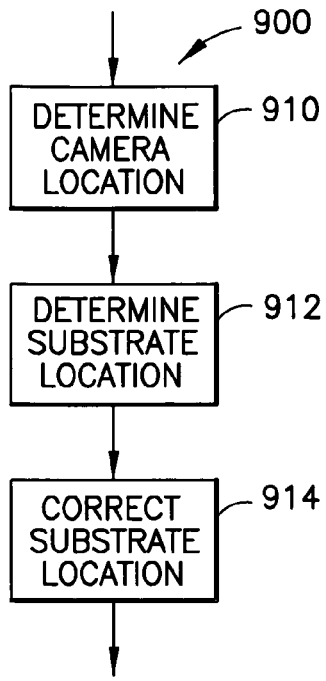
FIG. 14A is a process flow diagram.

Referring now to FIG. 14A, there is shown a process flow diagram 900. The process 900 determines a camera location 910, determines a substrate location 912 and corrects the substrate location as will be described below with an adaptive placement system for a wafer with an inscribed fiducial mark. Referring also to FIG. 14C, there is shown a process flow diagram 940. The example method 940 may comprise moving 942 a substrate, located on a first end effector of a robot, from a first location towards a second location by the robot; determining 944 location of a fiducial on the substrate while the substrate is being moved from the first location towards the second location; comparing 946 the determined location of the fiducial with a reference fiducial location while the robot is moving the substrate from the first location towards the second location. The nomenclature follows.

CF Cost function (unitless or m²)
N Number of snapshots taken by camera
$k_d$ Cost function weight coefficient (1/m²)
$k_\theta$ Cost function weight coefficient (1/rad²)
$x_i^{cam}$ x-coordinate of point i measured in camera coordinate system (m)
$x_{waf}^{rbt}$ x-coordinate of wafer center in robot end-effector coordinate system (m)
$x_{adj}$ x-coordinate of adjusted placement location in main coordinate system (m)
$x_{tgt}$ x-coordinate of target placement location in main coordinate system (m)
$x_i$ x-coordinate of point i measured in main coordinate system (m)
$x_{cam}$ x-coordinate of origin of camera coordinate system measured in main coordinate system (m)
$x_{cam}^*$ Estimated x-coordinate of origin of camera coordinate system in main coordinate system (m)
$y_i^{cam}$ y-coordinate of point i measured in camera coordinate system (m)
$y_{waf}^{rbt}$ y-coordinate of wafer center in robot end-effector coordinate system (m)
$Y_{adj}$ y-coordinate of adjusted placement location in main coordinate system (m)
$Y_{tgt}$ y-coordinate of target placement location in main coordinate system (m)
$y_i$ x-coordinate of point i measured in main coordinate system (m)
$y_{cam}$ x-coordinate of origin of camera coordinate system measured in robot coordinate system (m)
$y_{RBTO}^*$ Estimated y-coordinate of origin of camera coordinate system in main coordinate system (m)
$\theta_{waf}^{rbt}$ Orientation of wafer in robot end-effector coordinate system (rad)
$\theta_i^{cam}$ Orientation associated with point i measured in camera coordinate system (rad)
$\theta_{adj}$ Orientation of adjusted placement location in main coordinate system (rad)
$\theta_{tgt}$ Orientation of target placement location in robot coordinate system (rad)
$\theta_i$ Orientation associated with point i measured in main coordinate system (rad)
$\theta_{cam}$ Orientation of camera coordinate system measured in main coordinate system (rad)
$\theta_{cam}^*$ Estimated orientation of camera coordinate system in main coordinate system (rad)
$\theta_{rbti}$ Orientation of robot end-effector coordinate system in main coordinate system when snapshot i taken (rad)

Transformation from Camera to Robot Coordinates may be as follows. Transformation from $x_i^{cam}$, $y_i^{cam}$ and $\theta_i^{cam}$ to $x_i$, $y_i$ and $\theta_i$:

$$x_i = x_{cam} + x_i^{cam} \cos\theta_{cam} - y_i^{cam} \sin\theta_{cam} \quad \text{(Eq. 11)}$$

$$y_i = y_{cam} + x_i^{cam} \sin\theta_{cam} + y_i^{cam} \cos\theta_{cam} \quad \text{(Eq. 12)}$$

$$\theta_i = \theta_{cam} + \theta_i^{cam} \quad \text{(Eq. 13)}$$

Calibration Based on Single Camera Snapshot may be as follows.

Input information: measurements extracted from camera snapshot $x_i^{cam}$, $y_i^{cam}$ and $\theta_i^{cam}$, where i=1, and measurements determined based on robot encoders $x_i$, $y_i$ and $\theta_i$ where i=1. Objective: calculate location of camera, $x_{cam}$, $y_{cam}$ and $\theta_{cam}$, in main coordinate system:

$$\theta_{cam} = \theta_i - \theta_i^{cam}, i=1 \quad \text{(Eq. 14)}$$

$$x_{cam} = x_i - x_i^{cam} \cos\theta_{cam} + y_i^{cam} \sin\theta_{cam}, i=1 \quad \text{(Eq. 15)}$$

$$y_{cam} = y_i - x_i^{cam} \sin\theta_{cam} - y_i^{cam} \cos\theta_{cam}, i=1 \quad \text{(Eq. 16)}$$

Alternatively, the location of the camera in the main coordinate system may be expressed in terms of polar or cylindrical coordinates or in any other suitable coordinates.

Calibration Based on Multiple Snapshots Utilizing Orientation Info may be as follows.

Input information: measurements extracted from camera snapshots $x_i^{cam}$, $y_i^{cam}$ and $\theta_i^{cam}$, where i=1, 2, ..., N, and measurements determined based on robot encoders $x_i$, $y_i$ and $\theta_i$, where i=1, 2, ..., N. Objective: estimate location of camera, $x_{cam}$, $y_{cam}$ and $\theta_{cam}$, in main coordinate system:

$$x_i' = x_{cam} + x_i^{cam} \cos\theta_{cam} - y_i^{cam} \sin\theta_{cam}, i=1,2,\ldots,N \quad \text{(Eq. 17)}$$

$$y_i' = y_{cam} + x_i^{cam} \sin\theta_{cam} + y_i^{cam} \cos\theta_{cam}, i=1,2,\ldots,N \quad \text{(Eq. 18)}$$

$$\theta_i' = \theta_{cam} + \theta_i^{cam}, i=1,2,\ldots,N \quad \text{(Eq. 19)}$$

$$e_{di} = \sqrt{(x_i'-x_i)^2 + (y_i'-y_i)^2}, i=1,2,\ldots,N \quad \text{(Eq. 20)}$$

$$e_{\theta i} = \theta_i' - \theta_i, i=1,2,\ldots,N \quad \text{(Eq. 21)}$$

$$CF = k_d \sum_{i=1}^{N} e_{di}^2 + k_\theta \sum_{i=1}^{N} e_{\theta i}^2 = \quad \text{(Eq. 22)}$$

$$k_d \sum_{i=1}^{N} [(x_i'-x_i)^2 + (y_i'-y_i)^2] + k_\theta \sum_{i=1}^{N} [\theta_i' - \theta_i]^2$$

$$CF(x_{cam}^*, y_{cam}^*, \theta_{cam}^*) = \min CF(x_{cam}, y_{cam}, \theta_{cam}) \quad \text{(Eq. 23)}$$

A numerical iterative technique may be used to minimize the above cost function by iterating through $x_{cam}$, $y_{cam}$ and $\theta_{cam}$. The starting point may be selected based on one of the snapshots according to Equations (14) to (16).

Alternatively, the location of the camera in the main coordinate system may be expressed in terms of polar or cylindrical coordinates or in any other suitable coordinates.

Calibration Based on Multiple Snapshots Excluding Orientation Info may be as follows.

Input information: measurements extracted from camera snapshots $x_i^{cam}$ and $y_i^{cam}$, where i=1, 2, ..., N, and measurements determined based on robot encoders $x_i$ and $y_i$, where i=1, 2, ..., N. Objective: estimate location of camera, $x_{cam}$, $y_{cam}$ and $\theta_{cam}$, in main coordinate system:

$$x_i' = x_{cam} + x_i^{cam} \cos\theta_{cam} - y_i^{cam} \sin\theta_{cam}, i=1,2,\ldots,N \quad \text{(Eq. 24)}$$

$$y_i' = y_{cam} + x_i^{cam} \sin\theta_{cam} + y_i^{cam} \cos\theta_{cam}, i=1,2,\ldots,N \quad \text{(Eq. 25)}$$

$$e_{di} = \sqrt{(x_i'-x_i)^2 + (y_i'-y_i)^2}, i=1,2,\ldots,N \quad \text{(Eq. 26)}$$

$$CF = \sum_{i=1}^{N} e_{di}^2 = \sum_{i=1}^{N} [(x_i'-x_i)^2 + (y_i'-y_i)^2] \quad \text{(Eq. 27)}$$

$$CF(x_{cam}^*, y_{cam}^*, \theta_{cam}^*) = \min CF(x_{cam}, y_{cam}, \theta_{cam}) \quad \text{(Eq. 28)}$$

A numerical iterative technique may be used to minimize the above cost function by iterating through $x_{cam}$, $y_{cam}$ and $\theta_{cam}$. The starting point may be selected based on one of the snapshots according to Equations (14) to (16).

Alternatively, the location of the camera in the robot coordinate system may be expressed in terms of polar or cylindrical coordinates or in any other suitable coordinates.

Correction of Wafer Location Based on Single Camera Snapshot may be as follows.

Input information: measurements extracted from camera snapshot $x_i^{cam}$ and $y_i^{cam}$, where i=1, and measurements determined based on robot encoders $x_i$, $y_i$ and $\theta_i$ ($\theta_i$ is function of $x_i$ and $y_i$ if end-effector not independently actuated), where i=1. Objective: calculate location of wafer on robot end-effector $x_{waf}^{rbt}$ and $y_{waf}^{rbt}$, and determine adjusted placement location $x_{adj}$ and $y_{adj}$ (if robot has independently articulated end-effector, $\theta_{adj}$ may be selected arbitrarily; if it does not, $\theta_{adj}$ is function of $x_{adj}$ and $y_{adj}$):

$$x_{cam}+x_i^{cam}\cos\theta_{cam}-y_i^{cam}\sin\theta_{cam}=x_i+x_{waf}^{rbt}\cos\theta_{rbti}-y_{waf}^{rbt}\sin\theta_{rbti}, i=1 \quad \text{(Eq. 29)}$$

$$y_{cam}+x_i^{cam}\sin\theta_{cam}+y_i^{cam}\cos\theta_{cam}=y_i+x_{waf}^{rbt}\sin\theta_{rbti}+y_{waf}^{rbt}\cos\theta_{rbti}, i=1 \quad \text{(Eq. 30)}$$

$$(30) \text{ and } (31) \Rightarrow x_{waf}^{rbt}, y_{waf}^{rbt} \quad \text{(Eq. 31)}$$

Once the location of the wafer on the robot end-effector, $x_{waf}^{rbt}$ and $y_{waf}^{rbt}$, is calculated, the adjusted placement location $x_{adj}$ and $y_{adj}$ (i.e., placement location adjusted to achieve target wafer location, defined in main coordinate system) may be determined:

$$x_{adj}=x_{tgt}-x_{waf}^{rbt}\cos\theta_{adj}+y_{waf}^{rbt}\sin\theta_{adj} \quad \text{(Eq. 32)}$$

$$y_{adj}=y_{tgt}-x_{waf}^{rbt}\sin\theta_{adj}-y_{waf}^{rbt}\cos\theta_{adj} \quad \text{(Eq. 33)}$$

where $\theta_{adj}$ may be selected arbitrarily if the robot has an independently articulated end-effector or an orienter, or $\theta_{adj}$ is a function of $x_{adj}$ and $y_{adj}$ if the robot does not have an independently articulated end-effector or an orienter. In the latter case, $x_{adj}$, $y_{adj}$ and $\theta_{adj}$ may be calculated together based on Equations (21), (22) and the relationship between $\theta_{adj}$ and $x_{adj}$, $y_{adj}$.

Alternatively, the placement location may be calculated directly, without calculating the location of the wafer in the end-effector coordinate system, as described in [12]. A polar, cylindrical or any other suitable coordinate system may be used.

Correction of Wafer Location Based on Multiple Camera Snapshots may be as follows.

Input information: measurements extracted from camera snapshots $x_i^{cam}$ and $y_i^{cam}$, where i=1, 2, . . . N, and measurements determined based on robot encoders $x_i$, $y_i$ and $\theta_i$ ($\theta_i$ is function of $x_i$ and $y_i$ if end-effector not independently actuated), where i=1, 2, . . . , N. Objective: estimate location of wafer on robot end-effector $x_{waf}^{rbt}$ and $y_{waf}^{rbt}$, and determine adjusted placement location $x_{adj}$ and $y_{adj}$ (if robot has independently articulated end-effector, $\theta_{adj}$ may be selected arbitrarily):

Conversion of $x_i, y_i, x_i^{cam}$ and $y_i^{cam}$ to $x_i^{rbt}$ and $y_i^{rbt}$ \quad (Eq. 34)

$$e_{di}=\sqrt{(x_i^{rbt}-x_{waf}^{rbt})^2+(y_i^{rbt}-y_{waf}^{rbt})^2}, i=1,2,\ldots,N \quad \text{(Eq. 35)}$$

$$CF = \sum_{i=1}^{N} e_{di}^2 = \sum_{i=1}^{N} \left[(x_i^{rbt}-x_{waf}^{rbt})^2 + (y_i^{rbt}-y_{waf}^{rbt})^2\right] \quad \text{(Eq. 36)}$$

$$CF(x_{waf}^{rbt*}, y_{waf}^{rbt*}) = \min CF(x_{waf}^{rbt}, y_{waf}^{rbt}) \quad \text{(Eq. 37)}$$

A numerical iterative technique may be used to minimize the above cost function by iterating through $x_{waf}^{rbt}$ and $y_{waf}^{rbt}$. The starting point may be selected based on one of the snapshots according to Equations (29) to (31).

Once the location of the wafer on the robot end-effector, $x_{waf}^{rbt}$ and $y_{waf}^{rbt}$, is estimated, the adjusted placement location $x_{adj}$ and $y_{adj}$ (i.e., placement location adjusted to achieve target wafer location, defined in main coordinate system) may be determined:

$$x_{adj}=x_{tgt}-x_{waf}^{rbt}\cos\theta_{adj}+y_{waf}^{rbt}\sin\theta_{adj} \quad \text{(Eq. 38)}$$

$$y_{adj}=y_{tgt}-x_{waf}^{rbt}\sin\theta_{adj}-y_{waf}^{rbt}\cos\theta_{adj} \quad \text{(Eq. 39)}$$

where $\theta_{adj}$ may be selected arbitrarily if the robot has an independently articulated end-effector or an orienter, or $\theta_{adj}$ is a function of $x_{adj}$ and $y_{adj}$ if the robot does not have an independently articulated end-effector or an orienter. In the latter case, $x_{adj}$, $y_{adj}$ and $\theta_{adj}$ may be calculated together based on Equations (38), (39) and the relationship between $\theta_{adj}$ and $x_{adj}$, $y_{adj}$.

Alternatively, the placement location may be calculated directly, without calculating the location of the wafer in the end-effector coordinate system, as described in [12]. A polar, cylindrical or any other suitable coordinate system may be used.

Correction of Wafer Location and Orientation Based on Single Snapshot may be as follows.

Robot with articulated end-effector or rotary feature (orienter) on end-effector required. Input information: measurements extracted from camera snapshot $x_i^{cam}$, $y_i^{cam}$ and $\theta_i^{cam}$, where i=1, and measurements determined based on robot encoders $x_i$, $y_i$ and $\theta_i$, where i=1. Objective: estimate location and orientation of wafer on robot end-effector $x_{waf}^{rbt}$, $y_{waf}^{rbt}$ and $\theta_{waf}^{rbt}$, and determine adjusted placement location $x_{adj}$, $y_{adj}$ and $\theta_{adj}$:

$$x_{cam}+x_i^{cam}\cos\theta_{cam}-y_i^{cam}\sin\theta_{cam}=x_i+x_{waf}^{rbt}\cos\theta_{rbti}-y_{waf}^{rbt}\sin\theta_{rbti}, i=1 \quad \text{(Eq. 40)}$$

$$y_{cam}+x_i^{cam}\sin\theta_{cam}+y_i^{cam}\cos\theta_{cam}=y_i+x_{waf}^{rbt}\sin\theta_{rbti}+y_{waf}^{rbt}\cos\theta_{rbti}, i=1 \quad \text{(Eq. 41)}$$

$$(30) \text{ and } (31) \Rightarrow x_{waf}^{rbt}, y_{waf}^{rbt} \quad \text{(Eq. 42)}$$

$$\theta_{waf}^{rbt}=\theta_{cam}+\theta_i^{cam}-\theta_i, i=1 \quad \text{(Eq. 43)}$$

Once the location of the wafer on the robot end-effector, $x_{waf}^{rbt}$, $y_{waf}^{rbt}$ and $\theta_{waf}^{rbt}$, is calculated, the adjusted placement location $x_{adj}$, $y_{adj}$ and $\theta_{adj}$ (i.e., placement location adjusted to achieve target wafer location and orientation, defined in main coordinate system) may be determined:

$$\theta_{adj}=\theta_{tgt}-\theta_{waf}^{rbt} \quad \text{(Eq. 44)}$$

$$x_{adj}=x_{tgt}-x_{waf}^{rbt}\cos\theta_{adj}+y_{waf}^{rbt}\sin\theta_{adj} \quad \text{(Eq. 45)}$$

$$y_{adj}=y_{tgt}-x_{waf}^{rbt}\sin\theta_{adj}-y_{waf}^{rbt}\cos\theta_{adj} \quad \text{(Eq. 46)}$$

Alternatively, the placement location may be calculated directly, without calculating the location of the wafer in the end-effector coordinate system, as described in [12]. A polar, cylindrical or any other suitable coordinate system may be used.

Correction of Wafer Location and Orientation Based on Multiple Snapshots may be as follows.

Robot with articulated end-effector or rotary feature (orienter) on end-effector required. Input information: measurements extracted from camera snapshots $x_i^{cam}$, $y_i^{cam}$ and $\theta_i^{cam}$, where i=1, 2, . . . , N, and measurements determined based on robot encoders $x_i$, $y_i$ and $\theta_i$, where i=1, 2, . . . , N.

Objective: estimate location and orientation of wafer on robot end-effector $x_{waf}^{rbt}$, $y_{waf}^{rbt}$ and $\theta_{waf}^{rbt}$, and determine adjusted placement location $x_{adj}$, $y_{adj}$ and $\theta_{adj}$:

Conversion of $x_i, y_i, \theta_i, x_i^{cam}, y_i^{cam}$ and $\theta_i^{cam}$ to $x_i^{rbt}$, $y_i^{rbt}$ and $\theta_i^{rbt}$ (Eq. 47)

$$e_{di} = \sqrt{(x_i^{rbt} - x_{waf}^{rbt})^2 + (y_i^{rbt} - y_{waf}^{rbt})^2}, i=1,2,N$$ (Eq. 48)

$$e_{\theta i} = \theta_i^{rbt} - \theta_{waf}^{rbt}, i=1,2,\ldots,N$$ (Eq. 49)

$$CF = k_d \sum_{i=1}^{N} e_{di}^2 + k_\theta \sum_{i=1}^{N} e_{\theta i}^2 =$$

$$k_d \sum_{i=1}^{N} \left[(x_i^{rbt} - x_{waf}^{rbt})^2 + (y_i^{rbt} - y_{waf}^{rbt})^2\right] + k_\theta \sum_{i=1}^{N} [\theta_i^{rbt} - \theta_{waf}^{rbt}]^2$$ (Eq. 50)

$$CF(x_{waf}^{rbt*}, y_{waf}^{rbt*}, \theta_{waf}^{rbt*}) = \min CF(x_{waf}^{rbt}, y_{waf}^{rbt}, \theta_{waf}^{rbt})$$ (Eq. 51)

A numerical iterative technique may be used to minimize the above cost function by iterating through $x_{waf}^{rbt}$, $y_{waf}^{rbt}$ and $\theta_{waf}^{rbt}$. The starting point may be selected based on one of the snapshots according to Equations (40) to (43).

Since the two sums in the cost function of Equation (50) are independent, they can be minimized independently.

Once the location of the wafer on the robot end-effector, $x_{waf}^{rbt}$, $y_{waf}^{rbt}$ and $\theta_{waf}^{rbt}$, is estimated, the adjusted placement location $x_{adj}$, $y_{adj}$ and $\theta_{adj}$ (i.e., placement location adjusted to achieve target wafer location and orientation, defined in main coordinate system) may be determined:

$$\theta_{adj} = \theta_{tgt} - \theta_{waf}^{rbt}$$ (Eq. 52)

$$x_{adj} = x_{tgt} - x_{waf}^{rbt} \cos \theta_{adj} + y_{waf}^{rbt} \sin \theta_{adj}$$ (Eq. 53)

$$y_{adj} = y_{tgt} - x_{waf}^{rbt} \sin \theta_{adj} - y_{waf}^{rbt} \cos \theta_{adj}$$ (Eq. 54)

Alternatively, the placement location may be calculated directly, without calculating the location of the wafer in the end-effector coordinate system. A polar, cylindrical or any other suitable coordinate system may be used.

An adaptive placement system with Multiple Calibration Paths may be as follows.

The adaptive placement system may utilize multiple camera calibrations (locations) to calculate the location of the wafer on the robot end-effector and/or the adjusted placement location, the camera locations being identified for different motion paths in the initial calibration process. This is expected to improve the accuracy of the APS because it takes into account various inaccuracies in the robot system, particularly when the wafer is misaligned on the robot end-effector (this scenario is emulated by the different motion paths in the initial calibration process).

In the calibration process, the robot performs multiple moves to find the camera location. These moves include the nominal motion path as well as additional calibration motion paths on each side of the nominal motion path, the additional calibration paths being, for example, substantially parallel to the nominal motion path. Typically, the additional calibration motion paths are defined so that the wafer follows a similar path that it would follow if it were misalignment on the robot end-effector up to the point of the maximum expected misalignment of the wafer on the robot end-effector. As an example, assuming that the maximum expected misalignment of the wafer on the robot end-effector is 5 mm, five additional calibration motion paths on each side of the nominal motion path may be used, the five additional calibration motion paths being equally spaced with an increment of 1 mm. Alternatively, any suitable shape and spacing of the calibration motion paths may be used.

When the robot performs an APS place operation, the location of the wafer on the robot end-effector and/or the adjusted placement location is first calculated using the camera location identified based on the nominal calibration motion path. The resulting lateral difference is then used to determine the calibration motion path that is closest to the actual path of the wafer, and the location of the wafer on the robot end-effector and/or the adjusted placement location is recalculated using the sensor locations identified based on this calibration motion path. Alternatively, the location of the wafer on the robot end-effector and/or the adjusted placement location may be recalculated as an average of results determined using the camera locations identified based on the two closest calibration motion paths, each on one side of the actual path of the wafer. The average may be weighted to reflect the distance of the actual path of the wafer from the two closest calibration motion paths. Alternatively, any suitable algorithm may be employed to recalculate the location of the wafer on the robot end-effector and/or the adjusted placement location using the camera locations identified based on the additional calibration motion paths.

Figure 14B:
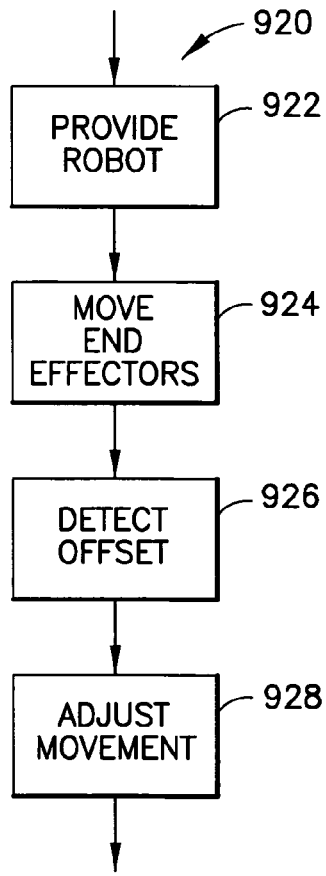
FIG. 14B is a process flow diagram.
Figure 14C:
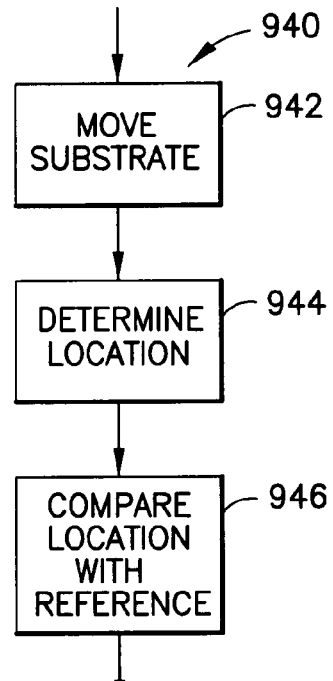
FIG. 14C is a process flow diagram.

Referring to FIG. 14B, there is shown a flow diagram of an exemplary method 920. The example method 920 may comprise providing 922 a robot having a drive, a movable arm assembly connected to the drive, and a plurality of sets of end effectors, where the end effectors are connected to the drive by the movable arm assembly, where a first one of the sets of end effectors comprises at least two of the end effectors, where the drive and the movable arm assembly are configured to move the at least two end effectors substantially in unison from a retracted position towards an extended position towards two different respective target locations, and where the at least two end effectors are independently movable relative to each other on the moveable arm assembly. The example method 920 may comprise partially independently moving 924 the end effectors in the first set relative to each other by the robot, where a controller connected to the drive detects 926 an offset of respective substrates on the at least two end effectors and adjusts 928 movement of the at least two end effectors relative to each other prior to placement of the substrates at the respective target locations.

Figure 15:
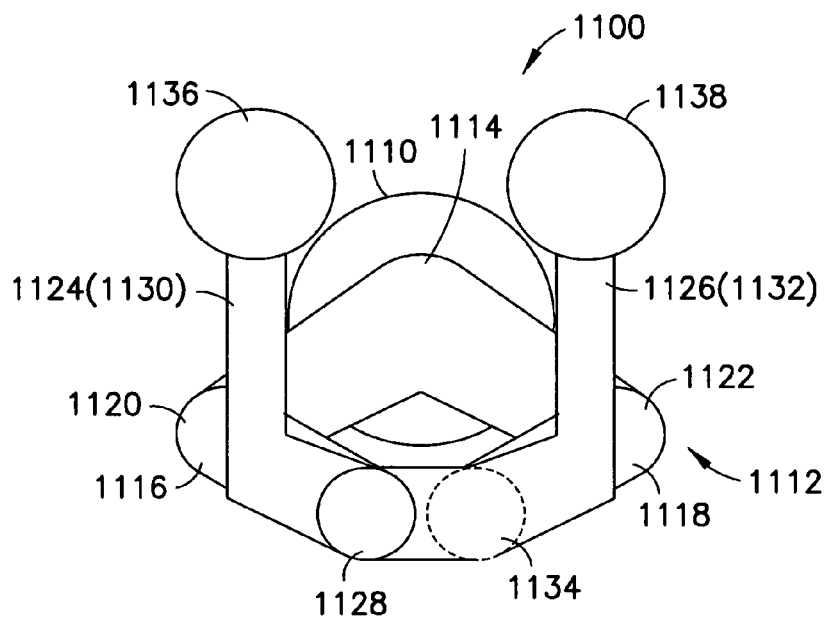
FIG. 15 is a top view of an example substrate transport robot.
Figure 16:
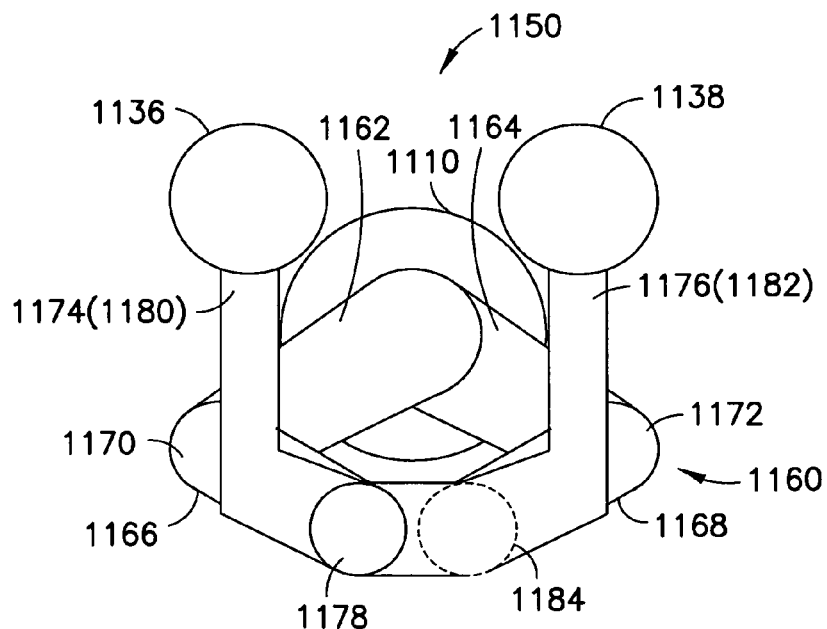
FIG. 16 is a top view of an example substrate transport robot.

Referring to FIG. 15, there is shown a schematic top plan view of an example substrate transport robot 1100. Robot 1100 may be a vacuum compatible or any suitable robot having drive portion 1110 and arm portion 1112 coupled to drive portion 1110 as will be described in greater detail below. Arm 1112 is shown having a common upper arm 1114 and two independently operable forearms 1116, 1118 coupled by elbow joints 1120, 1122 respectively to upper arm 1114. Forearm 1116 has independently operable end effectors 1124, 1126 coupled to forearm 1116 at wrist 1128. Similarly, forearm 1118 has independently operable end effectors 1130, 1132 coupled to forearm 1118 at wrist 1134. In the embodiment shown, substrates 1136, 1138 may simultaneously be transported to and from stations within a piece of equipment where picking or placement of substrates 1136, 1138 may be done independently and simultaneously where each may be positioned at a location independent of the other. Referring also to FIG. 16, there is shown a schematic top plan view of an example substrate transport robot 1150. Robot 1150 may be a vacuum compatible or any suitable robot having drive portion 1110 and arm portion 1160 coupled to drive portion 1110 as will be described in greater detail below. Arm 1160 is shown having two independently driven upper arms 1162, 1164 and two independently operable forearms 1166, 1168 coupled by elbow joints 1170, 1172 respectively to upper arms 1162, 1164. Forearm 1166 has independently operable end effectors 1174, 1176 coupled to forearm 1166 at wrist 1178. Similarly, forearm 1168 has independently operable end effectors 1180, 1182 coupled to forearm 1168 at wrist 1184. In the embodiment shown, substrates 1136, 1138 may simultaneously be transported to and from stations within a piece of equipment where picking or placement of substrates 1136, 1138 may be done independently and simultaneously where each may be positioned at a location independent of the other. In the embodiment shown, the upper arm link lengths and forearm link lengths may be different and driven by circular or non circular pulleys. An example of arms having unequal link lengths and driven by non circular pulleys is given in U.S. patent application Ser. No. 13/833,732 entitled "Robot having Arm with Unequal Link Lengths" filed Mar. 15, 2013 which is incorporated by reference herein in its entirety. In alternate aspects, arms with the same link lengths or arms with unequal link lengths and having circular pulleys may be provided. FIGS. 15 and 16 each show two arms having two end effectors. In alternate aspects, a single arm having a single or multiple end effectors may be provided.

Figure 17:
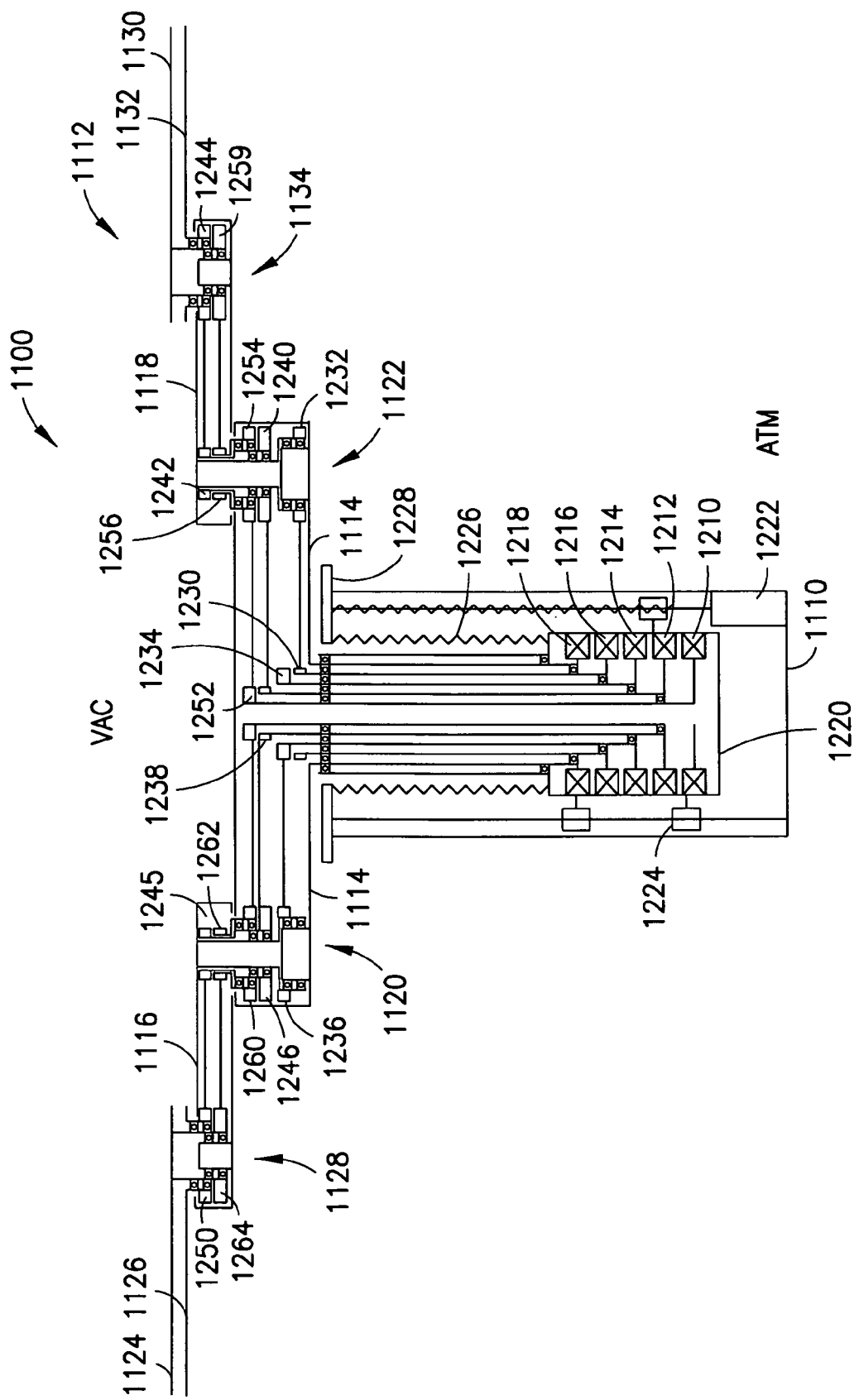
FIG. 17 is a section schematic view of an example substrate transport robot.

Referring to FIG. 17, there is shown a schematic cross section of robot 1100. Drive 1110 is shown having 5 coaxial shafts coupled to coaxial motor encoder arrangements 1210, 1212, 1214, 1216, 1218 designated as inner shafts to the outer. Each motor arrangement may be located within vacuum tight housing 1110. Alternately, only the rotors of motors of drives 1210, 1212, 1214, 1216, 1218 may be in vacuum in the drive housing 1220 where a sleeve may be provided between the rotors and stators. A vertical drive 1222, such as a lead screw or other suitable drive may lift and lower housing 1220 where slides 1224 may constrain housing 1220 in a vertical direction and bellows 1226 may be coupled to housing 1220 and flange 1228 to maintain a vacuum environment where arm 1112 and the inner portion of housing 1220 may be exposed to vacuum. The shaft of drive 1218 is directly coupled to the common upper arm 1114. The shaft of drive 1216 is directly coupled to pulley 1230 which is in turn coupled by bands to pulley 1232 in elbow 1122 where pulley 1232 is directly coupled to forearm 1118. Here rotation of motor 1216 rotates forearm 1118 about the elbow 1122. The shaft of drive 1214 is directly coupled to pulley 1234 which is in turn coupled by bands to pulley 1236 in elbow 1120 where pulley 1236 is directly coupled to forearm 1116. Here rotation of motor 1214 rotates forearm 1116 about the elbow 1120. The shaft of drive 1212 is directly coupled to pulley 1238 which is in turn coupled by bands to pulley 1240 in elbow 1122 where pulley 1240 is directly coupled to pulley 1242 in elbow 1122. Pulley 1242 is then coupled by bands to pulley 1244 in wrist 1134 where pulley 1244 is directly coupled to lower end effector 1132. Here, rotation of motor 1212 rotates lower end effector 1132 about the wrist 1134. Similarly, pulley 1238 is also coupled by bands to pulley 1246 in elbow 1120 where pulley 1246 is directly coupled to pulley 1248 in elbow 1120. Pulley 1248 is then coupled by bands to pulley 1250 in wrist 1128 where pulley 1250 is directly coupled to lower end effector 1126. Here, rotation of motor 1212 rotates lower end effector 1126 about the wrist 1128. Further, rotation of motor 1212 simultaneously rotates both lower end effectors 1126, 1132 about their respective wrists 1128, 1134. The shaft of drive 1210 is directly coupled to pulley 1252 which is in turn coupled by bands to pulley 1254 in elbow 1122 where pulley 1254 is directly coupled to pulley 1256 in elbow 1122. Pulley 1256 is then coupled by bands to pulley 1258 in wrist 1134 where pulley 1258 is directly coupled to upper end effector 1130. Here, rotation of motor 210 rotates upper end effector 1130 about the wrist 1134. Similarly, pulley 1252 is also coupled by bands to pulley 1260 in elbow 120 where pulley 1260 is directly coupled to pulley 1262 in elbow 1120. Pulley 1262 is then coupled by bands to pulley 1264 in wrist 1128 where pulley 1250 is directly coupled to upper end effector 1124. Here, rotation of motor 210 rotates upper end effector 124 about the wrist 1128. Further, rotation of motor 1210 simultaneously rotates both upper end effectors 1124, 1130 about their respective wrists 1128, 1134. The shafts associated with drives 1210, 1212, 1214, 1216, 2118 are each independently and coaxially rotatable and may be supported by any suitable bearing or other arrangement with respect to housing 1220 as shown or otherwise. The three pulleys in each of elbows 1120, 1122 and the two pulleys in each of wrists 1128, 1134 are each independently and coaxially rotatable with respect to a common axis in each joint and may be supported by any suitable bearing or other arrangement as shown or otherwise. The following description of respective pulley ratios is based on the premise that the link lengths of each link are the same. In alternate aspects, different ratios or driving arrangement may be provided, for example, where the link lengths are different. An example of arms having unequal link lengths and driven by non circular pulleys is given in U.S. patent application Ser. No. 13/833,732 entitled "Robot having Arm with Unequal Link Lengths" filed Mar. 15, 2013 which is incorporated by reference herein in its entirety. In the embodiment shown, pulleys and bands are provided. In alternate embodiments, any suitable power transmission arrangement may be provided, for example, belts, links, gears, cable or any suitable arrangement. In the embodiment shown, 5 coaxial direct driving shafts are provided. In alternate embodiments, any suitable driving arrangement may be provided, for example, motors in joints, links, speed reducers, belts, magnetic couplings, linear and/or rotational drives or any suitable drive may be provided. In the embodiment shown, the ratio between pulleys 1230, 1232 and 1234, 1236 may be any suitable ratio, for example, 1:1 or higher or lower than 1:1. In the embodiment shown, the ratio between pulleys 1238, 1240 and 1238, 1246 may be any suitable ratio, for example, 1:3 or higher or lower than 1:3. In the embodiment shown, the ratio between pulleys 1252, 1254 and 1252, 1250 may be any suitable ratio, for example, 1:3 or higher or lower than 1:3. In the embodiment shown, the ratio between pulleys 1242, 1244 and 1248, 2150 may be any suitable ratio, for example, 1:2. In the embodiment shown, the ratio between pulleys 1256, 1258 and 1262, 1264 may be any suitable ratio, for example, 1:2. In operation, simultaneous rotation of all of drives 1210, 1212, 1214, 1216, 1218 rotates the entire arm assembly. Simultaneous rotation of common link 1114, pulleys 1234, 1238 and 1252 with counter rotation of pulley 1230 cause end effectors 1130, 1132 to extend or retract while end effectors 1124, 1126 rotate with common upper arm 1114. Similarly, simultaneous rotation of common link 1114, pulleys 1230, 1238 and 1252 with counter rotation of pulley 1234 cause end effectors 1124, 1126 to extend or retract while end effectors 1130, 1132 rotate with common upper arm 1114. Further, relative rotation of pulley 1238 will cause a corresponding relative rotation of end effectors 1132, 1126. Similarly, relative rotation of pulley 1252 will cause a corresponding relative rotation of end effectors 1130, 1124. With the 5 rotary axis drive and arm arrangement described, 2 substrates may be independently placed at different locations as will be described in greater detail below. For example, 2 substrates supported on end effectors 1130, 1132 may be independently placed at two locations. Similarly, 2 substrates supported on end effectors 1124, 1126 may be independently placed at two locations. In alternate aspects, more or less arms and axis' may be provided.

Figure 18:
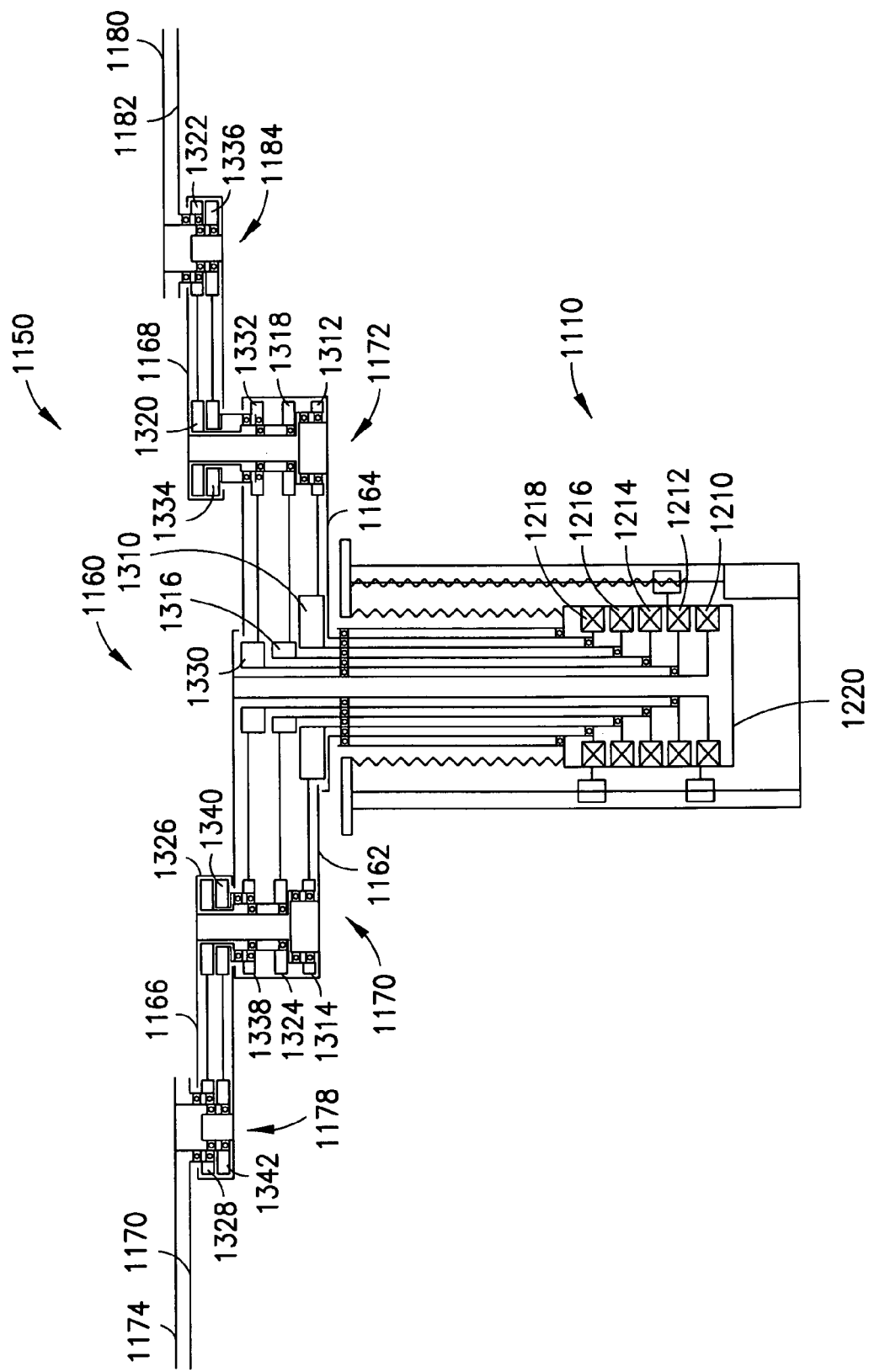
FIG. 18 is a section schematic view of an example substrate transport robot.

Referring to FIG. 18, there is shown a schematic cross section of robot 1150. Drive 1110 is shown having 5 coaxial shafts coupled to coaxial motor encoder arrangements 1210, 1212, 1214, 1216, 1218 designated as inner shafts to the outer and as described above. The shaft of drive 1218 is directly coupled to upper arm 1164. The shaft of drive 1210 is directly coupled to upper arm 1162. Here, arms 1162, 1164 are independently rotatable. The shaft of drive 1216 is directly coupled to pulley 1310 which is in turn coupled by bands to pulley 1312 in elbow 1172 where pulley 1312 is directly coupled to forearm 1168. Here rotation of motor 1216 rotates forearm 1168 about the elbow 1172. Pulley 1310 which is then coupled by bands to pulley 1314 in elbow 1170 where pulley 1314 is directly coupled to forearm 1166. Here rotation of motor 1216 rotates forearm 1166 about the elbow 1170. Further, rotation of motor 1216 simultaneously rotates both forearms 1168, 1166 about their respective elbows 1172, 1170. The shaft of drive 1214 is directly coupled to pulley 1316 which is in turn coupled by bands to pulley 1318 in elbow 1172 where pulley 1318 is directly coupled to pulley 1320 in elbow 1172. Pulley 1320 is then coupled by bands to pulley 1322 in wrist 1184 where pulley 1322 is directly coupled to lower end effector 1182. Here, rotation of motor 1214 rotates lower end effector 1182 about the wrist 1184. Similarly, pulley 1310 is also coupled by bands to pulley 1324 in elbow 1170 where pulley 1324 is directly coupled to pulley 1326 in elbow 1170. Pulley 1326 is then coupled by bands to pulley 1328 in wrist 1178 where pulley 1328 is directly coupled to lower end effector 1176. Here, rotation of motor 1214 rotates lower end effector 1176 about the wrist 1178. Further, rotation of motor 1214 simultaneously rotates both lower end effectors 1176, 1182 about their respective wrists 1178, 1184. The shaft of drive 1212 is directly coupled to pulley 1330 which is in turn coupled by bands to pulley 1332 in elbow 1172 where pulley 1332 is directly coupled to pulley 1334 in elbow 1172. Pulley 1334 is then coupled by bands to pulley 1336 in wrist 1184 where pulley 1336 is directly coupled to upper end effector 1180. Here, rotation of motor 1212 rotates upper end effector 1180 about the wrist 1184. Similarly, pulley 1330 is also coupled by bands to pulley 1338 in elbow 1170 where pulley 1338 is directly coupled to pulley 1340 in elbow 1170. Pulley 1340 is then coupled by bands to pulley 1342 in wrist 1178 where pulley 1242 is directly coupled to upper end effector 1174. Here, rotation of motor 1212 rotates upper end effector 1174 about the wrist 1178. Further, rotation of motor 1212 simultaneously rotates both upper end effectors 1174, 1180 about their respective wrists 1178, 1184. The shafts associated with drives 1210, 1212, 1214, 1216, 1218 are each independently and coaxially rotatable and may be supported by any suitable bearing or other arrangement with respect to housing 1220 as shown or otherwise. The three pulleys in each of elbows 1170, 1172 and the two pulleys in each of wrists 1178, 1184 are each independently and coaxially rotatable with respect to a common axis in each joint and may be supported by any suitable bearing or other arrangement as shown or otherwise. The following description of respective pulley ratios is based on the premise that the link lengths of each link are the same. In alternate aspects, different ratios or driving arrangement may be provided, for example, where the link lengths are different. An example of arms having unequal link lengths and driven by non circular pulleys is given in U.S. patent application Ser. No. 13/833,732 entitled "Robot having Arm with Unequal Link Lengths" filed Mar. 15, 2013 which is incorporated by reference herein in its entirety. In the embodiment shown, pulleys and bands are provided. In alternate embodiments, any suitable power transmission arrangement may be provided, for example, belts, links, gears, cable or any suitable arrangement. In the embodiment shown, 5 coaxial direct driving shafts are provided. In alternate embodiments, any suitable driving arrangement may be provided, for example, motors in joints, links, speed reducers, belts, magnetic couplings, linear and/or rotational drives or any suitable drive may be provided. In the embodiment shown, the ratio between pulleys 1310, 1312 and 1310, 1314 may be any suitable ratio, for example, 2:1. In the embodiment shown, the ratio between pulleys 1238, 1240 and 1238, 1246 may be any suitable ratio, for example, 1:3 or higher or lower than 1:3. In the embodiment shown, the ratio between pulleys 1316, 1318 and 1316, 1324 may be any suitable ratio, for example, 1:1. In the embodiment shown, the ratio between pulleys 1320, 1322 and 1326, 1328 may be any suitable ratio, for example, 1:1. In the embodiment shown, the ratio between pulleys 1334, 1336 and 1340, 1342 may be any suitable ratio, for example, 1:1. In operation, simultaneous rotation of all of drives 1210, 1212, 1214, 1216, 1218 rotates the entire arm assembly. Rotation of upper arm 1164 while holding pulleys 1310, 1316, 1330 and upper arm 1162 stationary cause end effectors 1180, 1182 to extend or retract while end effectors 1174, 1176 remain stationary. Similarly, rotation of upper arm 1162 while holding pulleys 1310, 1316, 1330 and upper arm 1164 stationary cause end effectors 1174, 1176 to extend or retract while end effectors 1180, 1182 remain stationary. Further, relative rotation of pulley 1316 will cause a corresponding relative rotation of end effectors 1182, 1176. Similarly, relative rotation of pulley 1330 will cause a corresponding relative rotation of end effectors 1180, 1174. With the 5 rotary axis drive and arm arrangement described, 2 substrates may be independently placed at different locations as will be described in greater detail below. For example, 2 substrates supported on end effectors 1180, 1182 may be independently placed at two locations. Similarly, 2 substrates supported on end effectors 1174, 1176 may be independently placed at two locations. In alternate aspects, more or less arms and axis' may be provided.

Vacuum robots disclosed herein may be provided within the vacuum chamber of transport platform and may have features as disclosed in U.S. patent application having Ser. No. 13/618,067 entitled "Robot Drive with Passive Rotor" and filed Sep. 14, 2012. Further, vacuum robots may be provided within the vacuum chamber of a platform and may have features as disclosed in U.S. patent application having Ser. No. 13/618,117 entitled "Low Variability Robot" and filed Sep. 14, 2012. Further, vacuum robots may be provided within the a vacuum chamber of a platform and may have features as disclosed in U.S. patent application having Ser. No. 13/833,732 entitled "Robot Having Arm With Unequal Link Lengths" and filed Mar. 15, 2013. Further, vacuum robots may be provided within the vacuum chamber of a platform and may have features as disclosed in U.S. patent applications having Ser. No. 61/831,320 entitled "Robot and Adaptive Placement System and Method" and filed Jun. 5, 2013. All of the above referenced applications are hereby incorporated by reference herein in their entirety.

Figure 19:
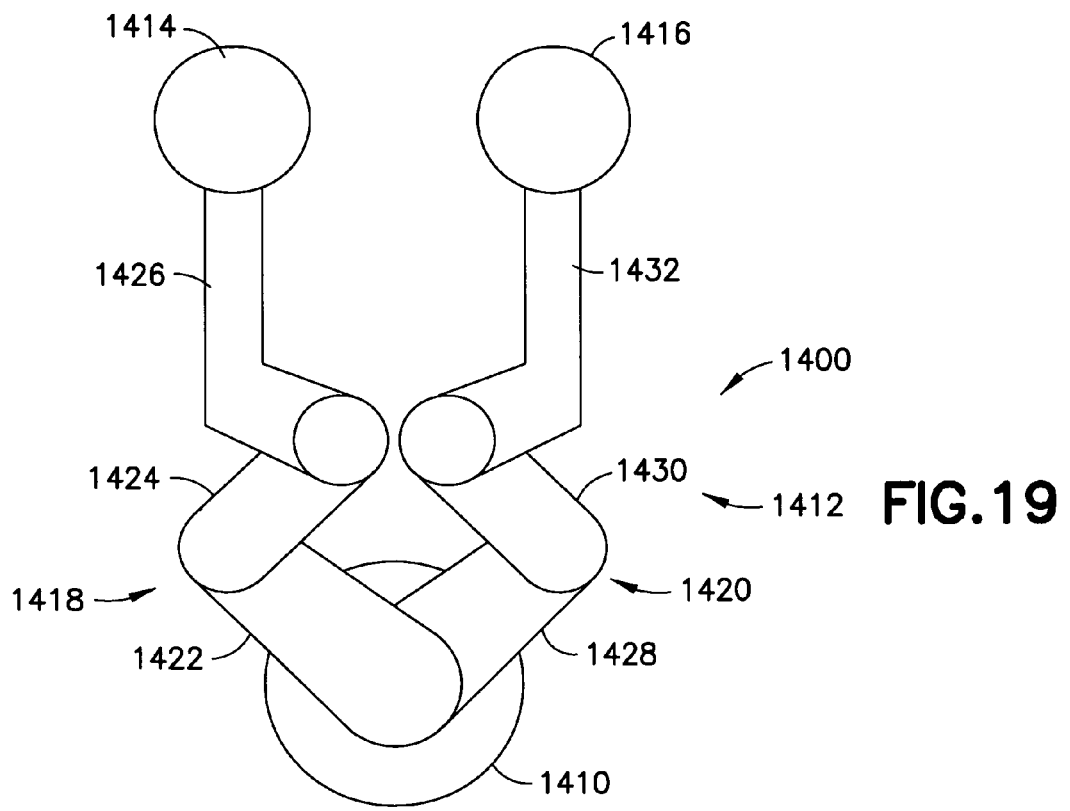
FIG. 19 is a top view of an example substrate transport robot.
Figure 20:
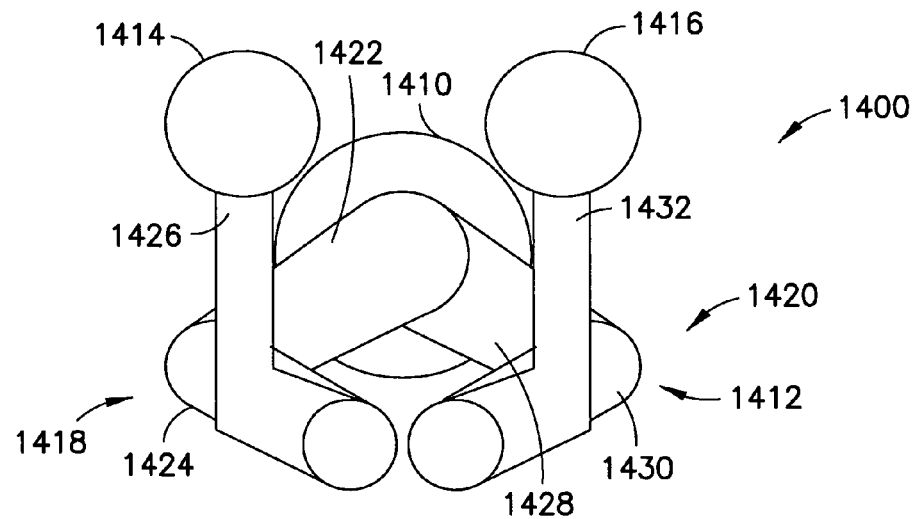
FIG. 20 is a top view of an example substrate transport robot.

Referring now to FIG. 19, there is shown a top view of an example substrate transport robot 1400 in an extended position. Referring also to FIG. 20, there is shown a top view of an example substrate transport robot 1400 in a retracted position. Robot 1400 has arm 1412 having independently operable arms 1420, 1418 such that substrates 1416, 1414 may be independently position detected and placed at two stations independently. Arms 1420 and 1418 are coupled to drive 1410 as will be described in greater detail below. Arm 1420 has upper arm 1428 coupled to forearm 1430 by an elbow axis. Forearm 1430 is coupled to end effector 1432 by a wrist axis. End effector 1432 supports substrate 1416. Similarly, arm 1418 has upper arm 1422 coupled to forearm 1424 by an elbow axis. Forearm 1424 is coupled to end effector 1426 by a wrist axis. End effector 1426 supports substrate 1414. Arms 1420, 1418 are independently driven, each by a two axis drive such that substrates 1414, 1416 may be independently picked and/or placed.

Figure 21:
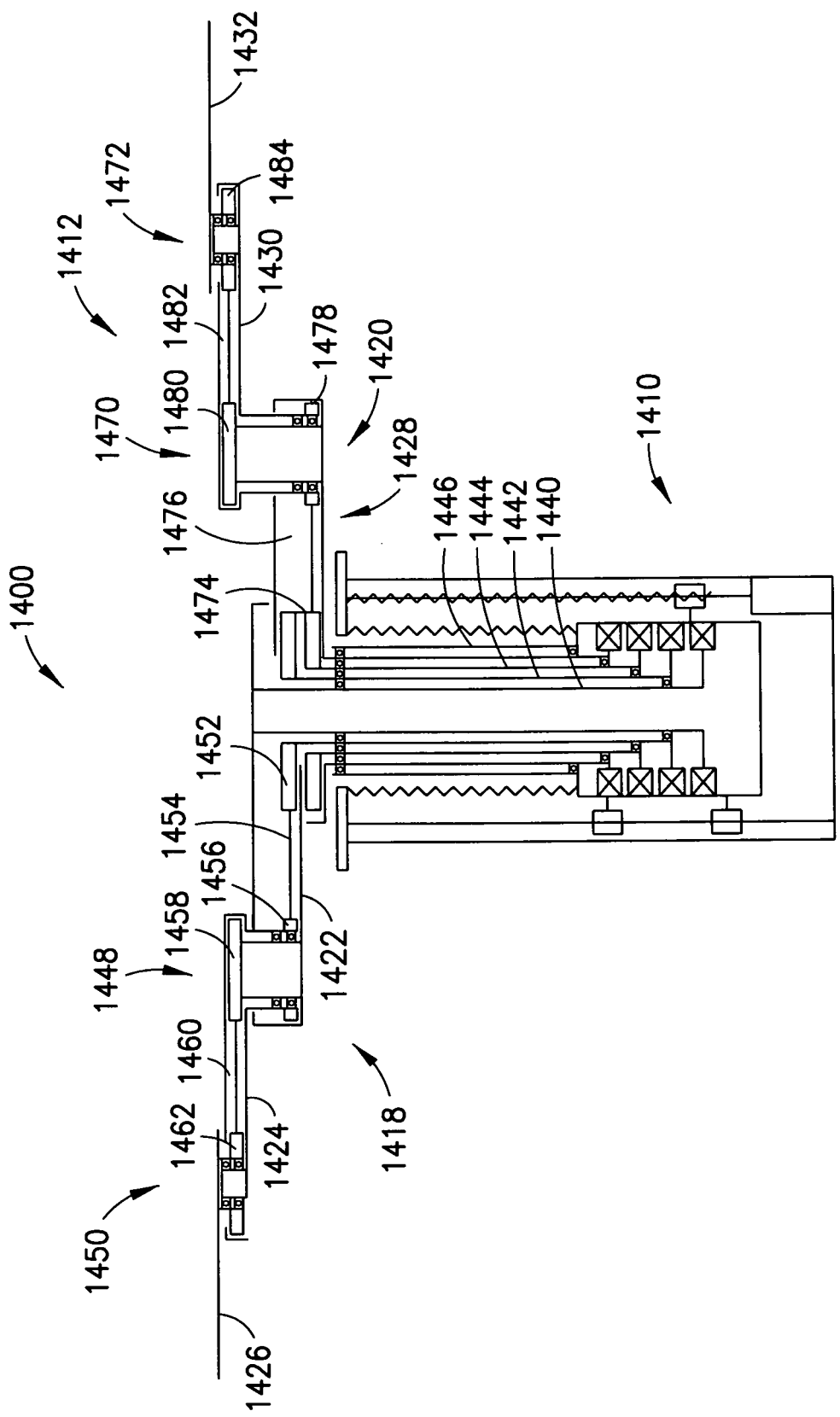
FIG. 21 is a section schematic view of an example substrate transport robot.

Referring now to FIG. 21, there is shown a section schematic view of an example substrate transport robot 1400. Arm 1420 is coupled to drive 1410 via shafts 1444, 1446. Arm 1418 is coupled to drive 1410 via shafts 1440, 1442. The shafts may be directly driven by motors or any suitable method and may have position encoders to feed position to a controller. Arm 1420 has shaft 1446 coupled to upper arm 1428. Upper arm 1428 is coupled to forearm 1430 by an elbow axis 1470. Forearm 1430 is coupled to end effector 1432 by a wrist axis 1472. End effector 1432 supports substrate 1416. Shaft 1444 is coupled to shoulder pulley 1474 where shoulder pulley 1474 is coupled to elbow pulley 1478 via band 1476 and where elbow pulley 1478 is coupled to forearm 1430. Elbow pulley 1480 is coupled to upper arm 1428 where elbow pulley 1480 is further coupled to wrist pulley 1484 via band 1486. Wrist pulley 1484 is further coupled to end effector 1432. Here, the combination of links, pulleys and bands cooperates with driving shafts 1444, 1446 such that via rotation of driving shafts 1444, 1446 the end effector 1432 of arm 1420 may be independently positioned. Arm 1418 has shaft 1440 coupled to upper arm 1422. Upper arm 1422 is coupled to forearm 1424 by an elbow axis 1448. Forearm 1424 is coupled to end effector 1426 by a wrist axis 1450. End effector 1426 supports substrate 1414. Shaft 1442 is coupled to shoulder pulley 1452 where shoulder pulley 1452 is coupled to elbow pulley 1456 via band 1454 and where elbow pulley 1456 is coupled to forearm 1424. Elbow pulley 1458 is coupled to upper arm 1424 where elbow pulley 1458 is further coupled to wrist pulley 1462 via band 1460. Wrist pulley 1462 is further coupled to end effector 1426. Here, the combination of links, pulleys and bands cooperates with driving shafts 1440, 1442 such that via rotation of driving shafts 1440, 1442 the end effector 1426 of arm 1418 may be independently positioned.

Figure 22:
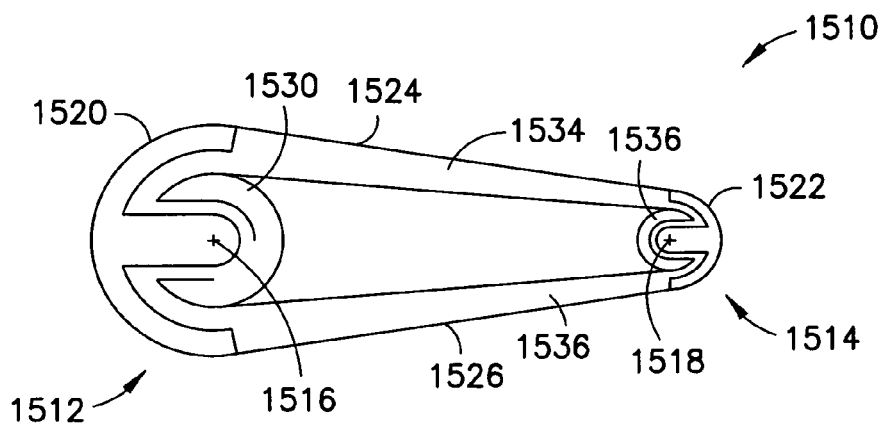
FIG. 22 is a top schematic view of an exemplary link apparatus.

Referring now to FIG. 22, there is shown a top schematic view of an exemplary link apparatus 1510. Exemplary link apparatus 1510 is shown where two pulley pairs may be provided within a link with small relative rotation between them. Here, the two pulley pairs may have bands that share a common elevation such that link depths may be made similar to that where a single pulley pair is located within a given link. Here, respective pulleys have surfaces that engage their respective bands over a length or range of operation and further are relieved such that a corresponding coaxial pulley of the other pulley pair may occupy substantially the same elevation. Here, axis 1512 may have coaxial 1516 pulleys 1520, 1530 that substantially occupy the same elevation as being relieved as shown. Similarly, axis 1514 may have coaxial 1518 pulleys 1522, 1532 that substantially occupy the same elevation as being relieved as shown. Here, pulley 1520 is coupled to pulley 1522 with bands 1524 and 1526. Similarly, pulley 1530 is coupled to pulley 1532 with bands 1534 and 1536. In the embodiment shown, any suitable pulleys may be used, for example, circular, non circular or otherwise. In the embodiment shown, any suitable ratio between the pulleys may be used, fixed, variable or otherwise. In alternate aspects, any suitable linkage may be utilized in substantially similar elevations to drive concentric or non concentric axis, for example, solid links and bearings, flexures or any suitable linkage.

Figure 23:
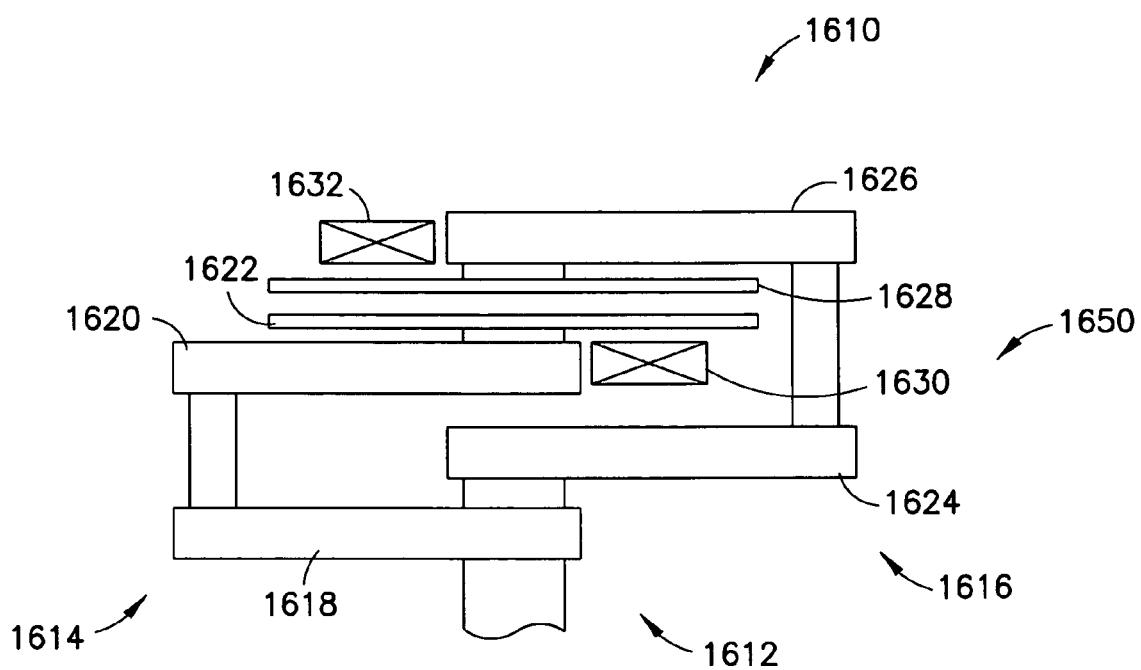
FIG. 23 is a side schematic view of an exemplary linkage apparatus.

Referring now to FIG. 23, there is shown a side schematic view of an exemplary linkage apparatus 1610. Here, apparatus 1610 has drive unit 1612 coupled to arms 1614, 1616 respectively. Here, arms 1614, 1616 may be any suitable arm or linkage. Arm 1614 may have shafts of drive 1612 coupled to upper arm 1618 with upper arm 1618 coupled to forearm 1620 and with forearm 1620 coupled to end effector 1622. A secondary driving device 1630 may be positioned coupled to or within any link, axis or end effector, for example, coupled to end effector 1622 and positioned in the unused space as shown. Drive 1630 may control any suitable axis within arm 1614 or alternately may control one or more end effector(s) independently or one or more wafer support(s) independently. Similarly, arm 1616 may have shafts of drive 1612 coupled to upper arm 1624 with upper arm 1624 coupled to forearm 1626 and with forearm 1626 coupled to end effector 1628. A secondary driving device 1632 may be positioned coupled to or within any link, axis or end effector, for example, coupled to end effector 1628 and positioned in the unused space as shown. Drive 1632 may control any suitable axis within arm 1616 or alternately may control one or more end effector(s) independently or one or more wafer support(s) independently. By way of example, in one aspect, a single or multiple secondary drive unit(s) may be positioned within one or more links, for example, in a linkage as shown in FIG. 15 or FIG. 16 or otherwise to drive rotation or relative rotation of one or more end effector(s). Accordingly, these and all such variations may be provided.

Figure 24:
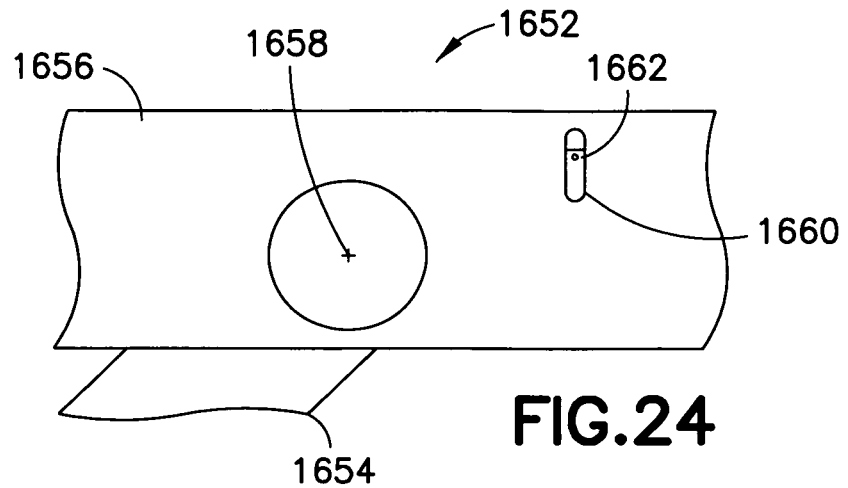
FIG. 24 is a top schematic view of an exemplary wrist apparatus.
Figure 25:
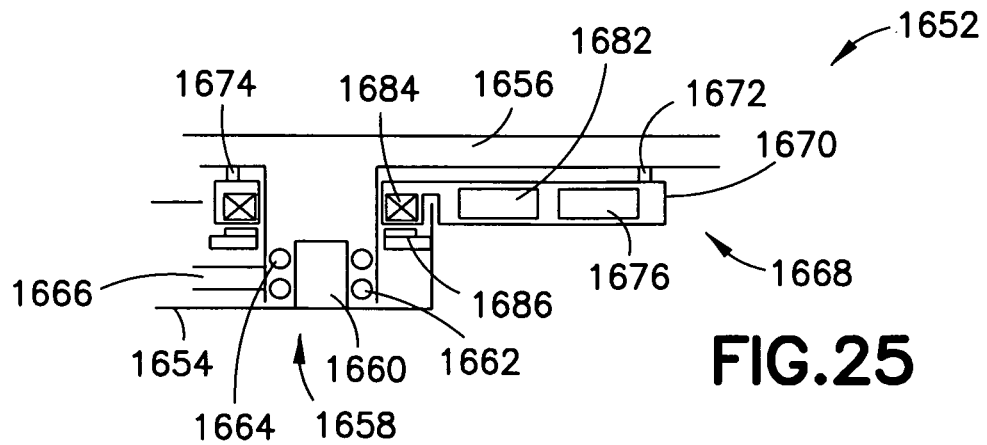
FIG. 25 is a side section schematic view of an exemplary wrist apparatus.
Figure 26:
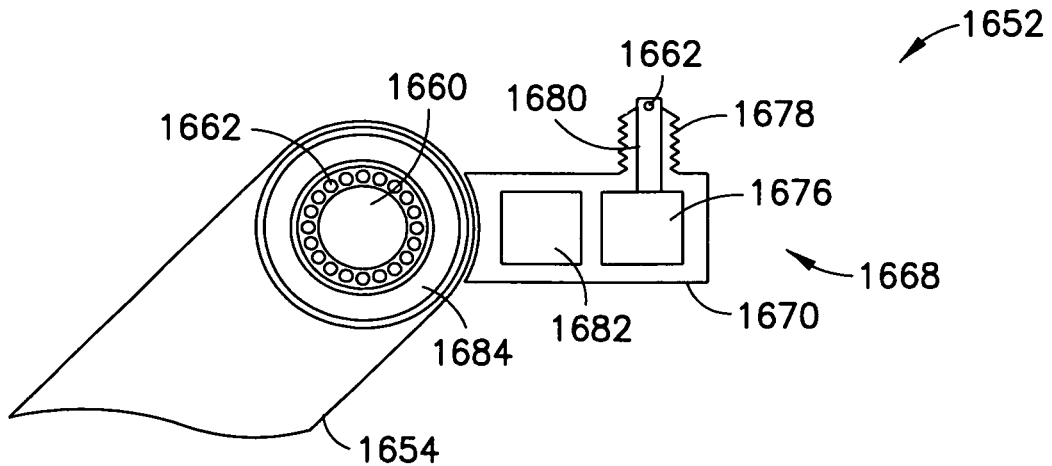
FIG. 26 is a top section schematic view of an exemplary wrist apparatus.

Referring now to FIG. 24, there is shown a top schematic view of an exemplary wrist apparatus 1652. Referring also to FIG. 25, there is shown a side section schematic view of an exemplary wrist apparatus 1652. Referring also to FIG. 26, there is shown a top section schematic view of an exemplary wrist apparatus 1652. Wrist apparatus 1652 is provided with link 1654 coupled to end effector apparatus 1656 via wrist axis 1658. Here, by way of example only, band 1666 may drive pulley 1664 where pulley 1664 is coupled to end effector 1656 by bearing 1662 on post 1660 of wrist axis 1658. Exemplary secondary actuator 1668 is further shown coupled to end effector 1656. Secondary actuator 1668 may be coupled to end effector 1656 by coupling members 1672, 1674 where coupling members 1672, 1674 may be any suitable coupling member, solid or compliant or otherwise. Coupling members 1672, 1674 may further be provided to thermally isolate actuator 1668 from end effector 1656. In alternate embodiments the secondary actuator may be coupled to any member, link or otherwise. In the embodiment shown, secondary actuator 1668 is a single axis device. In alternate aspects, any suitable number of axis may be provided. In the embodiment shown, secondary actuator 1668 is a linear single axis device. In alternate aspects, any suitable type of axis may be provided, for example, linear, rotary or otherwise. Here the axis may have any suitable driver such as brushless, stepping or any suitable motor. Further, the axis may have any suitable power transmission, for example, lead screw, harmonic drive, brake or any suitable power transmission. Further, the axis may have any suitable feedback device such as a position encoder, homing flag or other suitable position detection device. Secondary actuator 1668 may have housing 1670, actuator 1676 and control portion 1682. Secondary actuator 6168 may be supplied power from a harness to the robot drive or may harvest power from relative motion, for example, relative motion of end effector 1656 and link 1654 or relative motion of any suitable components within the arm robot drive or otherwise. Here, magnets 1686 may be coupled to link 1654 and winding 1684 may be coupled to housing 1670. Relative motion may generate current within the winding 1684 where control portion 1682 may have power circuitry to harvest the energy, for example, rectifier, power conditioning circuitry, DC-DC converter, battery or capacitive power storage and charge and discharge circuitry. Control portion 1682 may further have a processor, memory servo or stepper amplification and feedback circuitry, communication interface circuitry, for example, optical, wireless or wire based communication interface circuitry. Control portion 1682 may further have any suitable circuitry, for example analog or digital I/O, temperature and over temperature detection circuitry, vibration detection circuitry or any suitable circuitry. Control portion 682 may drive a servo or stepper motor 1676 having a lead screw 1680 driving pin 1662 in slot 1660 of end effector 1656. The pin may drive any suitable member, for example, an end effector, flexure or otherwise. Here, the actuator 1676 may be locking such that power may be removed when not in operation to minimize the need for heat dissipation. The components of actuator 1668 may be sealed within housing 1670 and interface with end effector 1656 with bellows 1678 allowing for linear motion translation. Alternately, the components may be potted within or thermally coupled to housing 1670. Housing 1670 may be provided with a high emissivity material or coating such that maximum heat may be radiated from housing 1670 to dissipate heat from the components within housing 1670.

Figure 27:
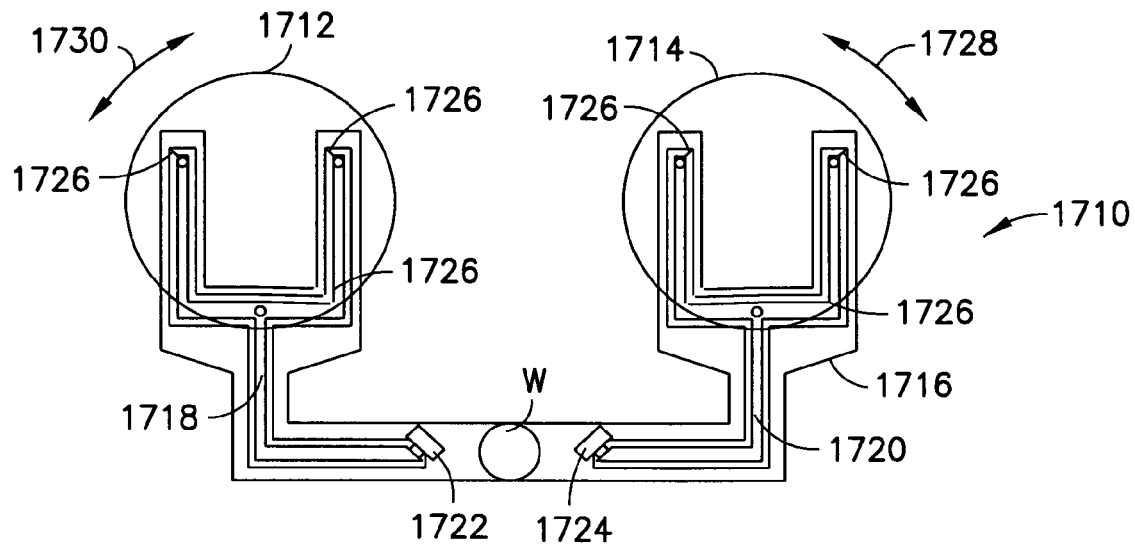
FIG. 27 is a top schematic view illustrating an example end effector apparatus.

Referring now to FIG. 27, there is shown a top schematic view illustrating an example end effector apparatus 1710 coupled to wrist W. End effector 1710 supports substrates 1712, 1714 relative to the end effector frame 1716. Mounted to the frame by flexures 1726 are moveable substrate supports 1718, 1720 that are relatively moveable in orthogonal directions 1730, 1728. In alternate aspects, the supports may be relatively moveable in any direction, orthogonal or otherwise. Secondary actuators 1722, 1724 are coupled to frame 1716 and selectively move supports 1718, 1720 respectively. Secondary actuators 1722, 1724 may be as described or any suitable actuator.

Figure 28:
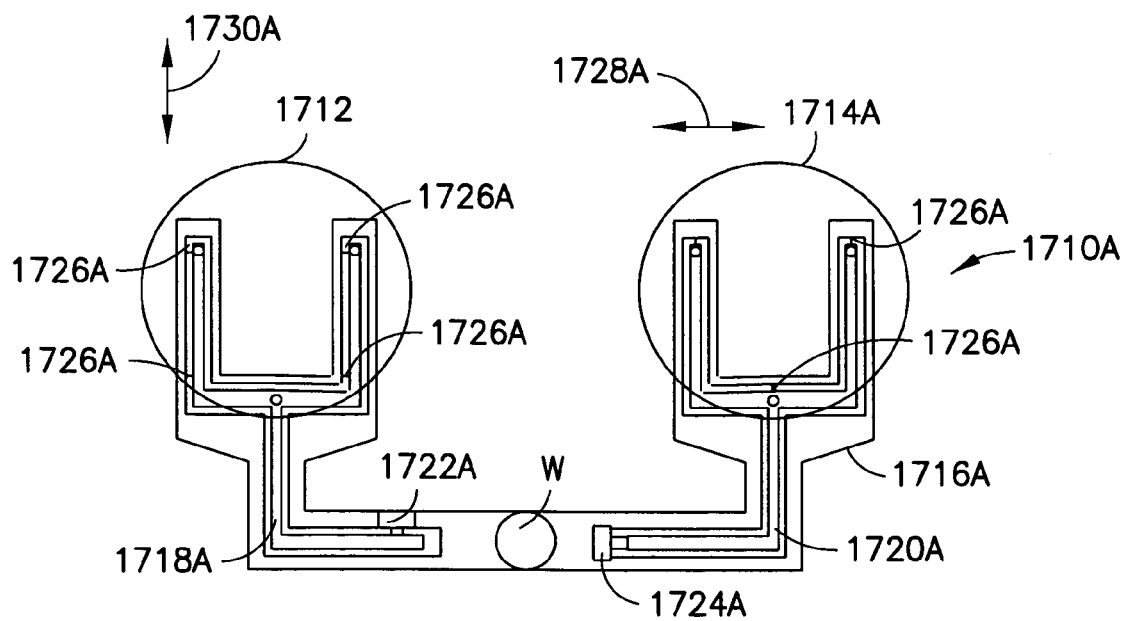
FIG. 28 is a top schematic view illustrating an example end effector apparatus.

Referring now to FIG. 28, there is shown a top schematic view illustrating an example end effector apparatus 1710A. End effector 1710A supports substrates 1712, 1714 relative to the end effector frame 1716A. Mounted to the frame by flexures 1726A are moveable substrate supports 1718A, 1720A that are relatively moveable in orthogonal directions 1730A, 1728A. In alternate aspects, the supports may be relatively moveable in any direction, orthogonal or otherwise. Secondary actuators 1722A, 1724A are coupled to frame 1716A and selectively move supports 1718A, 1720A respectively. Secondary actuators 1722A, 1724A may be as described or any suitable actuator.

Figure 29:
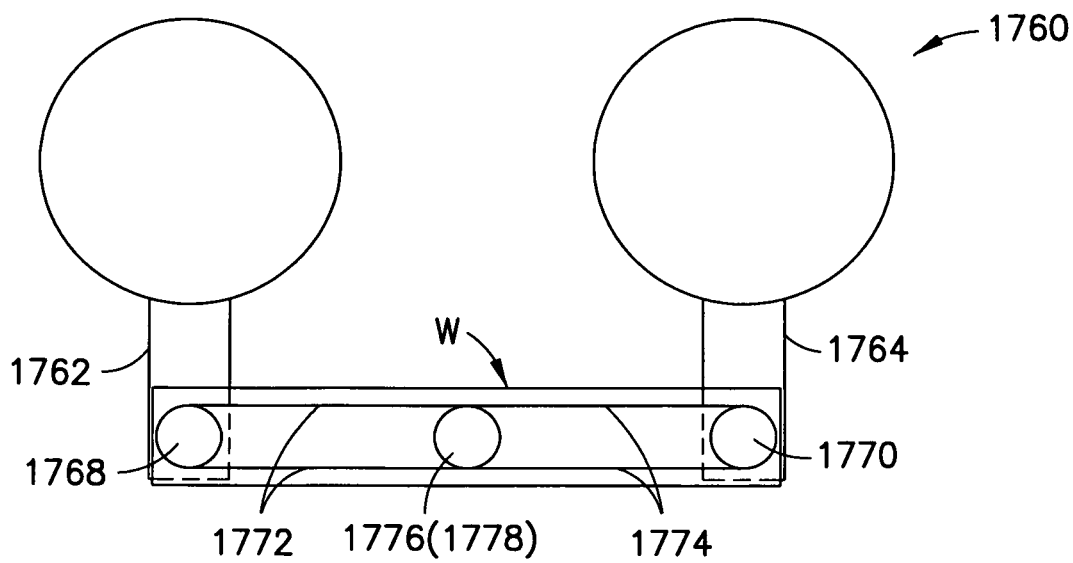
FIG. 29 is a top schematic view illustrating an example end effector apparatus.

Referring now to FIG. 29, there is shown a top schematic view illustrating an example end effector apparatus 1760. End effector 1760 has a stationary link coupled to wrist W with two rotary driven axis 1776, 1778 coupled to the wrist, arm or otherwise. Rotationally moveable wafer supports 1762, 1764 are rotationally coupled to the stationary link at pivot axis 1760, 1770 respectively. Bands 1776, 1778 (with pulleys) couple rotational drives 1776, 1778 to links 1762, 1764 such that links 1762, 1764 may be selectively rotated. In alternate aspects, any suitable arrangement may be provided, for example, rotational drives 1776, 1778 may directly drive supports 1760, 1770 where no stationary link need be provided.

Figure 30:
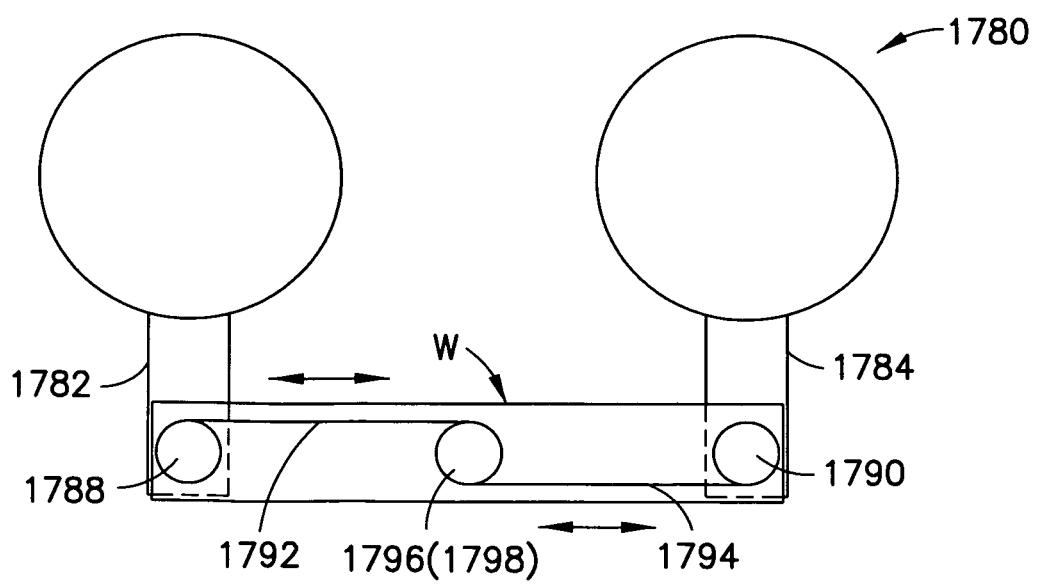
FIG. 30 is a top schematic view illustrating an example end effector apparatus.

Referring now to FIG. 30, there is shown a top schematic view illustrating an example end effector apparatus 1780. End effector 1780 has a stationary link coupled to wrist W with two rotary driven axis 1796, 1798 coupled to the wrist, arm or otherwise. Rotationally moveable wafer supports 1782, 1784 are rotationally coupled to the stationary link at pivot axis 1788, 1790 respectively. Links 1792, 1794 couple rotational drives 1796, 1798 to supports 1782, 1784 such that supports 1782, 1784 may be selectively rotated. In alternate aspects, any suitable arrangement may be provided, for example, rotational drives 1796, 1798 may directly drive supports 1782, 1784 where no stationary link need be provided.

Figure 31:
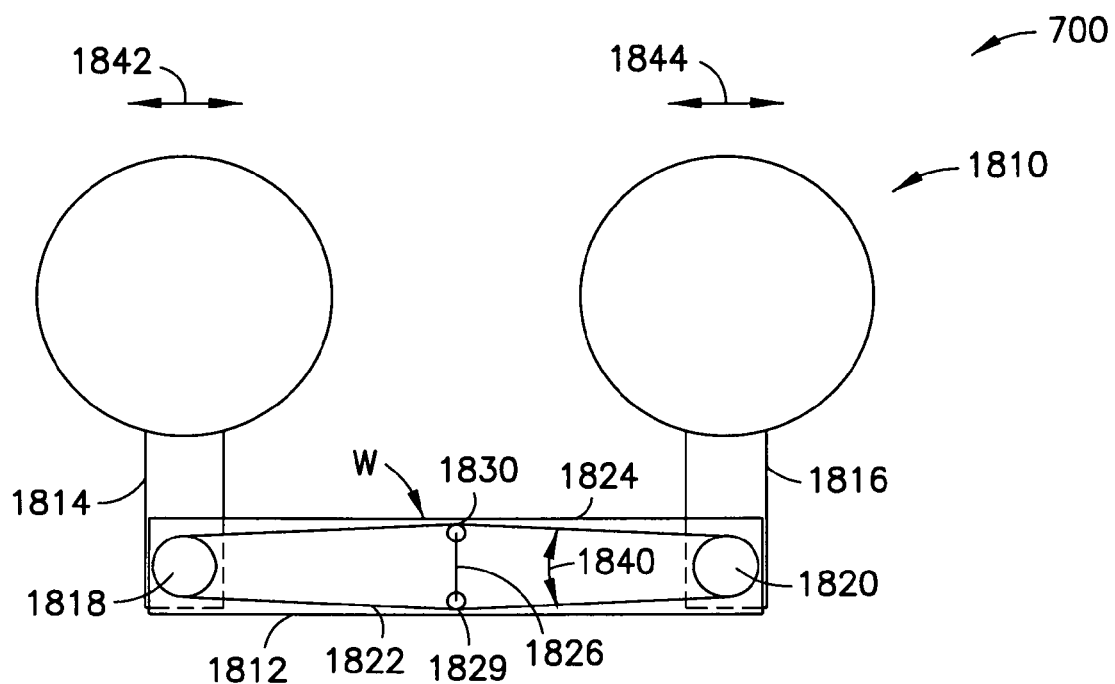
FIG. 31 is a top schematic view illustrating an example end effector apparatus.

Referring now to FIG. 31, there is shown a top schematic view illustrating an example end effector apparatus 1810. End effector 1810 has a stationary link 1812 coupled to wrist W with one or two driven axis 1826 coupled to the wrist, arm or otherwise. Rotationally moveable wafer supports 1814, 1816 are rotationally coupled to the stationary link 1812 pivot axis 1818, 1820 respectively. Bands 1822, 1824 couple rotational drives 1828, 1830 to supports 1814, 1816 such that supports 1814, 1816 may be selectively rotated 1842, 1844. Here, translation 1840 of drive 1826 selectively rotates links 1814, 1816 in opposite directions. Rotation of drive 1826 selectively rotates links 1814, 1816 in same directions. In alternate aspects, any suitable arrangement may be provided, for example, rotational drives 1828, 1830 may directly drive supports 1814, 1816 where no stationary link need be provided.

Figure 32:
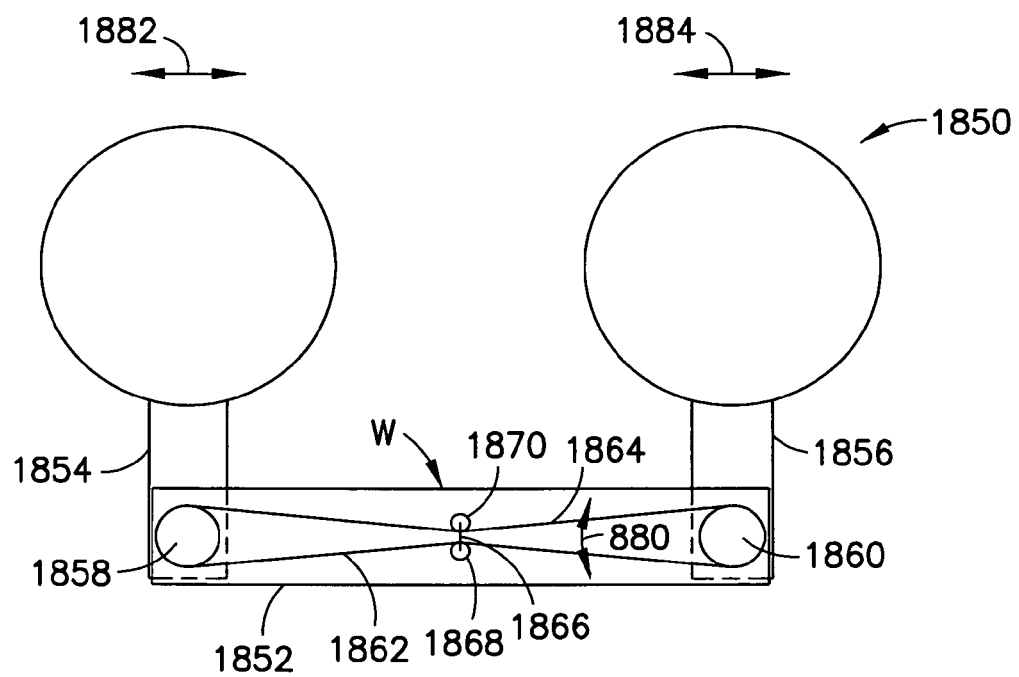
FIG. 32 is a top schematic view illustrating an example end effector apparatus.

Referring now to FIG. 32, there is shown a top schematic view illustrating an example end effector apparatus 1850. End effector 1850 has a stationary link 1852 coupled to wrist W with one or two driven axis 1866 coupled to the wrist, arm or otherwise. Rotationally moveable wafer supports 1854, 1856 are rotationally coupled to the stationary link 1852 by pivot axis 1858, 1860 respectively. Bands 1862, 1864 couple rotational drives 1868, 1870 to supports 1854, 1856 such that supports 854, 856 may be selectively rotated 882, 884. Here, translation 1880 of drive 1866 selectively rotates links 1854, 1856 in opposite directions. Rotation of drive 1866 selectively rotates links 1854, 1856 in same directions. In alternate aspects, any suitable arrangement may be provided, for example, rotational drives 868, 870 may directly drive supports 1854, 1856 where no stationary link need be provided.

Figure 33:
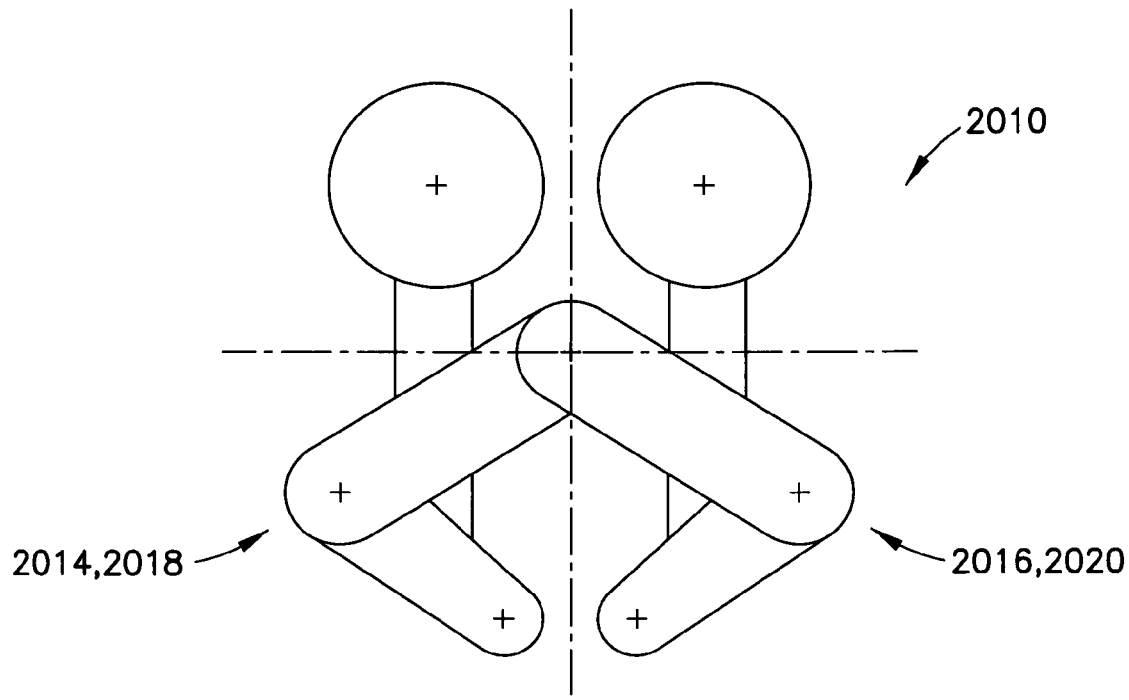
FIG. 33 shows a top view of a robot.
Figure 34:
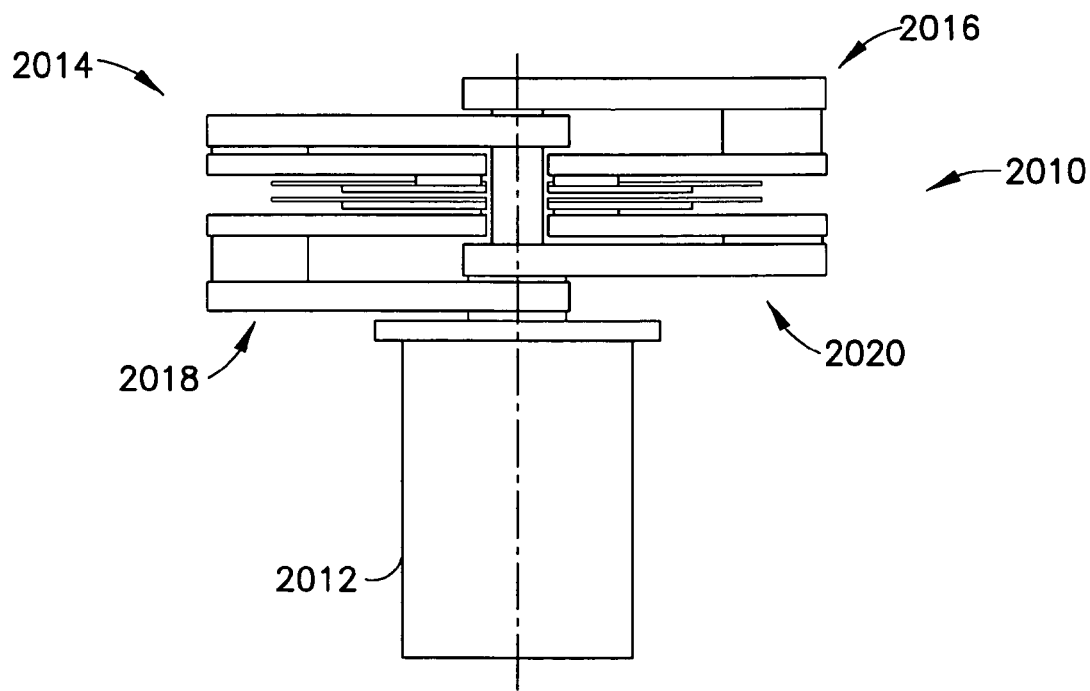
FIG. 34 shows a side view of a robot.

Referring to FIG. 33, there is shown a schematic top plan view of an example substrate transport robot 2010. Although the present embodiment will be described with reference to the embodiments shown in the drawings, it should be understood that the present invention may be embodied in many forms of alternative embodiments. In addition, any suitable size, shape or type of materials or elements could be used. Referring also to FIG. 34, there is shown a side view of robot 2010. Exemplary robot 2010 is shown having drive portion 2012, first driven arm 2012, second driven arm 2014, third driven arm 2016 and fourth driven arm 2018. Robot 2010 having drive and driven arms may have features as disclosed in PCT/US2014/011416 having an international filing date of Jan. 14, 2014 and entitled "Robot having Arm With Unequal Link Lengths" which is hereby incorporated by reference herein in its entirety. Further, Robot 2010 having drive and driven arms may have features and may take advantage of features as disclosed. In the embodiment shown, each of the driven arms has upper arms coupled to the drive at a shoulder joint, forearms coupled to the upper arms at an elbow joint and an end effector coupled to the forearm at a wrist joint. The embodiment shown in FIG. 34 has the fore arms of arms 2014, 2016 located below their respective upper arms. In alternate aspects, one or both of the fore arms of arms 2014, 2016 may be located above their respective upper arms. The embodiment shown in FIG. 34 has the fore arms of arms 2018, 2020 located above their respective upper arms. In alternate aspects, one or both of the fore arms of arms 2018, 2020 may be located below their respective upper arms.

Figures 35A, 35B, 35C:
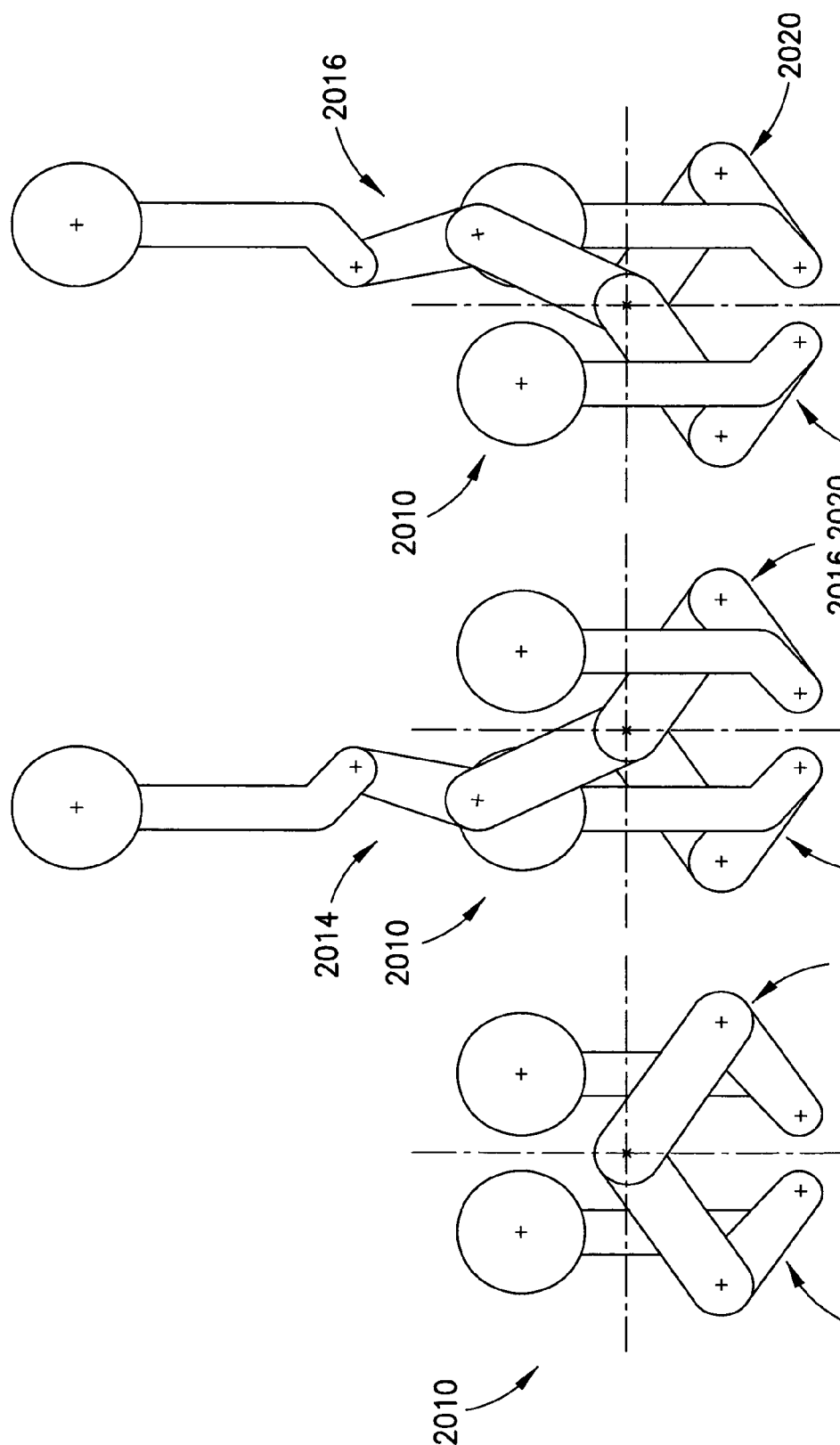
FIG. 35A shows a top view of a robot in a retracted position.
FIG. 35B shows a top view of a robot with a first arm extended.
FIG. 35C shows a top view of a robot with a second arm extended.

Referring now to FIG. 35a, there is shown a top view of robot 2010 in a retracted position. Referring also to FIG. 35b, there is shown a top view of robot 2010 with first arm 2014 extended. Referring also to FIG. 35c, there is shown a top view of robot 2010 with second arm 2016 extended. Referring also to FIG. 36a, there is shown a top view of robot 2010 in a retracted position. Referring also to FIG. 36b, there is shown a top view of robot 2010 with first and second arms 2014, 2016 extending simultaneously. Referring also to FIG. 36c, there is shown a top view of robot 2010 with first and second arms 2014, 2016 extended. With respect to FIGS. 37A and 37B, each of the four driven arms are moveable independently in a radial direction while each of the four driven arms are moveable dependently in a rotary or theta direction and a vertical or z direction as will be described. With respect to FIGS. 38A and 38B, each of the four driven arms are moveable independently in a radial direction while first and second of the four driven arms are moveable dependently in a rotary or theta direction and a vertical or z direction and while third and fourth of the four driven arms are moveable dependently in a rotary or theta direction and a vertical or z direction with first and second driven arms rotatable independent of the third and fourth driven arms as will be described. With respect to FIGS. 39A and 39B, each of the four driven arms are moveable independently in a radial direction while first and third of the four driven arms are moveable dependently in a rotary or theta direction and a vertical or z direction and while second and fourth of the four driven arms are moveable dependently in a rotary or theta direction and a vertical or z direction with first and third driven arms rotatable independent of the second and fourth driven arms as will be described. In alternate aspects, any suitable axis dependency may be provided.

Figure 37A:
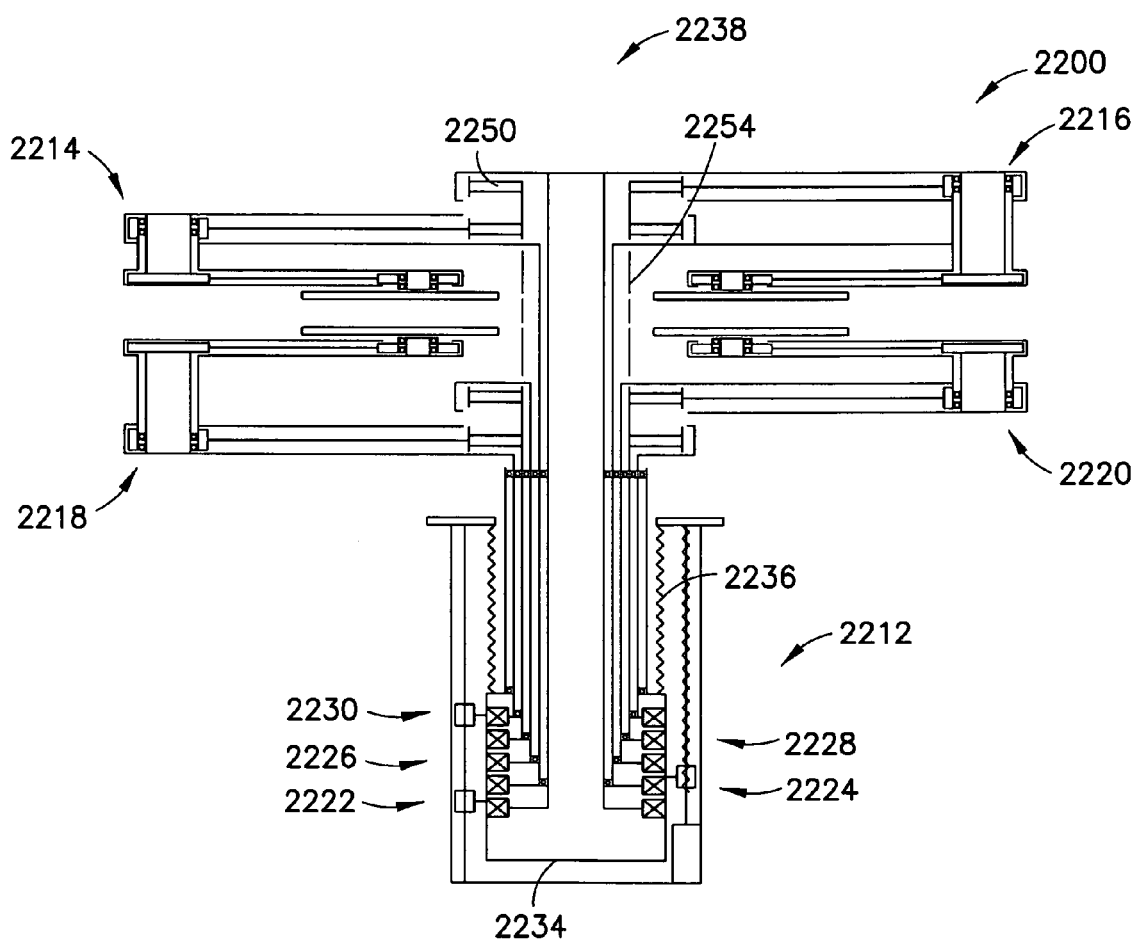
FIG. 37A shows a section schematic view of a robot.
Figure 37B:
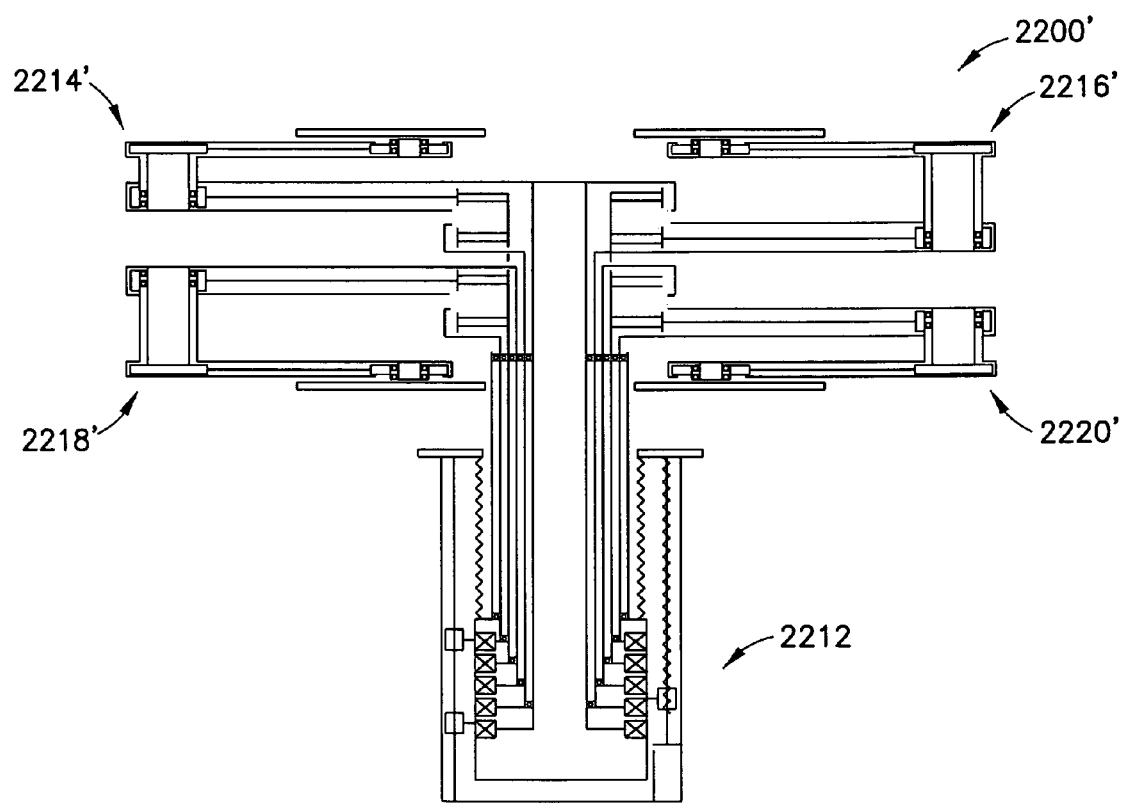
FIG. 37B shows a section schematic view of a robot.

Referring now to FIG. 37A, there is shown a section schematic view of robot 2200. Referring also to FIG. 37B, there is shown a section schematic view of robot 2200'. In the embodiment shown, each of the driven arms 2214, 2216, 2218, 2220 has upper arms coupled to the drive 2212 at a shoulder joint, forearms coupled to the upper arms at an elbow joint and an end effector coupled to the forearm at a wrist joint. The embodiment shown in FIG. 37A has the fore arms of arms 2214, 2216 located below their respective upper arms. In alternate aspects, one or both of the fore arms of arms 2214, 2216 may be located above their respective upper arms. For example, FIG. 37B shows both of the fore arms of arms 2214', 2216' located above their respective upper arms. The embodiment shown in FIG. 37A has the fore arms of arms 2218, 2220 located above their respective upper arms. In alternate aspects, one or both of the fore arms of arms 2218, 2220 may be located below their respective upper arms. For example, FIG. 37B shows both of the fore arms of arms 2218', 2220' located below their respective upper arms. FIG. 37A shows drive 2212 having 25 concentric rotary drive axis 2222, 2224, 2226, 2228, 2230. Each rotary drive axis may have a motor and encoder with a drive shaft extending from housing 2234 through bellows 2236 into vacuum or other environment 2238. In the embodiment shown, rotary drive 2230 is coupled to the upper arm of driven arm 2218; rotary drive 2228 is coupled to pulley 2250; rotary drive 2226 is coupled to the upper arm of driven arm 2220; rotary drive 2224 is coupled to the upper arm of driven arm 2214 and rotary drive 2222 is coupled to the upper arm of driven arm 2216. Pulley 2250 has 4 pulley portions that interface with corresponding forearm driving pulleys in each arm. Bridge 2254 couples the upper portion of pulley 2250 to the lower portion of pulley 2250. Bridge 2254 may have any configuration, for example, bridge 2254 may be one or more posts that passes through kidney slots in the upper arms of arms 2214 and 2220. With respect to FIGS. 37A and 37B, each of the four driven arms are moveable independently in a radial direction while each of the four driven arms are moveable dependently in a rotary or theta direction and a vertical or z direction. Here, the four driven arms are moveable independently in a radial direction due to independent rotation of axis 2230, 2226, 2224, 2222 while holding pulley axis 2228 stationary. Here, each of the four driven arms are moveable dependently in a rotary or theta direction by simultaneous rotation of axis 2222, 2224, 2226, 2228, 2230.

Figure 38A:
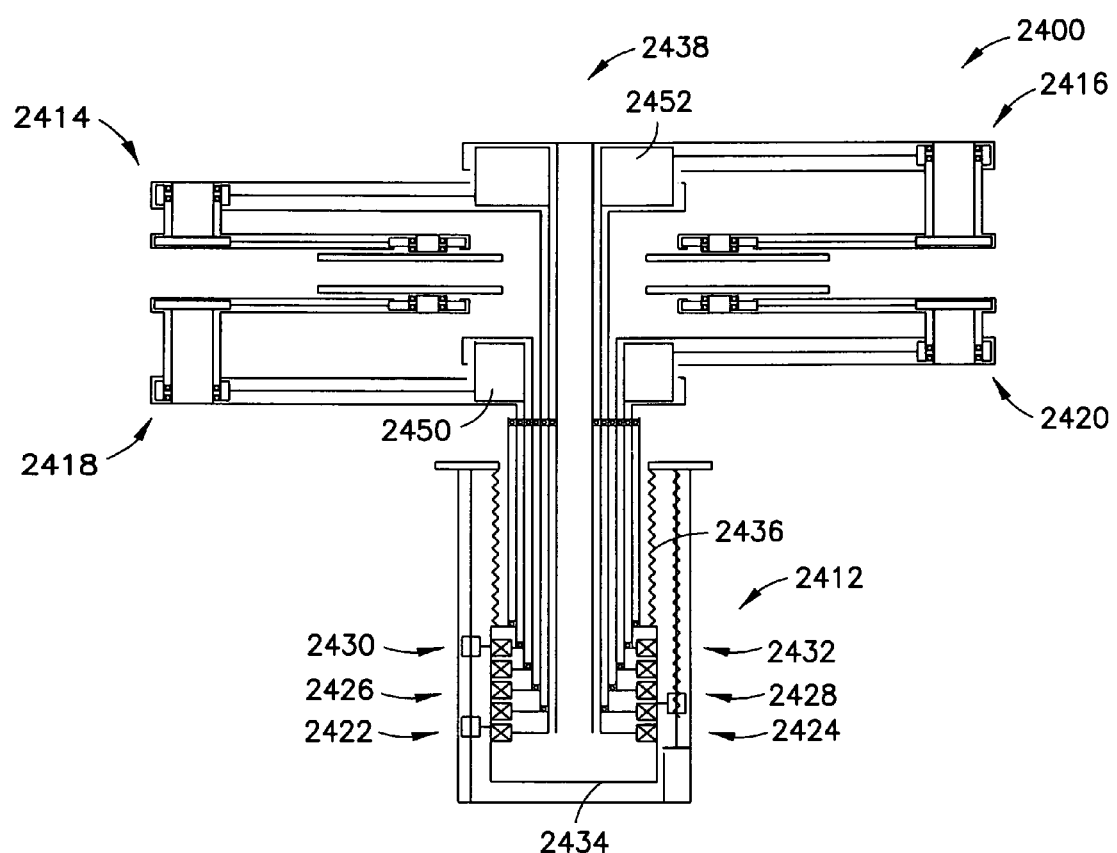
FIG. 38A shows a section schematic view of a robot.
Figure 38B:
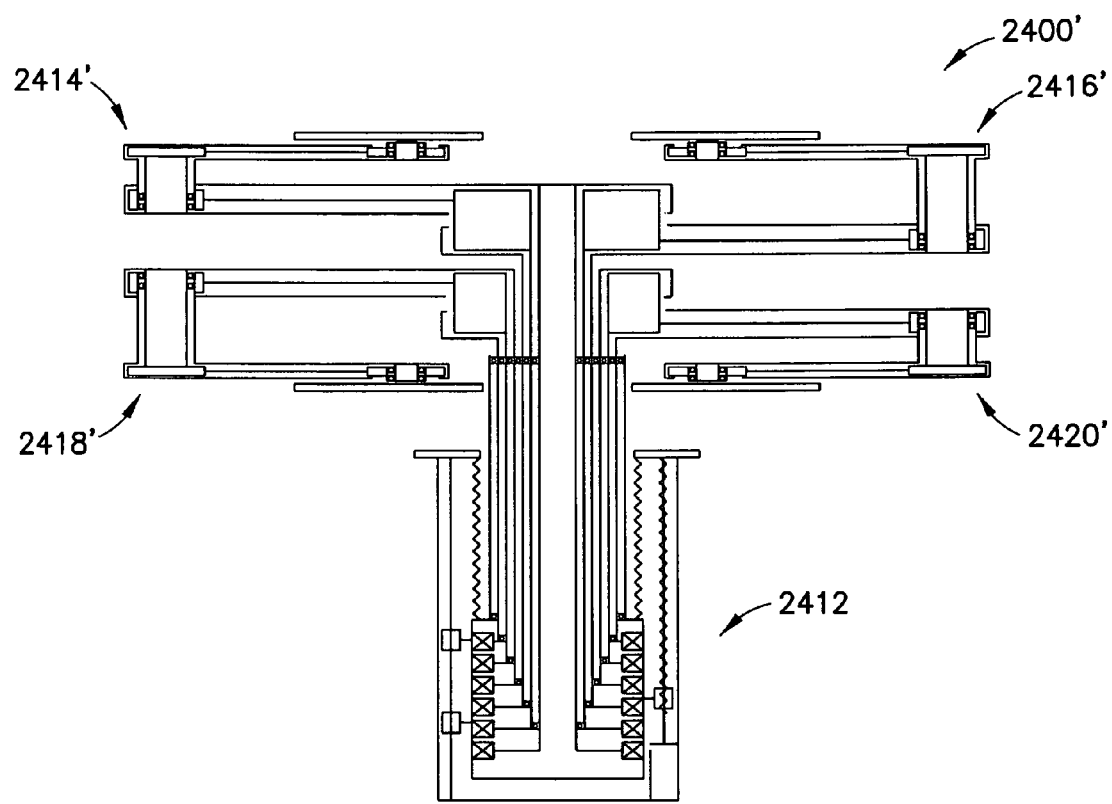
FIG. 38B shows a section schematic view of a robot.

Referring now to FIG. 38A, there is shown a section schematic view of robot 2400. Referring also to FIG. 38B, there is shown a section schematic view of robot 2400'. In the embodiment shown, each of the driven arms 2414, 2416, 2418, 2420 has upper arms coupled to the drive 2412 at a shoulder joint, forearms coupled to the upper arms at an elbow joint and an end effector coupled to the forearm at a wrist joint. The embodiment shown in FIG. 38A has the fore arms of arms 2414, 2416 located below their respective upper arms. In alternate aspects, one or both of the fore arms of arms 2414, 2416 may be located above their respective upper arms. For example, FIG. 38B shows both of the fore arms of arms 2414', 2416' located above their respective upper arms. The embodiment shown in FIG. 38A has the fore arms of arms 2418, 2420 located above their respective upper arms. In alternate aspects, one or both of the fore arms of arms 2418, 2420 may be located below their respective upper arms. For example, FIG. 38B shows both of the fore arms of arms 2418', 2420' located below their respective upper arms. FIG. 38A shows drive 2412 having 6 concentric rotary drive axis 2422, 2424, 2426, 2428, 2430, 2432. Each rotary drive axis may have a motor and encoder with a drive shaft extending from housing 2434 through bellows 2436 into vacuum or other environment 2438. In the embodiment shown, rotary drive 2432 is coupled to the upper arm of driven arm 2418; rotary drive 2430 is coupled to pulley 2450; rotary drive 2428 is coupled to the upper arm of driven arm 2420; rotary drive 2426 is coupled to the upper arm of driven arm 2414; rotary drive 424 is coupled to the pulley 2452 and rotary drive 2422 is coupled to the upper arm of driven arm 2416. Pulley 2450 has 2 pulley portions that interface with corresponding forearm driving pulleys of driven arms 2418, 2420. Pulley 2452 has 2 pulley portions that interface with corresponding forearm driving pulleys of driven arms 2414, 2416. With respect to FIGS. 38A and 38B, each of the four driven arms are moveable independently in a radial direction while first and second of the four driven arms are moveable dependently in a rotary or theta direction and a vertical or z direction and while third and fourth of the four driven arms are moveable dependently in a rotary or theta direction and a vertical or z direction with first and second driven arms rotatable independent of the third and fourth driven arms. Here, the four driven arms are moveable independently in a radial direction due to independent rotation of axis 2432, 2428, 2426, 2422 while holding both pulley axis 2430, 2424 stationary. Here, each of the four driven arms are moveable in a rotary or theta direction by simultaneous rotation of axis 2422, 2424, 2426, 2428, 2430, 2432. Here, first and second driven arms are rotatable independent of the third and fourth driven arms by simultaneously rotation of axis 2422, 2424, 2426. Here, third and fourth driven arms are rotatable independent of the first and second driven arms by simultaneously rotation of axis 2428, 2430, 2432.

Figure 39A:
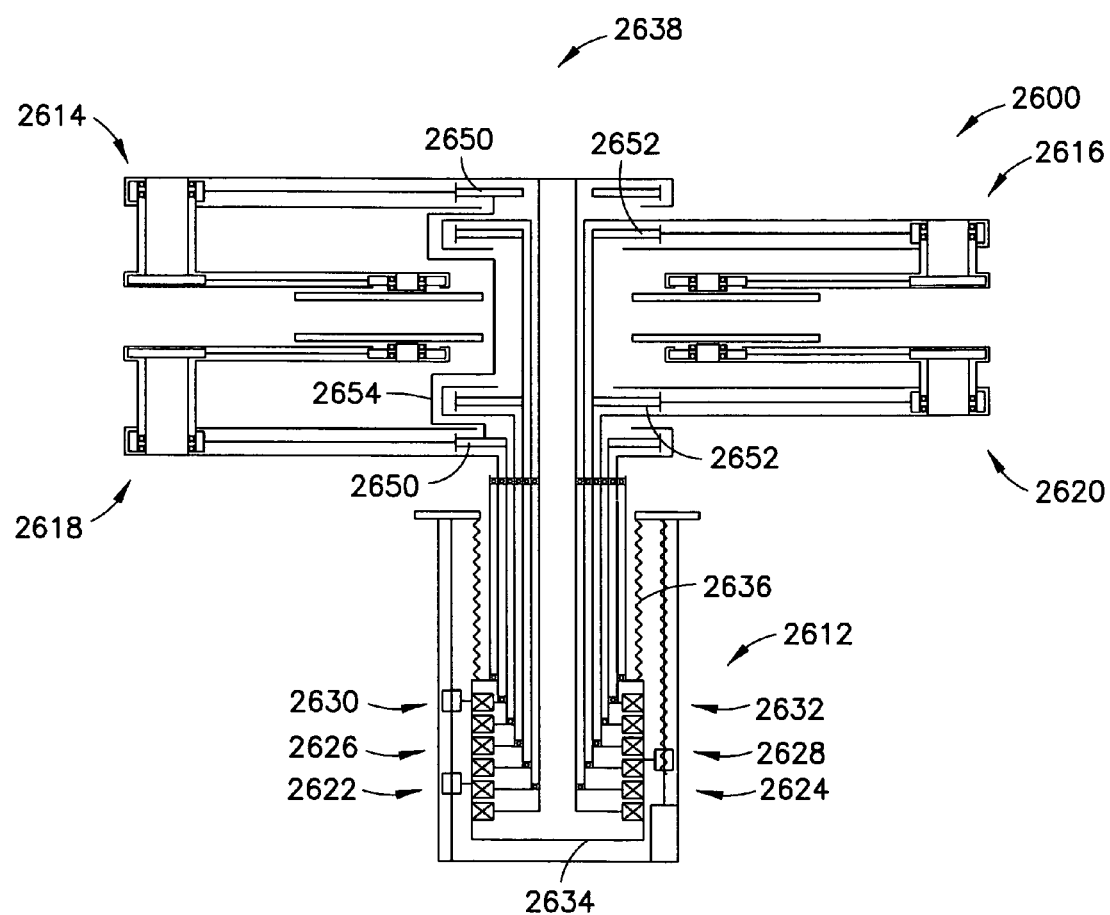
FIG. 39A shows a section schematic view of a robot.
Figure 39B:
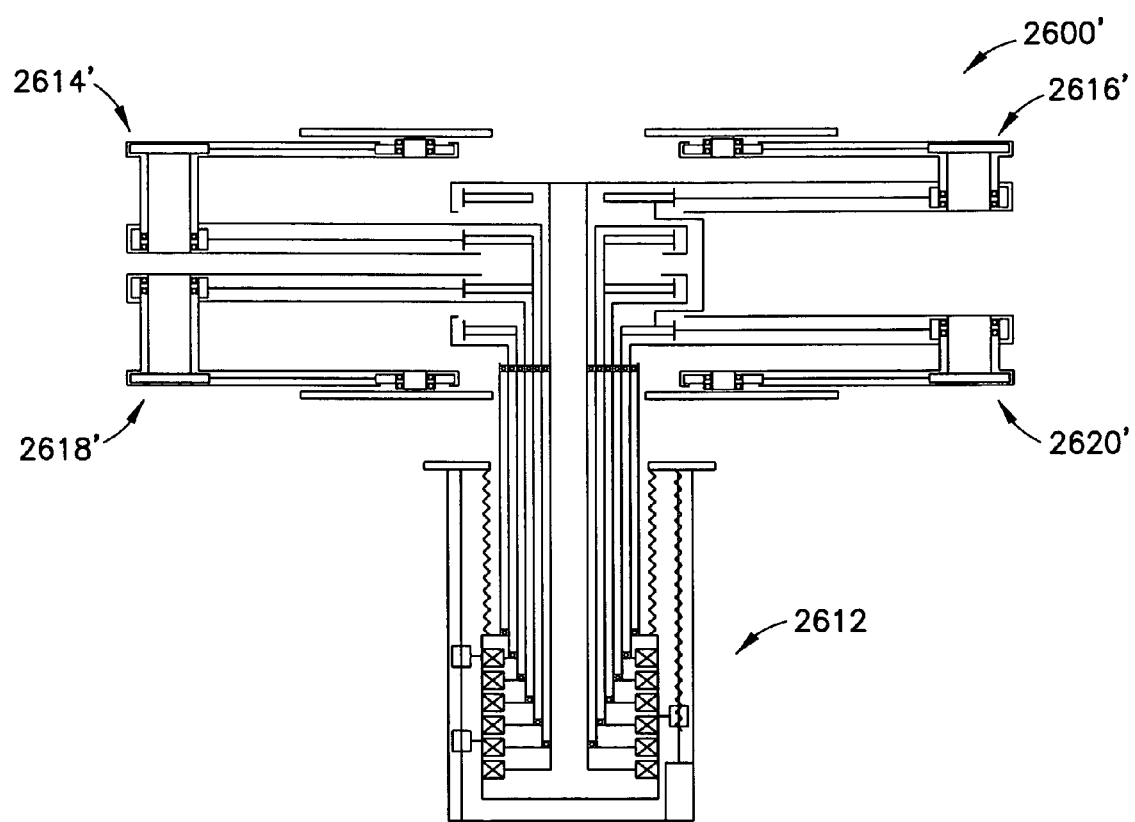
FIG. 39B shows a section schematic view of a robot.

Referring now to FIG. 39A, there is shown a section schematic view of robot 2600. Referring also to FIG. 39B, there is shown a section schematic view of robot 2600'. In the embodiment shown, each of the driven arms 2614, 2616, 2618, 2620 has upper arms coupled to the drive 2612 at a shoulder joint, forearms coupled to the upper arms at an elbow joint and an end effector coupled to the forearm at a wrist joint. The embodiment shown in FIG. 39A has the fore arms of arms 2614, 2616 located below their respective upper arms. In alternate aspects, one or both of the fore arms of arms 2614, 2616 may be located above their respective upper arms. For example, FIG. 39B shows both of the fore arms of arms 2614', 2616' located above their respective upper arms. The embodiment shown in FIG. 39A has the fore arms of arms 2618, 2620 located above their respective upper arms. In alternate aspects, one or both of the fore arms of arms 2618, 2620 may be located below their respective upper arms. For example, FIG. 39B shows both of the fore arms of arms 2618', 2620' located below their respective upper arms. FIG. 39A shows drive 2612 having 6 concentric rotary drive axis 2622, 2624, 2626, 2628, 2630, 2632. Each rotary drive axis may have a motor and encoder with a drive shaft extending from housing 2634 through bellows 2636 into vacuum or other environment 638. In the embodiment shown, rotary drive 2632 is coupled to the upper arm of driven arm 2618; rotary drive 2630 is coupled to pulley 2650; rotary drive 2628 is coupled to the upper arm of driven arm 2620; rotary drive 2626 is coupled to pulley 2652; rotary drive 2624 is coupled to the upper arm of driven arm 2616 and rotary drive 2622 is coupled to the upper arm of driven arm 2614. Pulley 2650 has 2 pulley portions that interface with corresponding forearm driving pulleys of driven arms 2614, 2618. Bridge 6254 couples the upper portion of pulley 2650 to the lower portion of pulley 2650. Bridge 2654 may have any configuration, for example, bridge 2654 may be one or more posts or semi circular structure that passes outside the upper arms of arms 2616 and 2620. Pulley 2652 has pulley portions that interface with corresponding forearm driving pulleys of driven arms 2616, 2620. With respect to FIGS. 39A and 39B, each of the four driven arms are moveable independently in a radial direction while first and third of the four driven arms are moveable dependently in a rotary or theta direction and a vertical or z direction and while second and fourth of the four driven arms are moveable dependently in a rotary or theta direction and a vertical or z direction with first and third driven arms rotatable independent of the second and fourth driven arms as will be described. Here, the four driven arms are moveable independently in a radial direction with independent rotation of axis 2632, 2628, 2624, 2622 while holding pulleys 2650, 2652 stationary. In one aspect, substrates may be placed independently at different arbitrary Cartesian or polar locations with the arrangement of FIGS. 39A and 39B. For example, arms 2614 and 2616 may extend simultaneously and substrates may be picked or placed independently at different arbitrary Cartesian or polar locations while keeping arms 2618, 2620 retracted. Similarly, for example, arms 2618 and 2620 may extend simultaneously and substrates may be picked or placed independently at different arbitrary Cartesian or polar locations while keeping arms 2614, 2616 retracted. Here, pulleys 2650 and 2652 couple to the left and right pairs of arms respectively allowing independent picking or placement with either the upper and lower pairs of arms where pulleys 2650, 2652 may be rotated to adjust the respective theta locations of their respective left or right arm. Here, first 2614 and third 2618 of the four driven arms are moveable dependently in a rotary or theta direction by simultaneous rotation of axis 2632, 2630, 2622 and a vertical or z direction and while second 2616 and fourth 2620 of the four driven arms are moveable dependently in a rotary or theta direction by simultaneous rotation of axis 2628, 2626, 2624 and a vertical or z direction with first 2614 and third 2618 driven arms rotatable independent of the second 2616 and fourth 2620 driven arms.

As used herein a "set" may comprise one or more than one end effector.

An example embodiment may be provided in an apparatus comprising a drive; a movable arm assembly connected to the drive; a plurality of sets of end effectors, where the end effectors are connected to the drive by the movable arm assembly, where a first one of the sets of end effectors comprises at least two of the end effectors, where the drive and the movable arm assembly are configured to move the at least two end effectors substantially in unison from a retracted position towards an extended position towards two different respective target locations, and where the at least two end effectors are at least partially independently movable relative to each other on the moveable arm assembly; and a controller connected to the drive, where the controller is configured to detect an offset of respective substrates on the at least two end effectors and adjust movement of the at least two end effectors relative to each other prior to placement of the substrates at the respective target locations.

An example embodiment may be provided in an apparatus where a second one of the sets of end effectors comprises at least two other ones of the end effectors, where the drive and the movable arm assembly are configured to move the at least two other end effectors substantially in unison from the retracted position towards the extended position towards the two respective target locations, and where the at least two other end effectors are at least partially independently movable relative to each other on the moveable arm assembly.

An example embodiment may be provided in an apparatus where the first and second sets of end effectors are connected by a common upper arm of the movable arm assembly to a common rotational axis of the drive.

An example embodiment may be provided in an apparatus where the first and second sets of end effectors are connected by respective independently driven upper arms of the movable arm assembly to a common rotational axis of the drive.

An example embodiment may be provided in an apparatus where the first and second sets of end effectors are connected by respective independently driven upper arms of the movable arm assembly to spaced parallel rotational axes of the drive.

An example embodiment may be provided in an apparatus where the at least two end effectors of the first set of end effectors are connected to the movable arm assembly by a common wrist, where the wrist is configured to at least partially independently rotate the at least two end effectors relative to each other.

An example embodiment may be provided in an apparatus further comprising sensors connected to the controller, where the sensors are configured to sense location of the respective substrates relative to each other as the apparatus moves the at least two end effectors towards the extended position prior to the substrates reaching the target locations.

An example embodiment may be provided in an apparatus further comprising at least one camera connected to the controller where, based upon images from the at least one camera, the controller is configured to sense location of the respective substrates relative to each other as the apparatus moves the at least two end effectors towards the extended position and prior to the substrates reaching the target locations.

An example embodiment may be provided in an apparatus where the controller is configured to detect the offset of the respective substrates relative to each other based, at least partially, upon detecting a fiducial on each of the substrates.

An example method may comprise providing a robot comprising a drive, a movable arm assembly connected to the drive, and a plurality of sets of end effectors, where the end effectors are connected to the drive by the movable arm assembly, where a first one of the sets of end effectors comprises at least two of the end effectors, where the drive and the movable arm assembly are configured to move the at least two end effectors substantially in unison from a retracted position towards an extended position towards two different respective target locations, and where the at least two end effectors are independently movable relative to each other on the moveable arm assembly; and at least partially independently moving the end effectors in the first set relative to each other by the robot, where a controller connected to the drive detects an offset of respective substrates on the at least two end effectors and adjusts movement of the at least two end effectors relative to each other prior to placement of the substrates at the respective target locations.

An example method may comprise where a second one of the sets of end effectors comprises at least two other ones of the end effectors, where the drive and the movable arm assembly move the at least two other end effectors substantially in unison from the retracted position towards the extended position towards the two respective target locations, and where the at least two other end effectors are partially independently moved relative to each other on the moveable arm assembly.

An example method may comprise where the first and second sets of end effectors are moved by a common upper arm of the movable arm assembly on a common rotational axis of the drive.

An example method may comprise where the first and second sets of end effectors are moved by respective independently driven upper arms of the movable arm assembly on a common rotational axis of the drive.

An example method may comprise where the first and second sets of end effectors are moved by respective independently driven upper arms of the movable arm assembly on spaced parallel rotational axes of the drive.

An example method may comprise where the at least two end effectors of the first set of end effectors are connected to the movable arm assembly by a common wrist, where the wrist is moved to at least partially independently rotate the at least two end effectors relative to each other.

An example method may further comprise sensors connected to the controller, where the sensors sense location of the respective substrates relative to each other as the robot moves the at least two end effectors towards the extended position and prior to placement of the substrates at the target locations.

An example method may further comprise at least one camera connected to the controller where, based upon images from the at least one camera, the controller senses location of the respective substrates relative to each other as the robot moves the at least two end effectors towards the extended position and prior to placement of the substrates at the target locations.

An example method may comprise where the controller determines the offset of the respective substrates relative to each other based, at least partially, upon detecting a fiducial on each of the substrates.

An example embodiment may be provided in a non-transitory program storage device readable by a machine, tangibly embodying a program of instructions executable by the machine for performing operations, the operations comprising determining positions of a first set of at least two end effectors of a robot, where the robot comprises a drive, a movable arm assembly connected to the drive, and a plurality of sets of the end effectors, where the end effectors are connected to the drive by the movable arm assembly, where a first one of the sets of end effectors comprises at least two of the end effectors, where the drive and the movable arm assembly are configured to move the at least two end effectors substantially in unison from a retracted position towards an extended position towards two different respective target locations, and where the at least two end effectors are independently movable relative to each other on the moveable arm assembly; and at least partially independently moving the end effectors in the first set relative to each other by the robot, where an offset of respective substrates on the at least two end effectors is detected and movement of the at least two end effectors relative to each other is adjusted prior to placement of the substrates at the respective target locations.

An example method may comprise moving a substrate, located on a first end effector of a robot, from a first location towards a second location by the robot; determining location of a fiducial on the substrate while the substrate is being moved from the first location towards the second location; comparing the determined location of the fiducial with a reference fiducial location while the robot is moving the substrate from the first location towards the second location.

An example method may comprise where determining the location of the fiducial on the substrate comprises a sensor and/or a camera providing input to a controller to determine the location of the fiducial.

An example method may comprise where the controller compares the determined location of the fiducial with the reference fiducial location to determine an offset of the substrate relative to a desired location of the substrate along a path between the first and second locations.

An example method may further comprise comparing the determined location of the fiducial relative to a fiducial on a second end effector of the robot while the second end effector is being moved in substantial unison with the first end effector.

An example method may further comprise based at least partially upon the comparing, determining an offset of the substrate and adjusting movement of the first end effector prior to moving the substrate into the second location.

An example method may further comprise determining an offset of a second substrate of a second end effector of the robot, based at least partially upon a fiducial on the second substrate, and adjusting movement of the first and second end effectors relative to each other while the substrates are moving and prior to the substrates reaching their spaced respective second locations.

An example method may comprise where the fiducial is located at least partially along a bottom planar side of the substrate.

An example method may comprise where the robot comprises a plurality of sets of end effectors, where the end effectors are connected to a drive by the movable arm assembly of the robot, where a first one of the sets of end effectors comprises at least two of the end effectors including the first end effector, where the drive and the movable arm assembly move the at least two end effectors substantially in unison from a retracted position towards an extended position towards two different respective target locations, and where the at least two end effectors at least partially independently move relative to each other on the moveable arm assembly, where a second one of the sets of end effectors comprises at least two other of the end effectors, where the drive and the movable arm assembly move the at least two other end effectors substantially in unison from the retracted position towards the extended position towards the two different respective target locations, and where the at least two other end effectors at least partially independently move relative to each other on the moveable arm assembly based upon location of fiducials on the substrates as the robot moves the substrates and prior to reaching the target locations.

An example method may further comprise a controller, connected to the robot, adjusting movement of the end effector based, at least partially, upon the compared determined location versus the reference fiducial location.

An example apparatus may comprise at least one processor; and at least one non-transitory memory including computer program code, the at least one memory and the computer program code configured to, with the at least one processor, cause the apparatus to determine location of a fiducial on a substrate while the substrate is being moved from a first location towards a second location, where the substrate is located on a first end effector of the apparatus; and compare the determined location of the fiducial with a reference fiducial location while the apparatus is moving the substrate from the first location towards the second location.

An example embodiment apparatus may comprise where the processor, memory and program code are configured to use input from at least one sensor and/or a camera to determine the location of the fiducial.

An example embodiment apparatus may comprise where the processor, memory and program code are configured to compare the determined location of the fiducial with the reference fiducial location to determine an offset of the substrate relative to a desired location of the substrate.

An example embodiment apparatus may comprise where the processor, memory and program code are configured to compare the determined location of the fiducial relative to a fiducial on a second end effector of the apparatus while the second end effector is being moved in substantial unison with the first end effector.

An example embodiment apparatus may comprise where the processor, memory and program code are configured to, based at least partially upon the comparing, determine an offset of the substrate and adjusting movement of the end effector prior to moving the substrate into the second location.

An example embodiment apparatus may comprise where the processor, memory and program code are configured to determine an offset of a second substrate of a second end effector of the apparatus, based at least partially upon a fiducial on the second substrate, and adjust movement of the first and second end effectors relative to each other while the substrates are moving and prior to the substrates reaching their spaced respective second locations.

An example embodiment apparatus may comprise where the processor, memory and program code are configured to use information regarding the fiducial, being located at least partially along a bottom planar side of the substrate, for determining location of the substrate.

An example embodiment apparatus may comprise where the apparatus comprises a plurality of sets of end effectors, where the end effectors are connected to a drive by the movable arm assembly of the robot, where a first one of the sets of end effectors comprises at least two of the end effectors including the first end effector, where the drive and the movable arm assembly move the at least two end effectors substantially in unison from a retracted position towards an extended position towards two different respective target locations, and where the at least two end effectors at least partially independently move relative to each other on the moveable arm assembly, where a second one of the sets of end effectors comprises at least two other of the end effectors, where the drive and the movable arm assembly move the at least two other end effectors substantially in unison from the retracted position towards the extended position towards the two different respective target locations, and the processor, memory and program code are configured to at least partially independently move the at least two other end effectors relative to each other on the moveable arm assembly based upon location of fiducials on the substrates as the apparatus moves the substrates and prior to reaching the target locations.

An example embodiment apparatus may comprise where the processor, memory and program code are configured to adjust movement of the end effector based, at least partially, upon the compared determined location versus the reference fiducial location.

An example embodiment may be provided in a non-transitory program storage device readable by a machine, tangibly embodying a program of instructions executable by the machine for performing operations, the operations comprising determining location of a fiducial on a substrate while the substrate is being moved from a first location towards a second location, where the substrate is located on an end effector of a robot; and comparing the determined location of the fiducial with a reference fiducial location while the robot is moving the substrate from the first location towards the second location.

An example embodiment may be provided in an apparatus comprising at least one processor; and at least one non-transitory memory including computer program code, the at least one memory and the computer program code configured to, with the at least one processor, cause the apparatus to: determine locations of at least two substrates on respective end effectors of the apparatus while the substrates are being moved by the end effectors in substantial unison towards respective target locations for the substrates; and while the end effectors are being moved towards the respective target locations, and based upon the determined locations of the substrates, adjust a position of at least a first one of the end effectors on the apparatus relative to a second one of the end effectors, where the position of the first end effector is adjusted relative to the second end effector while the apparatus is moving the substrates in substantial unison towards the respective target locations and prior to reaching the target locations.

An example embodiment may be provided in an apparatus where the processor, memory and program code are configured to determine locations of the substrates based upon input from one or more sensors and/or cameras.

An example embodiment may be provided in an apparatus where the processor, memory and program code are configured to adjust the position of the first and second end effectors relative to each other at a common wrist connecting the first and second end effectors to a forearm of a movable arm assembly of the apparatus.

An example embodiment may be provided in an apparatus where the processor, memory and program code are configured to rotate the first end effector at the wrist without rotating the second end effector at the wrist.

An example embodiment may be provided in an apparatus where the processor, memory and program code are configured to: determine locations of at least two other substrates on respective two other end effectors of the apparatus while the other substrates are being moved by the other end effectors in substantial unison from respective target locations for the other substrates; and while the other end effectors are being moved from the respective target locations, and based upon the determined locations of the other substrates, adjust a position of at least a first one of the other end effectors on the apparatus relative to a second one of the other end effectors, where the position of the first other end effector is adjusted relative to the second other end effector while the apparatus is moving the other substrates in substantial unison from the respective target locations and prior to reaching the retracted locations.

An example embodiment may be provided in an apparatus where the processor, memory and program code are configured to determine locations of the other substrates based upon input from one or more sensors and/or cameras.

An example embodiment may be provided in an apparatus where the processor, memory and program code are configured to adjust the position of the first and second other end effectors relative to each other at a common wrist connecting the first and second other end effectors to a forearm of a movable arm assembly of the apparatus.

An example embodiment may be provided in an apparatus where the processor, memory and program code are configured to rotate the first other end effector at the wrist without rotating the second other end effector at the wrist.

An example embodiment may be provided in an apparatus where the processor, memory and program code are configured to determine the locations of the substrates based, at least partially, upon fiducials on planar bottom sides of the substrates.

An example method may comprise determining locations of at least two substrates on respective end effectors of a robot while the substrates are being moved by the end effectors in substantial unison towards respective target locations for the substrates; and while the end effectors are being moved towards the respective target locations, and based upon the determined locations of the substrates, adjusting a position of at least a first one of the end effectors on the robot relative to a second one of the end effectors, where the position of the first end effector is adjusted relative to the second end effector while the robot is moving the substrates in substantial unison towards the respective target locations and prior to the substrates reaching the target locations.

An example method may comprise where the locations of the substrates are determined based upon input from one or more sensors and/or cameras.

An example method may comprise where adjusting the position of the first and second end effectors relative to each other occurs at a common wrist connecting the first and second end effectors to a forearm of a movable arm assembly of the robot.

An example method may further comprise rotating the first end effector at the wrist without rotating the second end effector at the wrist.

An example method may further comprise determining locations of at least two other substrates on respective two other end effectors of the robot while the other substrates are being moved by the other end effectors in substantial unison from respective target locations for the other substrates; and, while the other end effectors are being moved from the respective target locations, and based upon the determined locations of the other substrates, adjust a position of at least a first one of the other end effectors on the robot relative to a second one of the other end effectors, where the position of the first other end effector is adjusted relative to the second other end effector while the robot is moving the other substrates in substantial unison from the respective target locations and prior to reaching the retracted locations.

An example method may comprise where locations of the other substrates are determined based upon input from one or more sensors and/or cameras.

An example method may comprise where adjusting the position of the first and second other end effectors relative to each other occurs at a common wrist connecting the first and second other end effectors to a forearm of a movable arm assembly of the robot.

An example method may further comprise rotating the first other end effector at the wrist without rotating the second other end effector at the wrist.

An example method may comprise where the locations of the substrates are determined based, at least partially, upon fiducials on planar bottom sides of the substrates.

An example embodiment may be provided in a non-transitory program storage device readable by a machine, tangibly embodying a program of instructions executable by the machine for performing operations, the operations comprising determining locations of at least two substrates on respective end effectors of a robot while the substrates are being moved by the end effectors in substantial unison towards respective target locations for the substrates; and while the end effectors are being moved towards the respective target locations, and based upon the determined locations of the substrates, adjusting a position of at least a first one of the end effectors on the robot relative to a second one of the end effectors, where the position of the first end effector is adjusted relative to the second end effector while the robot is moving the substrates in substantial unison towards the respective target locations and prior to the substrates reaching the target locations.

An example embodiment may be provided in an apparatus comprising a drive; a movable arm assembly connected to the drive; and a plurality of sets of end effectors, where the end effectors are connected to the drive by the movable arm assembly, where each of the sets of end effectors comprises at least two of the end effectors, where the drive and the movable arm assembly are configured to move the at least two end effectors of each set substantially in unison from a retracted position towards an extended position, and where the at least two end effectors in at least a first one of the sets are independently movable relative to each other on the moveable arm assembly.

An example method may comprise providing a robot comprising a drive, a movable arm assembly connected to the drive, and a plurality of sets of end effectors, where the end effectors are connected to the drive by the movable arm assembly, where each of the sets of end effectors comprises at least two of the end effectors, where the drive and the movable arm assembly are configured to move the at least two end effectors of each set substantially in unison from a retracted position towards an extended position, and where the at least two end effectors in at least a first one of the sets are independently movable relative to each other on the moveable arm assembly; and independently moving the end effectors in the first set relative to each other by the robot.

An example embodiment may be provided in a non-transitory program storage device readable by a machine, tangibly embodying a program of instructions executable by the machine for performing operations, the operations comprising determining positions of a first set of at least two end effectors of a robot, where the robot comprises a drive, a movable arm assembly connected to the drive, and a plurality of sets of the end effectors, where the end effectors are connected to the drive by the movable arm assembly, where each of the sets of end effectors comprises at least two of the end effectors, where the drive and the movable arm assembly are configured to move the at least two end effectors of each set substantially in unison from a retracted position towards an extended position, and where the at least two end effectors in at least the first set are independently movable relative to each other on the moveable arm assembly; and independently moving the end effectors in the first set relative to each other by the robot.

An example method may comprise moving a substrate, located on an end effector of a robot, from a first location towards a second location; determining location of a fiducial on the substrate while the substrate is being moved from the first location towards the second location; comparing the determined location of the fiducial with a reference fiducial location while the robot is moving the substrate from the first location towards the second location.

An example embodiment may be provided in an apparatus comprising at least one processor; and at least one non-transitory memory including computer program code, the at least one memory and the computer program code configured to, with the at least one processor, cause the apparatus to determine location of a fiducial on a substrate while the substrate is being moved from a first location towards a second location, where the substrate is located on an end effector of a robot; and comparing the determined location of the fiducial with a reference fiducial location while the robot is moving the substrate from the first location towards the second location.

An example embodiment may be provided in a non-transitory program storage device readable by a machine, tangibly embodying a program of instructions executable by the machine for performing operations, the operations comprising determining location of a fiducial on a substrate while the substrate is being moved from a first location towards a second location, where the substrate is located on an end effector of a robot; and comparing the determined location of the fiducial with a reference fiducial location while the robot is moving the substrate from the first location towards the second location.

An example embodiment may be provided in an apparatus comprising at least one processor; and at least one non-transitory memory including computer program code, the at least one memory and the computer program code configured to, with the at least one processor, cause the apparatus to determine location of an end effector of a robot and/or a substrate on the end effector, while the end effector is being moved by the robot from a first location towards a second location; and while the end effector is being moved from the first location towards the second location, and based upon the determined location of the end effector and/or substrate, adjust a position of the end effector on the robot to a new dynamically adjusted position on the robot, where the position of the end effector is adjusted based upon the determined location while the robot is moving the end effector from the first location towards the second location.

An example method may comprise determining a location of an end effector of a robot and/or a substrate on the end effector, while the end effector is being moved by the robot from a first location towards a second location; and while the end effector is being moved from the first location towards the second location, and based upon the determined location of the end effector and/or substrate, adjusting a position of the end effector on the robot to a new dynamically adjusted position on the robot, where the position of the end effector is adjusted based upon the determined location while the robot is moving the end effector from the first location towards the second location.

An example embodiment may be provided in a non-transitory program storage device readable by a machine, tangibly embodying a program of instructions executable by the machine for performing operations, the operations comprising determining a location of an end effector of a robot and/or a substrate on the end effector, while the end effector is being moved by the robot from a first location towards a second location; and while the end effector is being moved from the first location towards the second location, and based upon the determined location of the end effector and/or substrate, adjusting a position of the end effector on the robot to a new dynamically adjusted position on the robot, where the position of the end effector is adjusted based upon the determined location while the robot is moving the end effector from the first location towards the second location.

In accordance with one aspect, an example method comprises determining a robot place location for a robot, the robot adapted to transport a substrate. The method comprises moving two calibration fixtures past corresponding one or more edge sensors or fiducial sensors along substantially parallel calibration paths; determining robot locations when an edge of the calibration fixture changes a state of the one or more edge sensors or when a fiducial sensor detects a fiducial of the substrates; determining one or more sensor locations of the one or more edge sensors or fiducial sensors based on the robot locations; transporting the two substrates along nominal transport paths past the one or more edge sensors or fiducial sensors to target locations; determining the robot place locations of the two substrates based on the sensor locations; and placing the two substrates at the target locations with the robot located at the robot place locations.

In accordance with one aspect, an example method comprises determining robot placement for a robot, the robot adapted to transport a substrate. The method comprises transporting the substrate along a nominal transport path one or more fiducial sensors to a target location; determining robot locations when a fiducial of the substrate changes a state of the one or more fiducial sensors; determining a robot place location; and placing the substrate at the target location with the robot located at the actual robot place location.

In accordance with another aspect, an example embodiment comprises an adaptive substrate placement system for placing two substrates at corresponding two target locations. The placement system has a substrate transport robot; two or more sensors configured to detect a feature of the two substrates as the substrate transport robot moves the substrates along a nominal transport path to the target location; a controller configured to detect robot locations when the features of the substrates changes a state of the two or more sensors; and the controller configured to determine place locations based on the robot locations and the target locations. The two substrates are simultaneously placed at the target locations with the robot located at the place locations and wherein the place locations are different than the target locations.

In accordance with another aspect of the exemplary embodiment, a substrate transport robot is provided to transport substrates. The substrate transport robot has a drive portion and an arm portion, the arm portion having first, second, third and fourth driven arms, each of the driven arms capable of supporting different substrates. Each of the driven arms has first and second links where the first and second links may have different lengths. The first link may be an upper arm and is coupled to the drive portion at a shoulder joint. The second link may be a forearm and is coupled to the first link at an elbow joint. Each of the driven arms has an end effector adapted to support a substrate with the end effector coupled to the forearm at a wrist joint. Each of the driven arms is independently moveable in one or more axis. In one aspect, each of the four driven arms are moveable independently in a radial direction while each of the four driven arms are moveable dependently in a rotary or theta direction and a vertical or z direction. In another aspect, each of the four driven arms are moveable independently in a radial direction while first and second of the four driven arms are moveable dependently in a rotary or theta direction and a vertical or z direction and while third and fourth of the four driven arms are moveable dependently in a rotary or theta direction and a vertical or z direction with first and second driven arms rotatable independent of the third and fourth driven arms. In another aspect, each of the four driven arms are moveable independently in a radial direction while first and third of the four driven arms are moveable dependently in a rotary or theta direction and a vertical or z direction and while second and fourth of the four driven arms are moveable dependently in a rotary or theta direction and a vertical or z direction with first and third driven arms rotatable independent of the second and fourth driven arms.

An example embodiment may comprise means for providing a robot comprising a drive, a movable arm assembly connected to the drive, and a plurality of sets of end effectors, where the end effectors are connected to the drive by the movable arm assembly, where a first one of the sets of end effectors comprises at least two of the end effectors, where the drive and the movable arm assembly are configured to move the at least two end effectors substantially in unison from a retracted position towards an extended position towards two different respective target locations, and where the at least two end effectors are independently movable relative to each other on the moveable arm assembly; and means for at least partially independently moving the end effectors in the first set relative to each other by the robot, where a controller connected to the drive detects an offset of respective substrates on the at least two end effectors and adjusts movement of the at least two end effectors relative to each other prior to placement of the substrates at the respective target locations.

An example embodiment may comprises means for moving a substrate, located on a first end effector of a robot, from a first location towards a second location by the robot; means for determining location of a fiducial on the substrate while the substrate is being moved from the first location towards the second location; and means for comparing the determined location of the fiducial with a reference fiducial location while the robot is moving the substrate from the first location towards the second location.

An example embodiment may comprises means for determining locations of at least two substrates on respective end effectors of a robot while the substrates are being moved by the end effectors in substantial unison towards respective target locations for the substrates; and while the end effectors are being moved towards the respective target locations, and based upon the determined locations of the substrates, means for adjusting a position of at least a first one of the end effectors on the robot relative to a second one of the end effectors, where the position of the first end effector is adjusted relative to the second end effector while the robot is moving the substrates in substantial unison towards the respective target locations and prior to the substrates reaching the target locations.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances.

What is claimed is:
1. An apparatus comprising:
a drive;
a movable arm assembly connected to the drive;
a plurality of sets of end effectors, where the end effectors are connected to the drive by the movable arm assembly, where a first one of the sets of end effectors comprises at least two of the end effectors and a second one of the sets of end effectors comprising at least one other one of the end effectors, where the drive and the movable arm assembly are configured to move the at least two end effectors of the first set substantially in unison from a retracted position towards an extended position towards two different respective target locations, and where the at least two end effectors of the first set are at least partially independently movable relative to each other on the moveable arm assembly; and
a controller connected to the drive, where the controller is configured to detect an offset of respective substrates, on the at least two end effectors of the first set, relative to one another and adjust movement of the at least two end effectors of the first set relative to each other prior to placement of the substrates at the respective target locations.
2. An apparatus as in claim 1 where the second set of end effectors comprises at least two other ones of the end effectors, where the drive and the movable arm assembly are configured to move the at least two other end effectors substantially in unison from the retracted position towards the extended position towards the two respective target locations, and where the at least two other end effectors are at least partially independently movable relative to each other on the moveable arm assembly.

3. An apparatus as in claim 2 where the first and second sets of end effectors are connected by a common upper arm of the movable arm assembly to a common rotational axis of the drive.

4. An apparatus as in claim 2 where the first and second sets of end effectors are connected by respective independently driven upper arms of the movable arm assembly to a common rotational axis of the drive.

5. An apparatus as in claim 2 where the first and second sets of end effectors are connected by respective independently driven upper arms of the movable arm assembly to spaced parallel rotational axes of the drive.

6. An apparatus as in claim 1 where the at least two end effectors of the first set of end effectors are connected to the movable arm assembly by a common wrist, where the wrist is configured to at least partially independently rotate the at least two end effectors relative to each other.

7. An apparatus as in claim 1 further comprising sensors connected to the controller, where the sensors are configured to sense location of the respective substrates relative to each other as the apparatus moves the at least two end effectors towards the extended position prior to the substrates reaching the target locations.

8. An apparatus as in claim 1 further comprising at least one camera connected to the controller where, based upon images from the at least one camera, the controller is configured to sense location of the respective substrates relative to each other as the apparatus moves the at least two end effectors towards the extended position and prior to the substrates reaching the target locations.

9. An apparatus as in claim 1 where the controller is configured to detect the offset of the respective substrates relative to each other based, at least partially, upon detecting a fiducial on each of the substrates.

10. A method comprising:
providing a robot comprising a drive, a movable arm assembly connected to the drive, and a plurality of sets of end effectors, where the end effectors are connected to the drive by the movable arm assembly, where a first one of the sets of end effectors comprises at least two of the end effectors and a second one of the sets of end effectors comprising at least one other one of the end effectors, where the drive and the movable arm assembly are configured to move the at least two end effectors of the first set substantially in unison from a retracted position towards an extended position towards two different respective target locations, and where the at least two end effectors of the first set are independently movable relative to each other on the moveable arm assembly; and
at least partially independently moving the end effectors in the first set relative to each other by the robot, where a controller connected to the drive detects an offset of respective substrates, on the at least two end effectors of the first set, relative to one another and adjusts movement of the at least two end effectors of the first set relative to each other prior to placement of the substrates at the respective target locations.

11. A method as in claim 10 where the second set of end effectors comprises at least two other ones of the end effectors, where the drive and the movable arm assembly move the at least two other end effectors substantially in unison from the retracted position towards the extended position towards the two respective target locations, and where the at least two other end effectors are partially independently moved relative to each other on the moveable arm assembly.

12. A method as in claim 11 where the first and second sets of end effectors are moved by a common upper arm of the movable arm assembly on a common rotational axis of the drive.

13. A method as in claim 11 where the first and second sets of end effectors are moved by respective independently driven upper arms of the movable arm assembly on a common rotational axis of the drive.

14. A method as in claim 11 where the first and second sets of end effectors are moved by respective independently driven upper arms of the movable arm assembly on spaced parallel rotational axes of the drive.

15. A method as in claim 10 where the at least two end effectors of the first set of end effectors are connected to the movable arm assembly by a common wrist, where the wrist is moved to at least partially independently rotate the at least two end effectors relative to each other.

16. A method as in claim 10 further comprising sensors connected to the controller, where the sensors sense location of the respective substrates relative to each other as the robot moves the at least two end effectors towards the extended position and prior to placement of the substrates at the target locations.

17. A method as in claim 10 further comprising at least one camera connected to the controller where, based upon images from the at least one camera, the controller senses location of the respective substrates relative to each other as the robot moves the at least two end effectors towards the extended position and prior to placement of the substrates at the target locations.

18. A method as in claim 10 where the controller determines the offset of the respective substrates relative to each other based, at least partially, upon detecting a fiducial on each of the substrates.

19. A non-transitory program storage device readable by a machine, tangibly embodying a program of instructions executable by the machine for performing operations, the operations comprising:
determining positions of a first set of end effectors of a robot, where the robot comprises a drive, a movable arm assembly connected to the drive, and a plurality of sets of the end effectors, where the end effectors are connected to the drive by the movable arm assembly, where the first set of end effectors comprises at least two of the end effectors and a second one of the sets of end effectors comprises at least one other one of the end effectors, where the drive and the movable arm assembly are configured to move the at least two end effectors of the first set substantially in unison from a retracted position towards an extended position towards two different respective target locations, and where the at least two end effectors of the first set are independently movable relative to each other on the moveable arm assembly; and
at least partially independently moving the end effectors in the first set relative to each other by the robot, where an offset of respective substrates, on the at least two end effectors is detected and movement of the at least two end effectors of the first set, relative to each other is adjusted prior to placement of the substrates at the respective target locations.

* * * * *